(12) United States Patent
Asai et al.

(10) Patent No.: US 7,582,219 B1
(45) Date of Patent: Sep. 1, 2009

(54) METHOD OF FABRICATING REFLECTIVE MIRROR BY WET-ETCH USING IMPROVED MASK PATTERN AND REFLECTIVE MIRROR FABRICATED USING THE SAME

(75) Inventors: Nobuaki Asai, Hashima-gun (JP); Emi Morioka, Shizuoka (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 69 days.

(21) Appl. No.: 11/605,961

(22) Filed: Nov. 30, 2006

Related U.S. Application Data

(63) Continuation of application No. PCT/JP2005/010027, filed on Jun. 1, 2005.

(30) Foreign Application Priority Data

| Jun. 4, 2004 | (JP) | ............................. 2004-166511 |
| Nov. 5, 2004 | (JP) | ............................. 2004-321632 |

(51) Int. Cl.
   *B29D 11/00* (2006.01)
(52) U.S. Cl. ............................. 216/24; 216/96; 216/99
(58) Field of Classification Search .................. 216/24, 216/96, 99
   See application file for complete search history.

(56) References Cited

U.S. PATENT DOCUMENTS

| 2001/0022682 A1* | 9/2001 | McClelland et al. ........ 359/280 |
| 2002/0113675 A1 | 8/2002 | Kato et al. |
| 2002/0196523 A1* | 12/2002 | Ueda ........................... 359/290 |
| 2003/0016428 A1* | 1/2003 | Kato et al. ................... 359/226 |
| 2003/0085194 A1* | 5/2003 | Hopkins, Jr. ................... 216/2 |
| 2003/0227538 A1 | 12/2003 | Fujii et al. |
| 2004/0232106 A1* | 11/2004 | Oka et al. ..................... 216/26 |

FOREIGN PATENT DOCUMENTS

| JP | A 5-196525 | 8/1993 |
| JP | A 7-209121 | 8/1995 |
| JP | A 11-195637 | 7/1999 |
| JP | B2 2981600 | 9/1999 |
| JP | A 2002-323669 | 11/2002 |
| JP | A 2003-29190 | 1/2003 |
| JP | A 2003-57586 | 2/2003 |
| JP | A 2003-315724 | 11/2003 |
| JP | A 2004-354755 | 12/2004 |

* cited by examiner

*Primary Examiner*—Binh X Tran
(74) *Attorney, Agent, or Firm*—Oliff & Berridge, PLC

(57) ABSTRACT

A method is provided of fabricating a reflective mirror having a reflective surface on which light is incident. This method includes: coating at least one of opposite faces of a plate-shaped etchable material made of a single crystal material, with a film-like etching mask; forming a mask pattern on at least one of opposite faces of the etching mask, the mask pattern having a planar shape to which a circle is more similar than a quadrangle; and wet-etching the etchable material. This method allows the reflective mirror to be fabricated so as to have a silhouette of a planar shape to which a circle is more similar than a quadrangle, when viewed in a direction normal to the reflective surface.

30 Claims, 35 Drawing Sheets

(a)

(b)

(a)

(b)

(a)

(b)

(a)

(b)

METHOD OF FABRICATING REFLECTIVE MIRROR BY WET-ETCH USING IMPROVED MASK PATTERN AND REFLECTIVE MIRROR FABRICATED USING THE SAME

CROSS-REFERENCE TO RELATED APPLICATIONS

This application is based on Japanese Patent Applications No. 2004-166511 filed Jun. 4, 2004 and No. 2004-321632 filed Nov. 5, 2004, and International Application No. PCT/JP2005/010027 filed Jun. 1, 2005, the contents of which are incorporated hereinto by reference.

This application is a continuation application of International Application No. PCT/JP2005/010027 filed Jun. 1, 2005, now pending, which was published in Japanese under PCT Article 21(2).

BACKGROUND OF THE INVENTION

1. Field of the Invention

The invention relates to techniques of fabricating by etch a plate-shaped reflective mirror having a reflective surface on which light is incident, and more particularly to techniques of fabricating such a reflective mirror by wet-etch.

2. Description of the Related Art

For example, in the applications where images are formed optically, some situations exist where a plate-shaped reflective mirror is employed which has a reflective surface on which light is incident.

An exemplary type of such a reflective mirror is used for optical scan, in a manner that the reflective mirror is excited to vibrate about its oscillation axis parallel to the reflective surface, to thereby vary a direction in which light is reflected from the reflective surface upon entry thereinto.

There exists an example of a conventional reflective mirror of the aforementioned type (see, for example, Japanese Patent Application Publication No. 2003-57586).

This conventional reflective mirror constitutes an oscillating body in cooperation with a plate-shaped spring which extends from the reflective mirror along the oscillation axis and which is excited to cause at least a torsional vibration about the oscillation axis. This conventional reflective mirror is used for optical scan, in a manner that at least a portion of the oscillating body is excited to vibrate, to thereby vary a direction in which light is reflected from the reflective surface upon entry thereinto.

As disclosed in the aforementioned Japanese Patent Application Publication No. 2003-57586, the above-described conventional reflective mirror is conventionally fabricated so as to have a quadrangular planar-shape having a center line of symmetry coincident with the oscillation axis of the reflective mirror. Further, this conventional reflective mirror is fabricated by etch. In addition, etch is categorized into dry-etch and wet-etch.

BRIEF SUMMARY OF THE INVENTION

In the applications where such a reflective mirror is used, it is highly desired to increase a maximum oscillating speed at which the reflective mirror can be angularly oscillated about its oscillation axis in some situations.

More specifically, for example, in the case of an image forming apparatus including a scanner for use in optical scan using such a reflective mirror, there exist cases where, for an image resolution to increase, increase in an optical scan rate of the scanner is highly desired, and for the scan rate to increase, increase in a maximum oscillating speed of the reflective mirror is desired.

On the other hand, for the oscillating speed of such a reflective mirror to increase, it is effective to reduce the moment of inertia of the reflective mirror about its oscillation axis.

However, a conventional reflective mirror, when fabricated by wet-etch, is conventionally formed so as to have a quadrangular planar-shape having a center line of symmetry coincident with the oscillation axis of the reflective mirror, as described above.

For this reason, when this conventional (quadrangular) reflective mirror is unavoidably used, it is more difficult to reduce the moment of inertia of the reflective mirror than when a circular reflective mirror is used instead. The circular reflective mirror, for ensuring its reflective surface to have the same size or area as that in the conventional (quadrangular) reflective mirror, has the same width dimension as that of the conventional reflective mirror.

When a reflective mirror is fabricated by dry-etch, it is easier to downsize or micromachine an associated mask pattern than when the reflective mirror is fabricated by wet-etch, and is also easier to fabricate the reflective mirror precisely into a desired shape than when the reflective mirror is fabricated by wet-etch.

The fabricating process of reflective mirrors by dry-etch is not adequately suitable to a butch process in which a large number of etchable materials are etched at a time for fabricating a large number of reflective mirrors. For this reason, the fabricating process of reflective mirrors by dry-etch is not adequately suitable to improvements in manufacturing efficiency and reductions in manufacturing costs of reflective mirrors.

It is therefore an object of the present invention to provide techniques of fabricating by etch a plate-shaped reflective mirror having a reflective surface on which light is incident, more particularly, techniques of fabricating such a reflective mirror by wet-etch.

According to a first aspect of the present invention, there is provided a method of fabricating by an etching technique a plate-shaped reflective mirror having a reflective surface on which light is incident.

The method according to the first aspect of the present invention comprises:

a coating step of coating at least one of opposite faces of a plate-shaped etchable material made of a single crystal material, with a film-like etching mask;

a mask-pattern forming step of forming a mask pattern on at least one of opposite faces of the etching mask which has been deposited on the etchable material, the mask pattern having a planar shape to which a circle is more similar than a quadrangle; and a wet-etching step of wet-etching the etchable material on which the etching mask has been deposited, by immersing the etchable material in an etchant having a predetermined temperature and a predetermined concentration, whereby the reflective mirror is fabricated so as to have a silhouette of a planar shape to which a circle is more similar than a quadrangle, when viewed in a direction normal to the reflective surface.

According to a second aspect of the present invention, there is provided a plate-shaped reflective mirror which has a reflective surface on which light is incident.

The reflective mirror according to the second aspect of the present invention is shaped to have a silhouette of a planar shape to which a circle is more similar than a quadrangle, when viewed in a direction normal to the reflective surface.

Further, this reflective mirror is fabricated by implementing:

a coating step of coating at least one of opposite faces of a plate-shaped etchable material made of a single crystal material, with a film-like etching mask;

a mask-pattern forming step of forming a mask pattern on at least one of opposite faces of the etching mask which has been deposited on the etchable material, the mask pattern having a planar shape to which a circle is more similar than a quadrangle; and a wet-etching step of wet-etching the etchable material on which the etching mask has been deposited, by immersing the etchable material in an etchant having a predetermined temperature and a predetermined concentration.

According to a third aspect of the present invention, there is provided a process of integrally fabricating by an etching technique an oscillating body having a unitary configuration including both a reflective mirror having a reflective surface, and a plate-shaped spring.

In this regard, the reflective mirror is used for optical scan, in a manner that the reflective mirror is angularly oscillated about an oscillation axis parallel to the reflective surface, to thereby vary a direction in which light is reflected from the reflective surface upon entry thereinto.

The aforementioned spring is shaped to have a beam structure which extends from the reflective mirror along the oscillation axis and which has a stepped portion.

Further, this spring is excited by a vibration occurring in at least a portion of the oscillating body, to cause at least a torsional vibration about the oscillation axis, to thereby angularly oscillate the reflective mirror about the oscillation axis by at least the caused torsional vibration.

The process according to the third aspect of the present invention comprises:

a coating step of coating opposite faces of a to-be-processed portion of a plate-shaped etchable material made of a single crystal material, with two film-like etching masks, respectively, wherein the to-be-processed portion is to be processed into the beam structure;

a mask-pattern forming step of forming a pair of mask patterns on the two etching masks which have been deposited on the opposite faces of the to-be-processed portion, respectively, wherein the pair of mask patterns have respective shapes for forming the beam structure; and a wet-etching step of, after formation of the pair of mask patterns, wet-etching the etchable material by immersing the etchable material in an etchant.

According to a fourth aspect of the present invention, there is provided an oscillating body having a unitary configuration including both a reflective mirror having a reflective surface, and a plate-shaped spring.

In this regard, the reflective mirror is used for optical scan, in a manner that the reflective mirror is angularly oscillated about an oscillation axis parallel to the reflective surface, to thereby vary a direction in which light is reflected from the reflective surface upon entry thereinto.

The aforementioned spring is shaped to have a beam structure which extends from the reflective mirror along the oscillation axis and which has a stepped portion.

Further, this spring is excited by a vibration occurring in at least a portion of the oscillating body, to cause at least a torsional vibration about the oscillation axis, to thereby angularly oscillate the reflective mirror about the oscillation axis by at least the caused torsional vibration.

The aforementioned reflective mirror is fabricated so as to have a silhouette of a planar shape to which a circle is more similar than a quadrangle, when viewed in a direction normal to the reflective surface, by implementing the steps of:

coating at least one of opposite faces of a plate-shaped etchable material made of a single crystal material, with a film-like etching mask;

forming a mask pattern on at least one of opposite faces of the etching mask which has been deposited on the etchable material, the mask pattern having a planar shape to which a circle is more similar than a quadrangle; and wet-etching the etchable material on which the etching mask has been deposited, by immersing the etchable material in an etchant having a predetermined temperature and a predetermined concentration.

The aforementioned stepped portion is fabricated by wet-etching the etchable material such that the stepped portion is ultimately shaped to include:

(a) a higher sub-portion having the same height as a basic surface of the beam structure;

(b) a lower sub-portion lower than the basic surface, and lower than the higher sub-portion in a thickness-wise direction of the beam structure; and (c) a shoulder sub-portion which is located at a border between the higher and lower sub-portions and which traverses the beam structure.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
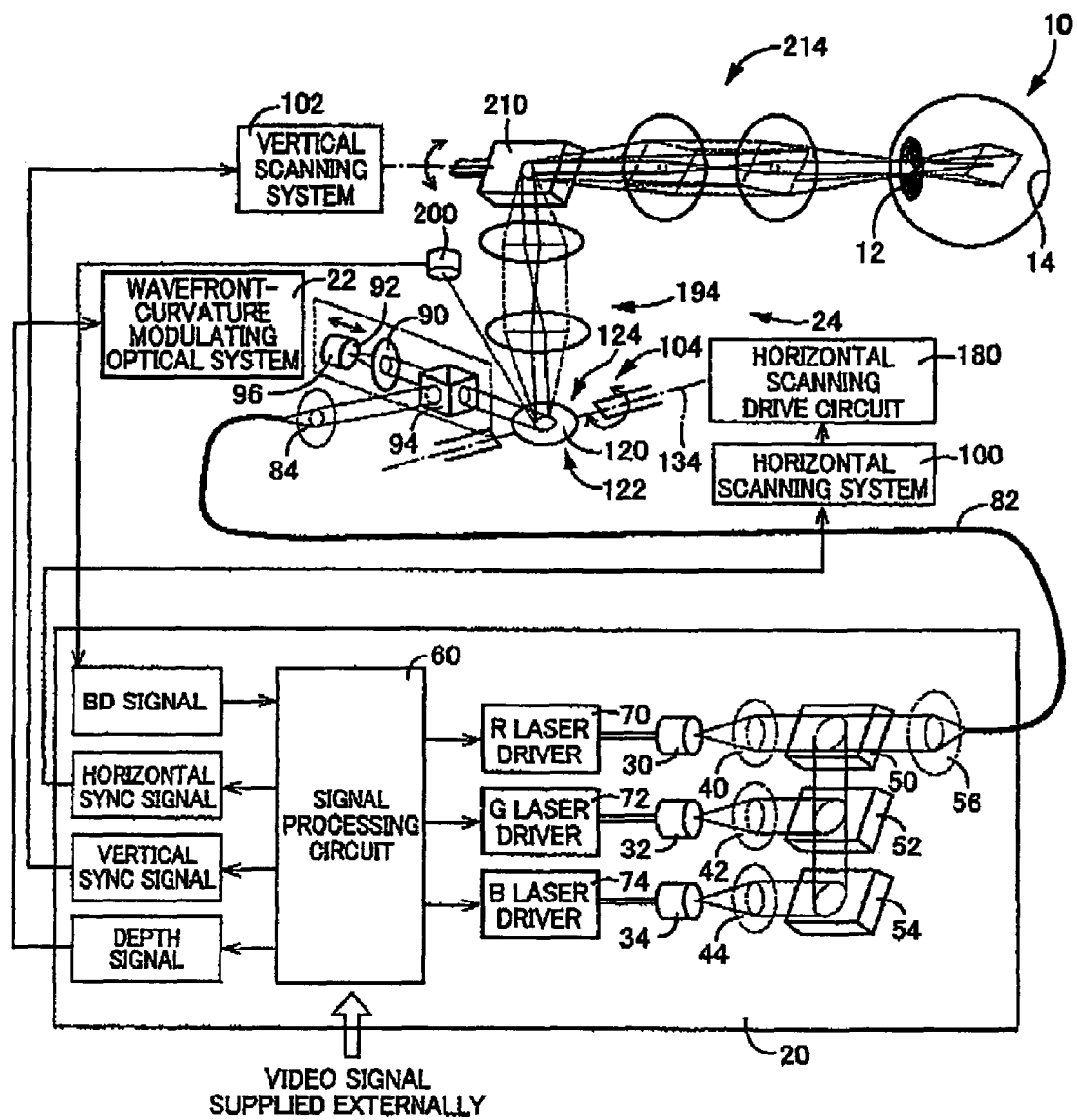
FIG. 1 is a schematic diagram illustrating a retinal scanning display including a reflective mirror for optical scan which has been fabricated by a reflective-mirror fabricating method according to a first embodiment of the present invention.

The object mentioned above may be achieved according to any one of the following modes of this invention.

These modes will be stated below so as to be sectioned and numbered, and so as to depend upon the other mode or modes, where appropriate. This is for a better understanding of some of a plurality of technological features and a plurality of combinations thereof disclosed in this description, and does not mean that the scope of these features and combinations is interpreted to be limited to the scope of the following modes of this invention.

That is to say, it should be interpreted that it is allowable to select the technological features which are stated in this description but which are not stated in the following modes, as the technological features of this invention.

Furthermore, stating each one of the modes of the invention in such a dependent form as to depend from the other mode or modes does not exclude the possibility that the technological features set forth in a dependent-form mode become independent of those set forth in the corresponding depended mode or modes and to be removed therefrom. It should be interpreted that the technological features set forth in a dependent-form mode is allowed to become independent, where appropriate.

(1) A method of fabricating by an etching technique a plate-shaped reflective mirror having a reflective surface on which light is incident: the method comprising:

a coating step of coating at least one of opposite faces of a plate-shaped etchable material made of a single crystal material, with a film-like etching mask;

a mask-pattern forming step of forming a mask pattern on at least one of opposite faces of the etching mask which has been deposited on the etchable material, the mask pattern having a planar shape to which a circle is more similar than a quadrangle; and a wet-etching step of wet-etching the etchable material on which the etching mask has been deposited, by immersing the etchable material in an etchant having a predetermined temperature and a predetermined concentration, whereby the reflective mirror is fabricated so as to have a silhouette of a planar shape to which a circle is more similar than a quadrangle, when viewed in a direction normal to the reflective surface.

Upon this method being practiced, a reflective mirror is fabricated so as to have a silhouette of a planar shape to which a circle is more similar than a quadrangle, when viewed in a direction normal to the reflective surface.

Therefore, upon this method being practiced for fabricating a reflective mirror required to have at least a circular reflective area with a desired size, such a reflective mirror is provided that is easier in removing a wasteful reflective area from the reflective mirror than when the reflective mirror has a silhouette of a quadrangle.

As a result, this method makes it easier to fabricate a reflective mirror reduced in weight and moment of inertia than when the reflective mirror has a silhouette of a quadrangle.

Additionally, upon this method being practiced, a reflective mirror is fabricated not by dry-etch but by wet-etch. Therefore, this method makes it easier to fabricate reflective mirrors in an efficiency-improving and cost-saving manner than when the reflective mirrors are fabricated by dry-etch.

In addition, dry-etch allows a reflective mirror to be fabricated so as to have the same shape as that of a mask pattern formed on an etching mask deposited on the surface of an etchable material. In contrast, wet-etch allows a reflective mirror to be fabricated so as to have a different shape from the mask pattern. This is caused by differences in etch rate between crystallographic planes in the etchable material.

Therefore, it is required, when the method according to the present mode is practiced, to prepare a mask pattern, based on a desired shape of a resulting reflective mirror, by allowing for differences in etch rate between crystallographic planes in an etchable material used.

Upon this method being practiced, the reflective mirror is fabricated so as to ultimately have a silhouette of a planar shape to which a circle is more similar than a quadrangle. Based on this fact, a mask pattern is prepared so as to have a silhouette of a planar shape to which a circle is more similar than a quadrangle, and which is different from a desired shape of the reflective mirror.

As will be evident from the above, even when a reflective mirror is fabricated by wet-etch, if a mask pattern is defined by allowing for differences in etch rate between crystallographic planes in an etchable material used, the reflective mirror can be fabricated to achieve its desired shape.

This method according to the present mode may be practiced in an arrangement in which the opposite faces of the etchable material are coated with respective etching masks, or an arrangement in which one of the opposite faces of the etchable material is coated with an etching mask.

For this method to be practiced in the former arrangement, its mask-pattern forming step may be implemented to form mask patterns on two etching masks which have been deposited on the opposite faces of the etchable material, respectively, or may be implemented to form a mask pattern on a selected one of those two etching masks.

That is to say, for this method according to the present mode to be practiced, the forming at least one mask pattern on at least one of opposite faces of an etchable material is sufficient.

(2) The method according to mode (1), wherein the reflective mirror is used for optical scan, in a manner that the reflective mirror is angularly oscillated about an oscillation axis parallel to the reflective surface, to thereby vary a direction in which light is reflected from the reflective surface upon entry thereinto.

This method allows a reflective mirror for use in optical scan to be fabricated by wet-etch so as to have a silhouette of a planar shape to which a circle is more similar than a quadrangle.

(3) The method according to mode (2), wherein the reflective mirror constitutes an oscillating body in cooperation with a plate-shaped spring which extends from the reflective mirror along the oscillation axis and which is excited to cause at least a torsional vibration about the oscillation axis, and wherein the reflective mirror is used for optical scan, in a manner that at least a portion of the oscillating body is excited to vibrate, to thereby vary a direction in which light is reflected from the reflective surface upon entry thereinto.

(4) The method according to any one of modes (1)-(3), wherein the planar shape of the mask pattern is generally in the shape of a convex octagon.

This method allows a reflective mirror generally having a silhouette of a convex octagon to be fabricated in the form of a reflective mirror which is easily reduced in moment of inertia than when the reflective mirror has a silhouette of a quadrangle.

(5) The method according to mode (4), wherein the planar shape of the mask pattern has a basic shape of a convex octagon with protrusions at eight corners of the octagon, and wherein the protrusions protrude outwardly from the octagon at the eight corners, as viewed in a direction perpendicular to a surface of the mask pattern.

This method allows portions of the etchable material which face the corners of the mask pattern during the wet-etching step, to be etched with a start-of-etching timing delayed with respect to that when the mask pattern does not have the protrusions at the respective corners. The reduction in etch rate affects the fabrication of the reflective mirror.

The "protrusions" set forth in the present mode may be defined to exhibit, for example, a shape allowing each protrusion extends from a corresponding one of the corners of a regular octagon toward a region in which an external angle for the corresponding corner is formed.

(6) The method according to mode (4) or (5), wherein the mask pattern is shaped to have first sides parallel to a reference line, and second sides perpendicular to the reference line, wherein the mask pattern is located relative to the etchable material, such that the first and second sides are each perpendicular to at least one of <110> crystallographic directions of the etchable material on at least one of {100} crystallographic planes of the etchable material, and wherein the mask pattern has an outline including a first portion corresponding to at least a separate one of the {100} crystallographic planes, and a second portion corresponding to at least one of {111} crystallographic planes of the etchable material, per each one of four regions into which a surface of the etchable material is separated by two center lines of symmetry orthogonally intersecting at a center point of the mask pattern.

Throughout the description and drawings, crystallographic planes are denoted as {abc}. The designation of planes {abc} includes not only a specific plane (abc) but also all of its equivalent planes. Therefore, (abc) crystallographic planes should be interpreted by generic definition to identify a family of equivalent planes. This holds true for crystallographic directions denoted as <abc>.

The method according to the present mode allows the fabrication of a reflective mirror having a silhouette of an m-sided polygon (m: four times an integer equal to or greater than three) having at least one of {100} crystallographic planes and at least one of {111} crystallographic planes, both as exposed surfaces.

(7) The method according to mode (6), wherein the outline of the mask pattern further includes a third portion corresponding to at least one of {n11} crystallographic planes of the etchable material (n: an integer equal to or greater than two), disposed between the first and second portions, per each region of the etchable material.

This method allows the fabrication of a reflective mirror having a silhouette of an m-sided polygon (m: multiples of eight, which is greater than eight) which is obtained by partially cutting away a presupposed octagon (defined below) at its eight corners.

The presupposed octagon is shaped to have a silhouette having an outline defined only by at least one of {100} crystallographic planes and at least one of {111} crystallographic planes.

The m-sided polygon is obtained by partially cutting away the presupposed octagon at its eight corners such that each corner is exposed at least one of different crystallographic planes from the above planes. That is to say, the thus-obtained m-sided polygon can refer to a chamfered octagon.

Therefore, this method allows a reflective mirror to be fabricated so as to have a silhouette of a planar shape to which a circle is more similar than an octagon.

Further, this method makes it easier to allow the silhouette of a resulting reflective mirror to approximate to a circle rather than a quadrangle.

Therefore, this method makes it easier to remove a wasteful reflective area from a reflective mirror required to achieve a desired reflective area (a desired width dimension), than in the case of a quadrangle-shaped reflective mirror, resulting in facilitated reduction in weight and moment of inertia of the reflective mirror.

The degree of circularity or roundness of the circumference of a reflective mirror (i.e., how much a reflective mirror approximates to a complete circle) becomes better when crystallographic surfaces at which each corner of the aforementioned presupposed octagon is exposed are different in type, than when the exposed crystallographic surfaces are identical in type.

For example, when the exposed crystallographic surfaces are identical in type, the silhouette of a corresponding reflective mirror is a 16-sided polygon. On the other hand, when the exposed crystallographic surfaces have two different types, the silhouette of a corresponding reflective mirror is a 24-sided polygon.

There exits the tendency that, as the types of the exposed crystallographic surfaces increase in number, the degree of circularity of the reflective mirror improves. The tendency is amplified as the types of the exposed crystallographic surfaces increase in number.

The method according to the present mode is advantageous in increasing the number of types of the exposed crystallographic surfaces.

(8) The method according to mode (6), wherein the outline of the mask pattern further includes a fourth portion corresponding to at least one of {520} crystallographic planes of the etchable material, disposed between the first and second portions, per each region of the etchable material.

This method allows the fabrication of a reflective mirror having a silhouette of a specific shape which is obtained by partially cutting away a presupposed octagon (defined below) at its eight corners.

The presupposed octagon is shaped to have a silhouette having an outline defined only by at least one of {100} crystallographic planes and at least one of {111} crystallographic planes.

The specific shape is obtained by partially cutting away the presupposed octagon at its eight corners such that each corner is exposed principally at least one of {520} crystallographic planes. A reflective mirror which can be fabricated by this method has a planar shape having a silhouette approximate to a 16-sided polygon.

Therefore, this method allows a reflective mirror to be fabricated so as to have a silhouette of a planar shape to which a circle is more similar than an octagon.

Further, this method allows a reflective mirror to be fabricated so as to have a shape permitting each corner of the octagon to be exposed, as a result of each corner being partially cut away, principally at a plurality of crystallographic surfaces identical in type, with the exposed crystallographic surfaces being kept unchanged in type.

Therefore, this method allows a plurality of reflective mirrors to be fabricated so as not to be variable in ultimate shape, resulting in improved stability of the circumferential profiles of the reflective mirrors.

(9) The method according to any one of modes (1)-(8), wherein the etchant includes KOH or TMAH.

(10) The method according to mode (9), wherein the predetermined concentration is in the range from about 0.35 wt.% to about 45 wt.%.

(11) The method according to mode (9) or (10), wherein the predetermined temperature is in the range from about 60 degrees Celsius (.degree. C.) to about 80.degree. C.

(12) The method according to any one of modes (1)-(11), wherein the mask-pattern forming step includes a step of forming the mask pattern on each of two etching masks which have been deposited on the opposite faces of the etchable material, respectively.

Figure 14:
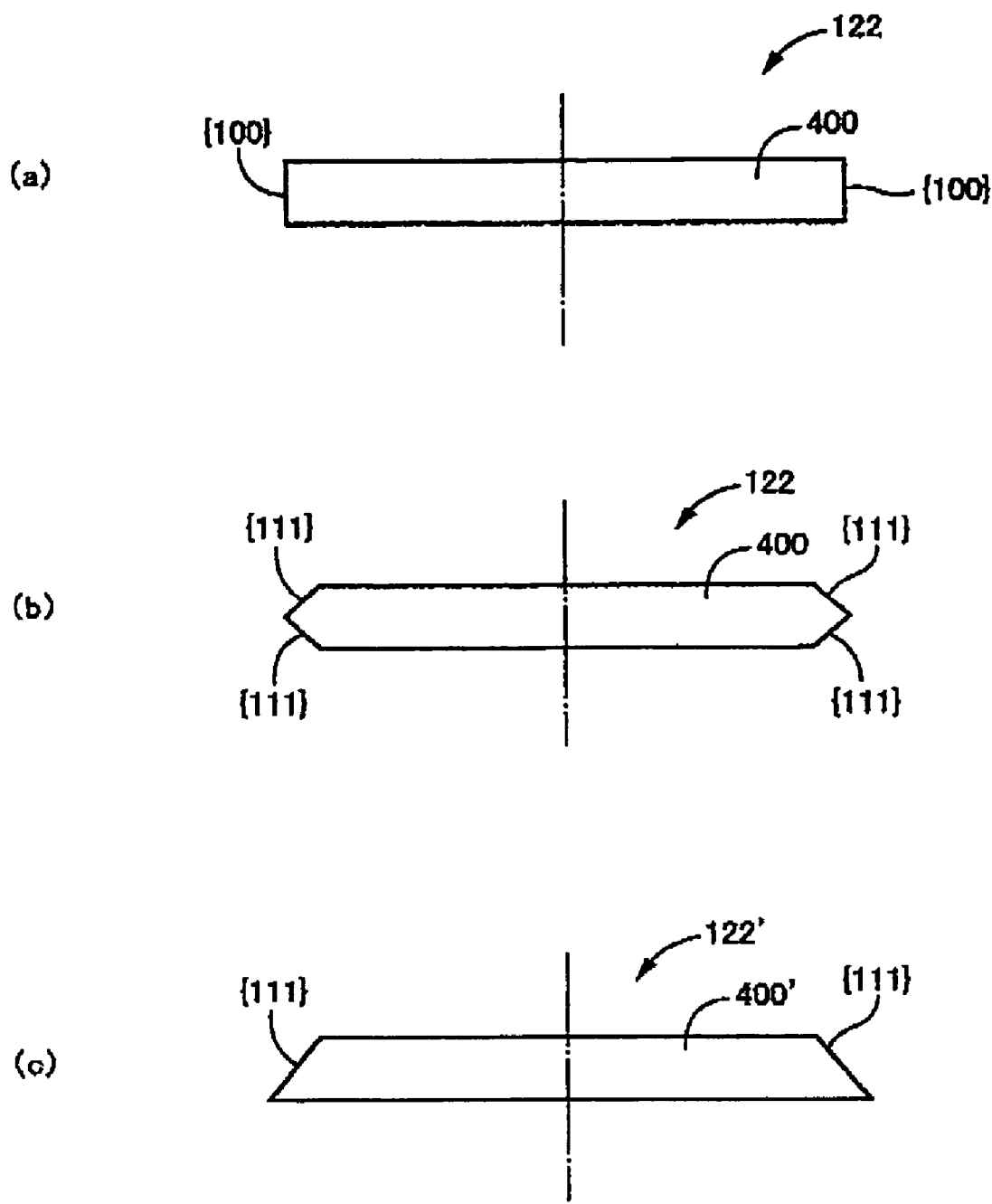
FIGS. 14(a) and 14(b) are vertical sectional-views illustrating the reflective mirror 122 ultimately fabricated the reflective-mirror fabricating method illustrated in FIG. 9.
FIG. 14(c) is a vertical sectional-view illustrating a comparative example of the reflective mirror 122.

Upon the method according to any one of above modes (1)-(11) being practiced, an instance exists where a reflective mirror is fabricated such that a lateral side or circumference of the reflective mirror has an inclined region in a vertical sectional-view, as illustrated in FIGS. 14(b) and 14(c), for example.

In this instance, upon an etchable material being wet-etched only from one of opposite faces of the etchable material, as illustrated in FIG. 14(c) in vertical sectional-view, for example, the inclined region is formed at a lateral side of an etchable material 400' in the shape of a continuous inclined surface. The inclined surface is shaped to be asymmetrical with respect to a line extending parallel to the etchable material 400' and passing through the center of the thickness of the etchable material 400'.

In contrast, upon an etchable material being wet-etched from opposite faces of the etchable material, as illustrated in FIG. 14(b) in vertical sectional-view, for example, the inclined region is formed at a lateral side of an etchable material 400 in the shape of discontinuous inclined surfaces. The inclined surfaces are shaped to be symmetrical with respect to a line extending parallel to the etchable material 400 and passing through the center of the thickness of the etchable material 400.

In comparison of the former type of wet-etch (i.e., single-sided wet-etch) with the latter type of wet-etch (i.e., double-sided wet-etch), in terms of the weight of a resulting reflective mirror, the double-sided wet-etch can reduce the weight of a resulting reflective mirror more easily than the single-sided wet-etch. The easier the reduction in weight of a reflective mirror becomes, the easier the reduction in moment of inertia of the reflective mirror becomes.

Based on the findings described above, in the method according to the present mode, mask patterns are formed on two etching masks which have been deposited on opposite faces of an etchable material, respectively. That is to say, opposite faces of an etchable material are formed to have respective mask patterns, and eventually, the etchable material is wet-etched from the opposite faces of the etchable material, respectively.

(13) The method according to any one of modes (1)-(12), further comprising a removing step of, upon completion of the wet-etching, removing the etching mask from the etchable material.

(14) The method according to mode (13), further comprising a reflective-layer forming step of, after removal of the etching mask from the etchable material, forming a reflective layer on at least one of the opposite faces of the etchable material.

(15) A plate-shaped reflective mirror which has a reflective surface on which light is incident, wherein the reflective mirror is shaped to have a silhouette of a planar shape to which a circle is more similar than a quadrangle, when viewed in a direction normal to the reflective surface, and wherein the reflective mirror is fabricated by implementing:

a coating step of coating at least one of opposite faces of a plate-shaped etchable material made of a single crystal material, with a film-like etching mask;

a mask-pattern forming step of forming a mask pattern on at least one of opposite faces of the etching mask which has been deposited on the etchable material, the mask pattern having a planar shape to which a circle is more similar than a quadrangle; and a wet-etching step of wet-etching the etchable material on which the etching mask has been deposited, by immersing the etchable material in an etchant having a predetermined temperature and a predetermined concentration.

This reflective mirror has a silhouette of a planar shape to which a circle is more similar than a quadrangle, when viewed in a direction normal to the reflective surface.

Therefore, this reflective mirror, when used to satisfy the requirements to have its reflective surface having at least a circular reflective area with a desired size, makes it easier to remove a wasteful reflective area from the reflective mirror than when a reflective mirror has a silhouette of a quadrangle.

As a result, this reflective mirror allows reduction in weight and moment of inertia more easily than when the reflective mirror has a silhouette of a quadrangle.

(16) The reflective mirror according to mode (15), wherein the reflective mirror is used for optical scan, in a manner that the reflective mirror is angularly oscillated about an oscillation axis parallel to the reflective surface, to thereby vary a direction in which light is reflected from the reflective surface upon entry thereinto.

(17) The reflective mirror according to mode (16), wherein the reflective mirror constitutes an oscillating body in cooperation with a plate-shaped spring which extends from the reflective mirror along the oscillation axis and which is excited to cause at least a torsional vibration about the oscillation axis, and wherein the reflective mirror is used for optical scan, in a manner that at least a portion of the oscillating body is excited to vibrate, to thereby vary a direction in which light is reflected from the reflective surface upon entry thereinto.

(18) A process of integrally fabricating by an etching technique an oscillating body having a unitary configuration including both a reflective mirror having a reflective surface, and a plate-shaped spring, wherein the reflective mirror is used for optical scan, in a manner that the reflective mirror is angularly oscillated about an oscillation axis parallel to the reflective surface, to thereby vary a direction in which light is reflected from the reflective surface upon entry thereinto, wherein the spring is shaped to have a beam structure which extends from the reflective mirror along the oscillation axis and which has a stepped portion, wherein the spring is excited by a vibration occurring in at least a portion of the oscillating body, to cause at least a torsional vibration about the oscillation axis, to thereby angularly oscillate the reflective mirror about the oscillation axis by at least the caused torsional vibration, and wherein the process comprises:

a coating step of coating opposite faces of a to-be-processed portion of a plate-shaped etchable material made of a single crystal material, with two film-like etching masks, respectively, wherein the to-be-processed portion is to be processed into the beam structure;

a mask-pattern forming step of forming a pair of mask patterns on the two etching masks which have been deposited on the opposite faces of the to-be-processed portion, respectively, wherein the pair of mask patterns have respective shapes for forming the beam structure; and a wet-etching step of, after formation of the pair of mask patterns, wet-etching the etchable material by immersing the etchable material in an etchant.

This process is directed to techniques of fabricating a one-dimensionally extending beam structure by an etch method, and more particularly to techniques of integrally fabricating the beam structure shaped to have a stepped portion disposed at a local position on a path extending in a length-wise direction of the beam structure.

For example, in the applications where images are optically formed, instances exist where a beam structure is used for optical scan, or depth control of a virtual image perceived by a viewer through the viewer's eye, by varying a direction in which light travels, or varying the curvature of wavefront of light entering a viewer's eye, with high accuracy.

In operation, the beam structure is excited to cause a torsional vibration about a straight line in parallel to the beam structure for optical scan, or is excited to cause a vertical vibration along a direction perpendicular to the surface of the beam structure for modulation of the curvature of wavefront of light, for example.

Such a beam structure, when used for optical scan or depth control of a virtual image, is configured to include a plate-shaped reflective mirror having a reflective surface on which light is incident, and an elastically deformable portion extending coplanar with the reflective mirror, in a unitary configuration, for example.

Japanese Patent No. 2981600 discloses an example of a conventional thus-configured beam structure.

(19) The process according to mode (18), wherein the stepped portion is ultimately shaped to include:

(a) a higher sub-portion having the same height as a basic surface of the beam structure;

(b) a lower sub-portion lower than the basic surface, and lower than the higher sub-portion in a thickness-wise direction of the beam structure; and (c) a shoulder sub-portion which is located at a border between the higher and lower sub-portions and which traverses the beam structure.

By this process, an etchable material patterned to have a mask pattern is wet-etched, to thereby fabricate a beam structure having a stepped portion. The stepped portion, as described above, is shaped to include the higher sub-portion, the lower sub-portion, and the shoulder sub-portion.

(20) The process according to mode (19), wherein the etchable material is originally shaped to include;

(d) a to-be-fully-etched portion of the etchable material which is to be etched through a thickness of the etchable material when wet-etched, to thereby produce the beam structure from the plate-shaped etchable material;

(e) a to-be-unetched portion of the etchable material which is to remain unetched when wet-etched, to thereby form the higher sub-portion, and (f) a to-be-half-etched portion of the etchable material which is to be etched in half-way of the thickness of the etchable material when wet-etched, to thereby form the lower sub-portion.

For this process to be implemented, an etchable material is configured to include the to-be-fully-etched portion to produce the beam structure from the plate-shaped etchable material; the to-be-unetched portion to produce the higher sub-portion of the stepped portion, from the plate-shaped etchable material; and the to-be-half-etched portion to produce the lower sub-portion of the stepped portion, from the plate-shaped etchable material.

(21) The process according to claim 20, wherein the to-be-fully-etched portion includes opposite sub-portions which are opposed to each other in a width-wise direction of the beam structure and between which the to-be-half-etched portion is interposed, and wherein the pair of mask patterns are originally shaped to include;

(g) a basic pattern shaped to cover a surface of the to-be-unetched portion; and (h) a compensating pattern shaped to cover a surface of at least opposite sub-portions of the opposite sub-portions and the to-be-half-etched portion.

The present inventors conducted researches into a technique of integrally fabricating a beam structure having a stepped portion disposed at a position on a path extending in a length-wise direction of the beam structure.

The stepped portion is shaped to include: (a) a higher sub-portion having the same height as a basic surface of the beam structure; (b) a lower sub-portion lower than the basic surface, and lower than the higher sub-portion in a thickness-wise direction of the beam structure; and (c) a shoulder sub-portion which is located at a border between the higher and lower sub-portions and which traverses the beam structure.

The research has made the inventors recognize that dry-etching of a wafer makes it easier to fabricate a beam structure so that a shoulder sub-portion of a stepped portion of the fabricated beam structure is formed at a less-variable position on a path extending in a length-wise direction of the beam structure, while wet-etching of a wafer in a conventional fashion makes it more difficult to fabricate a beam structure so that a shoulder sub-portion of a stepped portion of the fabricated beam structure is formed at a less-variable position on a path extending in a length-wise direction of the beam structure. That is to say, a conventional wet-etch forms the shoulder sub-portion at a position sensitive to a variable etch time.

The research has further made the inventors recognize that a conventional wet-etching technique makes it difficult to fabricate beam structures so that their shoulder sub-portions are formed at respective positions on length-wise directions of the beam structures, with these positions being less variable irrespective of individual differences between the beam structures. That is to say, a conventional wet-etch forms the shoulder sub-portion at a position sensitive to individual-differences between the beam structures Describing in greater detail, the shoulder sub-portion of the stepped portion is formed by etching a flat plane portion of an etchable material. During such etch, at the etchable material, an intermediate is produced which has a similar shape to the resulting shoulder sub-portion.

The intermediate extends along a plane intersecting a basic surface of the etchable material. As a result, at the intermediate, the etch progresses not only in a direction allowing the thickness of the etchable material to be reduced, but also in directions allowing the width of the etchable material to be reduced and allowing the position of the intermediate to go back in the length-wise direction of the beam structure.

For these reasons, at the intermediate, etch progresses at a faster rate than at the basic surface of the same etchable material, and the composition of exposed crystallographic surfaces is prone to be complicated.

Therefore, if a mask pattern which is pre-deposited on an etchable material for etching a flat surface portion of the etchable material to form a solid stepped-portion, is formed to have the same shape as that of a basic pattern reflecting faithfully only the shape of the aforementioned to-be-unetched portion, then the stepped portion of the beam structure is fabricated such that the shoulder sub-portion of the stepped portion is formed at a variable position on a path extending in the length-wise direction of the beam structure.

In other words, the position of the shoulder sub-portion is very sensitive to unintended variations in actual etching conditions (including, e.g., an etch time), with the result that shoulder sub-portions of beam structures (intended to be identical in shape) which have been fabricated by etch are prone to be variable in position.

With this in mind, the process according to the present mode has been invented to provide a technique of integrally fabricating a beam structure having a stepped portion at a local position on a path extending in a length-wise direction of the beam structure, such that a shoulder sub-portion of the stepped portion is positioned at a controlled position on a path extending in a length-wise direction of the beam structure.

This process is practiced using a mask pattern configured to include a basic pattern covering the surface of the to-be-unetched portion. The mask pattern is configured to further include a compensating pattern shaped to cover opposite sub-portions of the to-be-fully-etched portion which are opposed to each other in a width-wise direction of the beam structure and between which the to-be-half-etched portion is interposed, and to optionally further cover the to-be-half-etched portion.

(i) opposite sub-portions which are opposed to each other in a width-wise direction of the beam structure and between which the to-be-half-etched portion is interposed: and (ii) a compensating pattern shaped to cover a surface of at least opposite sub-portions of the opposite sub-portions and the to-be-half-etched portion.

The compensating pattern has a function to reduce an etch rate at a portion of the etchable material which has been coated with the basic pattern.

Further, this compensating pattern makes it easier to control the composition of exposed surfaces of an ultimately formed shoulder sub-portion, depending on one of various shapes of this compensating pattern, in a manner that crystallographic surfaces resistant to etch are exposed at appropriate positions. The exposure of the shoulder sub-portion at crystallographic surfaces resistant to etch contributes to the formation of the shoulder sub-portion at a less-variable position (i.e., with enhanced position stability) even under a varying actual-etching-condition.

In view of the above findings, the process according to the present mode is implemented using a mask pattern configured to include a compensating pattern in addition to a basic pattern, allowing a beam structure having a solid stepped portion to be integrally fabricated from a plate-shaped etchable material with greater ease, so that a shoulder sub-portion of the stepped portion is improved in position accuracy.

(22) The process according to any one of modes (18)-(21), wherein the to-be-processed portion includes a portion of the etchable material which is to be processed into the reflective mirror, and wherein each of the pair of mask patterns has a planar shape for forming the reflective mirror, to which a circle is more similar than a quadrangle, whereby the reflective mirror is fabricated so as to have a silhouette of a planar shape to which a circle is more similar than a quadrangle, when viewed in a direction normal to the reflective surface.

(23) The process according to any one of modes (18)-(22), wherein each of the pair of mask patterns has a uniform thickness throughout each mask pattern.

This process allows a mask pattern to be formed with greater ease and higher stability than when the mask pattern is not uniform in thickness.

(24) The process according to any one of modes (18)-(23), wherein the etchable material is made of a single crystal silicon, and at least one of a plurality of {100} crystallographic planes of the single crystal silicon is assigned an initial exposed surface.

(25) The process according to mode (21), wherein the compensating pattern includes a first etch compensator disposed to cover surfaces of the opposite sub-portions, to thereby reduce a rate of the wet-etching performed for the to-be-half-etched portion, for preventing the etchant from reaching the to-be-unetched portion.

By this process, the surfaces of the opposite sub-portions of the etchable material are coated with the first etch compensator, which is a portion of the mask pattern.

In this regard, the opposite sub-portions are opposed to each other in a width-wise direction of the beam structure, and the to-be-half-etched portion is interposed between the opposite sub-portions.

The coating of the opposite sub-portions results in a reduced etch rate at which wet-etch progresses at the to-be-half-etched portion of the etchable material.

Therefore, this process, because of the first etch compensator, prevents wet-etch from reaching the to-be-unetched-portion, in the presence of the possibility that the to-be-unetched-portion of the etchable material is wet-etched at its shoulder sub-portion from its forward-facing side.

As a result, this process allows the shoulder sub-portion to be ultimately formed at a less variable position (i.e., with enhanced position stability) even under a varying actual-etching-condition.

(26) The process according to mode (25), wherein the first etch compensator includes a pair of wings which coextend in a length-wise direction of the beam structure, and which are disposed on respective opposite sides with respect to the to-be-half-etched portion, and wherein the wings are associated with the basic pattern, such that the wings are partially coupled at one end side of the wings to the basic pattern, and such that the wings are partially open at opposite end side of the wings, whereby the wings and a portion of the basic pattern which is coupled to the wings cooperate to form a substantial U-shape.

(27) The process according to mode (25) or (26), wherein the first etch compensator includes a rectilinear portion which is parallel to a width-wise direction of the beam structure and which is perpendicular to at least one of a plurality of <110> crystallographic directions of the etchable material.

Portions of an etchable material which are oriented perpendicular to <110> crystallographic directions of the etchable material are resistant to etch. Therefore, if a shoulder sub-portion is wet-etched so that such portions are exposed, then the shoulder sub-portion is formed with enhanced position stability.

In view of the above findings, this process according to the present mode is implemented in a manner that the first etch compensator set forth in the above mode (25) or (26) is configured to include a rectilinear portion which is oriented parallel to the width-wise direction of the beam structure, and perpendicular to at least one of a plurality of <110> crystallographic directions of the etchable material.

(28) The process according to mode (21) or any one of modes (25)-(27), wherein the compensating pattern includes a second etch compensator disposed to cover a surface of the to-be-half-etched portion, to thereby reduce a rate of the wet-etching performed for the to-be-half-etched portion, for preventing the etchant from reaching the to-be-unetched portion.

By this process, the surface of the to-be-half-etched portion of the etchable material is coated with the second etch compensator, which is a portion of the mask pattern.

The coating of the to-be-half-etched portion results in a reduced etch rate at which wet-etch progresses at the to-be-half-etched portion of the etchable material.

Therefore, this process, because of the second etch compensator, prevents wet-etch from reaching the to-be-unetched-portion, in the presence of the possibility that the to-be-unetched-portion of the etchable material is wet-etched at its shoulder sub-portion from its forward-facing side.

As a result, this process allows the shoulder sub-portion to be ultimately formed at a less variable position (i.e., with enhanced position stability) even under a varying actual-etching-condition.

(29) The process according to mode (28), wherein the compensating pattern includes the first etch compensator defined in any one of modes (25)-(29) and the second etch compensator, wherein the compensating pattern and a portion of the basic pattern which is coupled to the compensating pattern cooperate to form a substantial rhombus-shape having four corners and four sides, wherein each side of the compensating pattern is perpendicular to at least one of a plurality of <100> crystallographic directions of the etchable material, and wherein the compensating pattern is shaped such that the compensating pattern is coupled at one of two opposite corners of the four corners to the basic pattern, and such that the compensating pattern is cut-away at the other of the opposite corners.

(30) The process according to any one of modes (18)-(29), wherein the wet-etching step is implemented such that the etchable material is immersed in the etchant once, to thereby fabricate the oscillating body at a time.

The process according to any one of the above modes (18)-(29) may be practiced such that, in the wet-etching step, the same etchable material is immersed in an etchant several times, to thereby fabricate a beam structure in several steps.

In contrast, this process according to the present mode is practiced such that, in the wet-etching step, an etchable material is immersed in an etchant once, to thereby fabricate a beam structure in one step.

(31) A beam structure having a stepped portion at least one position on a path extending in a length-wise direction of the beam structure, wherein the stepped portion is fabricated by wet-etching a plate-shaped etchable material made of a single crystal material such that the stepped portion is ultimately shaped to include:

(a) a higher sub-portion having the same height as a basic surface of the beam structure;

(b) a lower sub-portion lower than the basic surface, and lower than the higher sub-portion in a thickness-wise direction of the beam structure; and (c) a shoulder sup-portion which is located at a border between the higher and lower sub-portions and which traverses the beam structure.

This beam structure, which is configured to have a stepped portion at least one position on a path extending in a length-wise direction of the beam structure, allows this beam structure to be integrally fabricated by wet-etch.

This beam structure can be fabricated by the practice of the process according to any one of the above modes (18)-(30) in a suitable manner.

(32) The beam structure according to mode (31), fabricated by implementing the process according to any one of modes (18)-(30).

(33) The beam structure according to mode (31) or (32), configured to have a unitary configuration of a plate-shaped reflective mirror on which light is incident and an elastically-deformable portion extending coplanar with the reflective mirror, the elastically-deformable portion having the stepped portion formed therein.

(34) The beam structure according to mode (33), for use in varying an optical characteristic of light incident on the reflective surface, by vibration of the oscillating body.

The "vibration" set forth in the present mode and the following modes may be achieved as, for example, an angular oscillation of the beam structure about an oscillation axis oriented parallel to the reflective surface, a reciprocal motion of the beam structure along a rectilinear line oriented perpendicular to the reflective surface, etc.

The "optical characteristic" set forth in the present mode may be interpreted to mean, for example, an angle at which outgoing light from the reflective surface is deflected from incoming light by use of the reflective surface, the curvature of wavefront of outgoing light from the reflective surface, etc.

(35) The beam structure according to any one of modes (31)-(34), further comprising a laminate formed on the lower sub-portion, such that an upper face of the laminate is not above an upper face of the higher sub-portion.

This beam structure allows its laminate (e.g., a vibrator, an actuator) to be formed at this beam structure while preventing the laminate from protruding from the basic surface of the beam structure in the thickness-wise direction.

Therefore, this beam structure, when used in an environment, for example, where there is a need to thin the beam structure, allows the laminate to be formed within the beam structure, while satisfying the need.

(36) A process of integrally fabricating by an etching technique an oscillating body having a unitary configuration including both a reflective mirror having a reflective surface, and a plate-shaped spring, wherein the reflective mirror is used for optical scan, in a manner that the reflective mirror is angularly oscillated about an oscillation axis parallel to the reflective surface, to thereby vary a direction in which light is reflected from the reflective surface upon entry thereinto, wherein the spring is shaped to have a beam structure which extends from the reflective mirror along the oscillation axis and which has a stepped portion disposed at a position on a path extending in a length-wise direction of the beam structure, wherein the spring is excited by a vibration occurring in at least a portion of the oscillating body, to cause at least a torsional vibration about the oscillation axis, to thereby angularly oscillate the reflective mirror about the oscillation axis by at least the caused torsional vibration, wherein the process comprises the method according to any one of modes (1)-(14), wherein the coating step includes a step of coating opposite faces of a to-be-processed portion of the etchable material with two film-like etching masks, respectively, for fabricating the beam structure, wherein the mask-pattern forming step includes a step of forming a pair of mask patterns on the two etching masks which have been deposited on the opposite faces of the to-be-processed portion, respectively, for fabricating the beam structure, wherein the wet-etching step includes a step of wet-etching the to-be-processed portion on which the pair of mask patterns have been deposited at the mask-pattern forming step, such that the etchable material is immersed in the etchant, for fabricating the beam structure, wherein the stepped portion is shaped to include:

(a) a higher sub-portion having the same height as a basic surface of the beam structure;

(b) a lower sub-portion lower than the basic surface, and lower than the higher sub-portion in a thickness-wise direction of the beam structure; and (c) a shoulder sup-portion which is located at a border between the higher and lower sub-portions and which traverses the beam structure, wherein the etchable material is originally shaped to include:

(d) a to-be-fully-etched portion of the etchable material which is to be etched through a thickness of the etchable material when wet-etched, to thereby produce the beam structure from the plate-shaped etchable material;

(e) a to-be-unetched portion of the etchable material which is to remain unetched when wet-etched, to thereby form the higher sub-portion; and (f) a to-be-half-etched portion of the etchable material which is to be etched in half-way of the thickness of the etchable material when wet-etched, to thereby form the lower sub-portion, wherein the to-be-fully-etched portion includes opposite sub-portions which are opposed to each other in a width-wise direction of the beam structure and between which the to-be-half-etched portion is interposed, and wherein the pair of mask patterns are shaped to include:

(g) a basic pattern shaped to cover a surface of the to-be-unetched portion; and (h) a compensating pattern shaped to cover a surface of at least opposite sub-portions of the opposite sub-portions and the to-be-half-etched portion.

This process can achieve the effects in common to those of the process according to the above mode (21), by the principle in common to that of the process according to the above mode (21). In other words, this process allows the beam structure of the oscillating to be fabricated so that a shoulder sub-portion of the stepped portion is improved in position accuracy.

(37) The process according to mode (36), wherein each of the pair of mask patterns has a uniform thickness throughout each mask pattern.

This process can achieve the effects in common to those of the process according to the above mode (23).

(38) The process according to mode (36) or (37), wherein the etchable material is made of a single crystal silicon, and is exposed at least one of a plurality of {100} crystallographic planes.

(39) The process according to any one of modes (36)-(38), wherein the compensating pattern includes a first etch compensator disposed to cover surfaces of the opposite sub-portions, to thereby reduce a rate of the wet-etching performed for the to-be-half-etched portion, for preventing the etchant from reaching the to-be-unetched portion.

This process can achieve the effects in common to those of the process according to the above mode (25), by the principle in common to that of the process according to the above mode (25).

(40) The process according to mode (39), wherein the first etch compensator includes a pair of wings which coextend in a length-wise direction of the beam structure, and which are disposed on respective opposite sides with respect to the to-be-half-etched portion, and wherein the wings are associated with the basic pattern, and that the wings are partially coupled at one end side of the wings to opposite end side of the wings, whereby the wings and a portion of the basic pattern which is coupled to the wings cooperate to form a substantial U-shape.

(41) The process according to mode (39) or (40), wherein the first etch compensator includes a rectilinear portion which is parallel to a width-wise direction of the beam structure and which is perpendicular to at least one of a plurality of <110> crystallographic directions of the etchable material.

This process can achieve the effects in common to those of the process according to the above mode (27), by the principle in common to that of the process according to the above mode (27).

(42) The process according to any one of modes (36)-(41), wherein the compensating pattern includes a second etch compensator disposed to cover a surface of the to-be-half-etched portion, to thereby reduce a rate of the wet-etching performed for the to-be-half-etched portion, for preventing the etchant from reaching the to-be-unetched portion.

This process can achieve the effects in common to those of the process according to the above mode (28), by the principle in common to that of the process according to the above mode (28).

(43) The process according to mode (42), wherein the compensating pattern includes the first etch compensator defined in any one of modes (39)-(41), and the second etch compensator, wherein the compensating pattern and a portion of the basic pattern which is coupled to the compensating pattern cooperate to forms a substantial rhombus-shape having four corners and four sides, wherein each side of the compensating pattern is perpendicular to at least one of a plurality of <100> crystallographic directions of the etchable material, and wherein the compensating pattern is shaped such that the compensating pattern is coupled at one of two opposite corners of the four corners to the basic pattern, and such that the compensating pattern is cut-away at the other of the opposite corners.

(44) The process according to any one of modes (36)-(43), wherein the wet-etching step is implemented such that the etchable material is immersed in the etchant once, to thereby fabricate the oscillating body at a time.

This process can achieve the effects in common to those of the process according to the above mode (30), by the principle in common to that of the process according to the above mode (30).

(45) An oscillating body having a unitary configuration including both a reflective mirror according to any one of modes (15)-(17), and a plate-shaped spring, wherein the reflective mirror is used for optical scan, in a manner that the reflective mirror is angularly oscillated about an oscillation axis parallel to the reflective surface, to thereby vary a direction in which light is reflected from the reflective surface upon entry thereinto, wherein the spring is shaped to have a beam structure which extends from the reflective mirror along the oscillation axis and which has a stepped portion, wherein the spring is excited by a vibration occurring in at least a portion of the oscillating body, to cause at least a torsional vibration about the oscillation axis, to thereby angularly oscillate the reflective mirror about the oscillation axis by at least the caused torsional vibration, and wherein the stepped portion is ultimately shaped to include:

(a) a higher sub-portion having the same height as a basic surface of the beam structure;

(b) a lower sub-portion lower than the basic surface, and lower than the higher sub-portion in a thickness-wise direction of the beam structure; and (c) a shoulder sup-portion which is located at a border between the higher and lower sub-portions and which traverses the beam structure.

(46) The oscillating body according to mode (45), fabricated by implementing the process defined in any one of modes (36)-(44).

(47) The oscillating body according to mode (45) or (46), having a unitary configuration of the reflective mirror and an elastically-deformable portion extending coplanar with the reflective mirror, the elastically-deformable portion having the stepped portion formed therein.

(48) The oscillating body according to any one of modes (45)-(47), for use in varying an optical characteristic of light incident on the reflective surface, by vibration of the oscillating body.

(49) The oscillating body according to any one of modes (45)-(48), further comprising a laminate formed on the lower sub-portion, such that an upper face of the laminate is not above an upper face of the higher sub-portion.

Several presently preferred embodiments of the invention will be described in detail by reference to the drawings in which like numerals are used to indicate like elements throughout.

First Embodiment

Referring first to FIG. 1, there is schematically illustrated a retinal scanning display including a reflective mirror for optical scan which has been fabricated by a reflective-mirror fabricating method according to a first embodiment of the present invention.

This retinal scanning display (hereinafter, abbreviated to "RSD") is an apparatus adapted to allow a laser beam, with wavefront curvature and light intensity being properly modulated, to impinge onto a retina 14 through a pupil 12 of a viewer's eye 10. This RSD allows the laser beam to be two-dimensionally scanned on the retina 14, to thereby directly project a desired image onto the retina 14.

This RSD includes a light source unit 20, and a wavefront-curvature modulating optical system 22 and a scanning unit 24 both of which are disposed between the light source unit 20 and the viewer's eye 10 arrayed in the description order.

For generating a beam of laser of any color by combining three beams of laser of three primary colors (RGB) into a single beam of laser, the light source unit 20 includes an R laser 30 emitting a red-colored beam of laser, a G laser 32 emitting a green-colored beam of laser, and a B laser 34 emitting a blue-colored beam of laser. These lasers 30, 32, and 34 each may be constructed as a semiconductor laser, for example.

For beams of laser emitted from the respective lasers 30, 32, and 34 to be eventually combined, these beams of laser are collimated by collimating optical systems 40, 42, and 44, respectively, and thereafter, these beams of laser are caused to enter respective dichroic mirrors 50, 52, and 54 all of which are wavelength-selective. As a result, these beams of laser are selectively reflected from or transmitted through the corresponding respective dichroic mirrors 50, 52, and 54, depending on the wave length of each beam of laser.

More specifically, a red-colored beam of laser emitted from the R laser 30 is caused to enter the dichroic mirror 50 after collimated by the collimating optical system 40. A green-colored beam of laser emitted from the G laser 32 is caused to enter the dichroic mirror 52 through the collimating optical system 42. A blue-colored beam of laser emitted from the B laser 34 is caused to enter the dichroic mirror 54 through the collimating optical system 44.

Upon entry into the respective three dichroic mirrors 50, 52, and 54, the beams of laser of three primary colors eventually enter the dichroic mirror 50, which is a representative one of the dichroic mirrors 50, 52, and 54, resulting in the beams of laser being combined thereat. The combined beam of laser is subsequently focused at a combining optical system 56.

Although the optical section of the light source unit 20 has been described above, then there will be described the electrical section of the light source unit 20.

The light source unit 20 includes a signal processing circuit 60 constructed principally with a computer. The signal processing circuit 60 is configured to perform, in response to an externally-supplied video signal, signal processing for driving the respective lasers 30, 32, and 34; and signal processing for implementing a scanning operation of a laser beam.

In operation, the signal processing circuit 60 supplies drive signals for driving the respective lasers 30, 32, and 34, in response to the externally-supplied video signal, per each pixel of a desired image to be projected onto the retina 14. These drive signals, which are required for obtaining desired color and intensity of a beam of laser, are routed to the corresponding respective lasers 30, 32, and 34 via corresponding respective laser drivers 70, 72, and 74. The signal processing for scanning a laser beam will be described below.

The light source unit 20 described above causes a laser beam to be focused at the combining optical system 56 and to be entered into an optical fiber 82. Upon entry into the optical fiber 82, the laser beam passes through the optical fiber 82 functioning as a light transmissive medium, and enters the wavefront-curvature modulating optical system 22 via a collimating optical system 84 which collimates the laser beam exiting the optical fiber 82 at its rearward end divergently.

This wavefront-curvature modulating optical system 22 is an optical system for modulating a curvature of wavefront of a laser beam emitted from the light source unit 20. This wavefront-curvature modulating optical system 22 may be of a type, although it is inessential to practice the present invention, that performs the wavefront curvature modulation per each pixel of an image to be projected onto the retina 14, or alternatively, may be of a type that performs the wavefront curvature modulation per each frame of an image.

Modulating a wavefront results in the adjustment of depth perception of a displayed image, or the adjustment of a in-focus-position of a displayed image.

In any case, this wavefront-curvature modulating optical system 22 modulates the curvature of wavefront of an incoming laser beam, based on a depth signal inputted from the signal processing circuit 60. In this wavefront-curvature modulating optical system 22, a laser beam incoming from the collimating optical system 84 in the form of parallel light is transformed into converging light by means of a converging lens 90.

The converging light into which parallel light has been transformed is transformed into diverging light due to reflection of a movable mirror 92. The diverging light into which the converging light has been transformed passes through the converging lens 90, and leaves the wavefront-curvature modulating optical system 22 in the form of a laser beam having a desired curvature of wavefront.

As illustrated in FIG. 1, this wavefront-curvature modulating optical system 22 includes: a beam splitter 94 causing a laser beam entered from the outside to be reflected from or passed through the wavefront-curvature modulating optical system 22; the converging lens 90 to converge the laser beam entered thereinto through the beam splitter 94; and the movable mirror 92 to reflect the laser beam converged by the converging lens 90.

This wavefront-curvature modulating optical system 22 further includes an actuator 96 for causing the movable mirror 92 to be displaced in a direction allowing the movable mirror 92 to move toward or away from the converging lens 90. An example of the actuator 96 is a piezoelectric element. The actuator 96 moves the movable mirror 92 in response to a depth signal entered from the signal processing circuit 60, to thereby modulate the wavefront curvature of a laser beam emerging from the wavefront-curvature modulating optical system 22.

In the wavefront-curvature modulating optical system 22 constructed as described above, a laser beam entered from the collimating optical system 84 is reflected from the beam splitter 94 into the converging lens 90 and is then reflected from the movable mirror 92. Thereafter, the laser beam passes through the converging lens 90 again, and then passes through the beam splitter 94 to be directed to the scanning unit 24.

The scanning unit 24 includes a horizontal scanning system 100 and a vertical scanning system 102.

The horizontal scanning system 100 is an optical system for performing a horizontal scan in which a laser beam is scanned horizontally, per each frame of an image to be displayed. On the other hand, the vertical scanning system 102 is an optical system for performing a vertical scan in which a laser beam is scanned vertically, per each frame of an image to be displayed.

The horizontal scanning system 100 is configured to scan a laser beam at a higher scan rate, namely, a higher frequency than the vertical scanning system 102.

More specifically, in the present embodiment, the horizontal scanning system 100 includes an optical scanner 104 in which a resilient material incorporating a mirror for performing mechanical deflection is vibrated, to thereby angularly oscillate the mirror. The optical scanner 104 is controlled in response to a horizontal sync signal supplied from the signal processing circuit 60.

Figure 2:
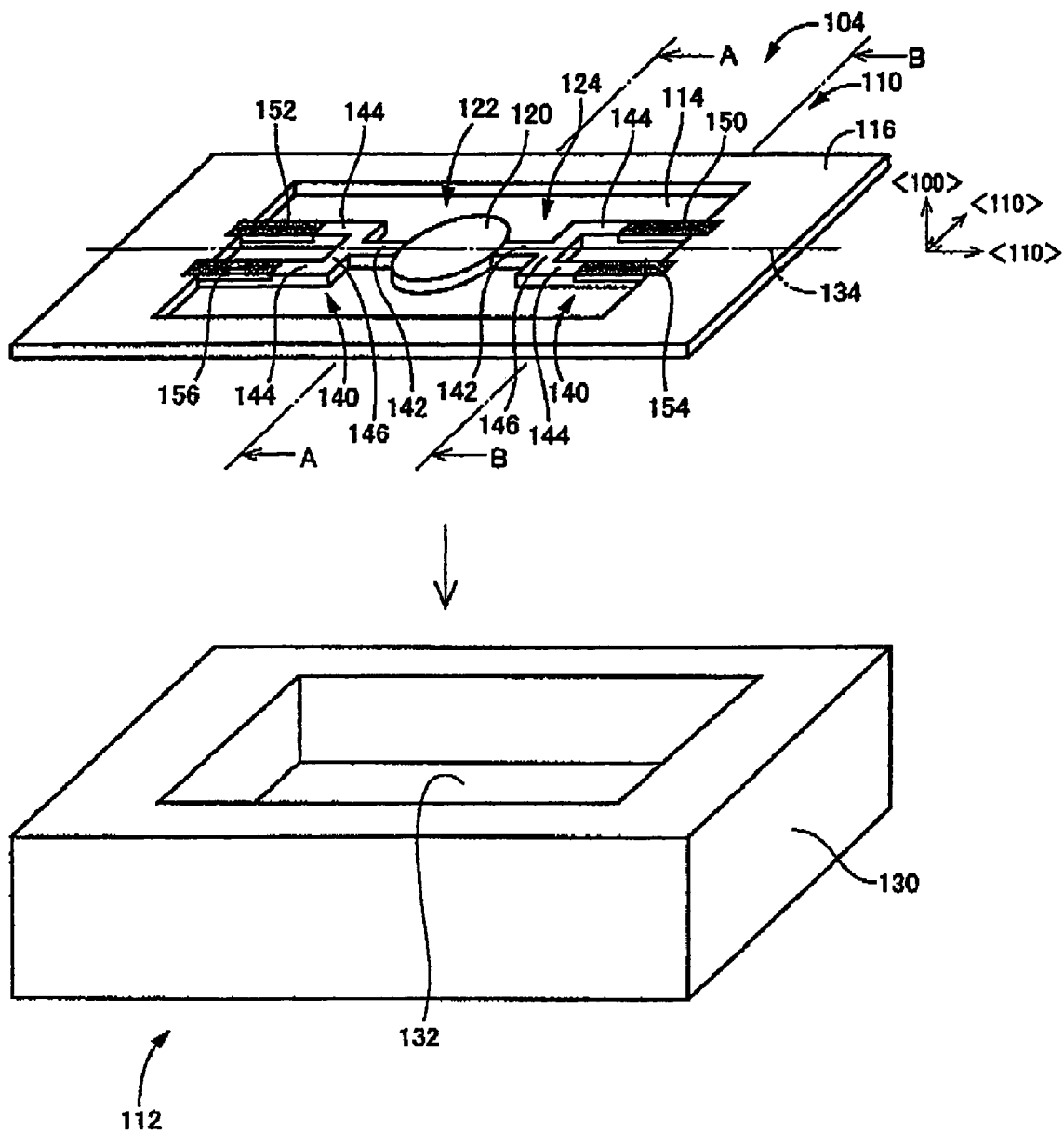
FIG. 2 is an exploded perspective view illustrating an optical scanner 104 depicted in FIG. 1.

Referring next to FIG. 2, the optical scanner 104 is illustrated in exploded perspective view. As illustrated in FIG. 2, the optical scanner 104 is constructed by mounting a body 110 onto a base 112.

The body 110 is formed with an elastic material such as silicon. As illustrated at the top of FIG. 2, the body 110 is generally in the shape of rectangle-shaped thin-plate with a light-transmissive through-hole 114. The body 110 includes at its outside a stationary frame 116, while the body 110 includes at its inside an oscillating body 124 having a reflective mirror 122 on which a reflective surface 120 is formed.

In comply with the construction of the body 110, as illustrated at the bottom of FIG. 2, the base 112 is constructed to include a support 130 on which the stationary frame 116 is to be mounted when the body 110 is mounted on the base 112, and a cavity 132 opposing to the oscillating body 124. The cavity 132 is formed to have a shape avoiding interference with the base 112 even when the oscillating body 124 is displaced due to vibration thereof, with the body 110 being mounted on the base 112.

As illustrated in FIG. 2, the reflective surface 120 of the reflective mirror 122 is oscillated about an oscillation axis 134, which is also a symmetry line of the reflective mirror 122. The oscillating body 124 further includes beams 140, 140 extending from the reflective mirror 122 in coplanar relation, for coupling the reflective mirror 122 to the stationary frame 116. In the present embodiment, a pair of beams 140, 140 oppositely extend from opposite ends of the reflective mirror 122, respectively.

Each of the beams 140 is so constructed as to include a single mirror-side leaf spring 142, a pair of frame-side leaf springs 144, 144, and a connection 146 for connecting the mirror-side leaf spring 142 to the pair of frame-side leaf springs 144, 144.

The mirror-side leaf springs 142 extend on and along the oscillation axis 134, from both ends of the reflective mirror 122 opposing to each other in a direction of the oscillation axis 134, respectively, up to the corresponding respective connections 146, 146.

For each beam 140, the corresponding pair of frame-side leaf springs 144 extend from the corresponding connection 146 along the oscillation axis 134 so as to be offset from the oscillation axis 134 in opposite directions.

As illustrated in FIG. 2, for the respective beams 140, 140, actuators 150, 152, 154, and 156 are secured to the pairs of frame-side leaf springs 144 and 144, with the actuators 150, 152, 154, and 156 extending to the stationary frame 116.

Figure 3:
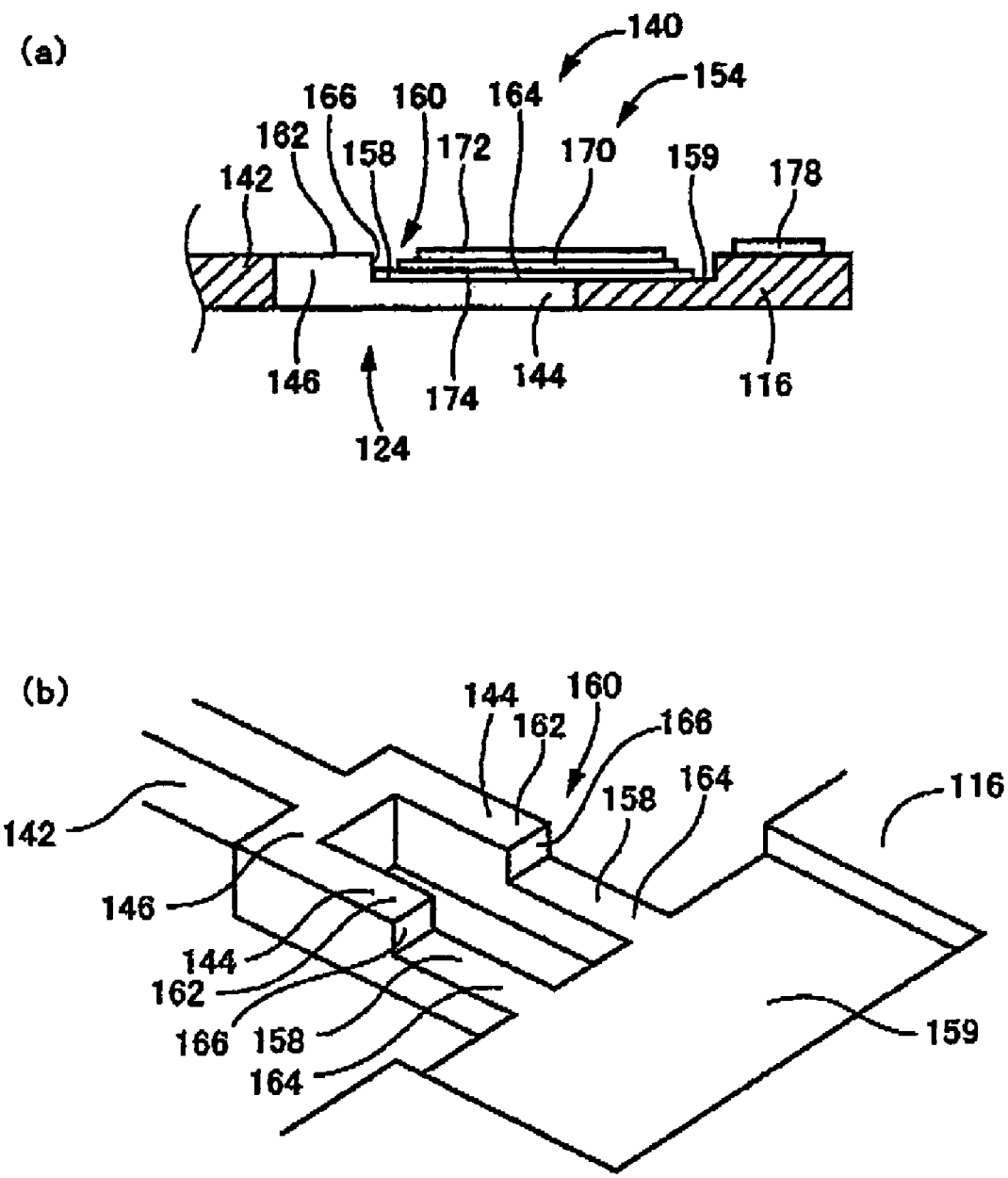
FIGS. 3(a) and 3(b) are a sectional side view and a perspective view illustrating an actuator 154 depicted in FIG. 2 and its neighborhood, respectively.

As illustrated in FIG. 3, each frame-side leaf spring 144 is locally thinned on its proximal side to the stationary frame 116, resulting in formation of a recess 158. A recess 159 is formed at the stationary frame 116 to achieve surface continuity between the recesses 158 and 159. Utilization of these recesses 158 and 159 allows each actuator 150, 152, 154, 156 to be disposed such that each actuator 150, 152, 154, 156 extends between the corresponding frame-side leaf spring 144 and the stationary frame 116.

Each actuator 150, 152, 154, 156 is constructed principally by a piezoelectric material 170 (referred to also as "piezoelectric vibrator" or "piezoelectric element"). The actuator 154 is illustrated representatively in FIG. 3. The piezoelectric material 170, which is thin-plate-shaped, is attached to the oscillating body 124 at its one side face and is interposed between an upper electrode 172 and a lower electrode 174 in a direction perpendicular to the one side face.

As illustrated in FIG. 3, the upper and lower electrodes 172 and 174 are electrically connected to a pair of input terminals 178 and 178, respectively, which are mounted on the stationary frame 116, via respective lead wires (not shown).

Alternatively, the present invention may be carried out in a mode in which the upper and lower electrodes 172 and 174 are electrically connected to an external terminal (not shown), respectively, via respective lead wires (not shown).

Figure 4:
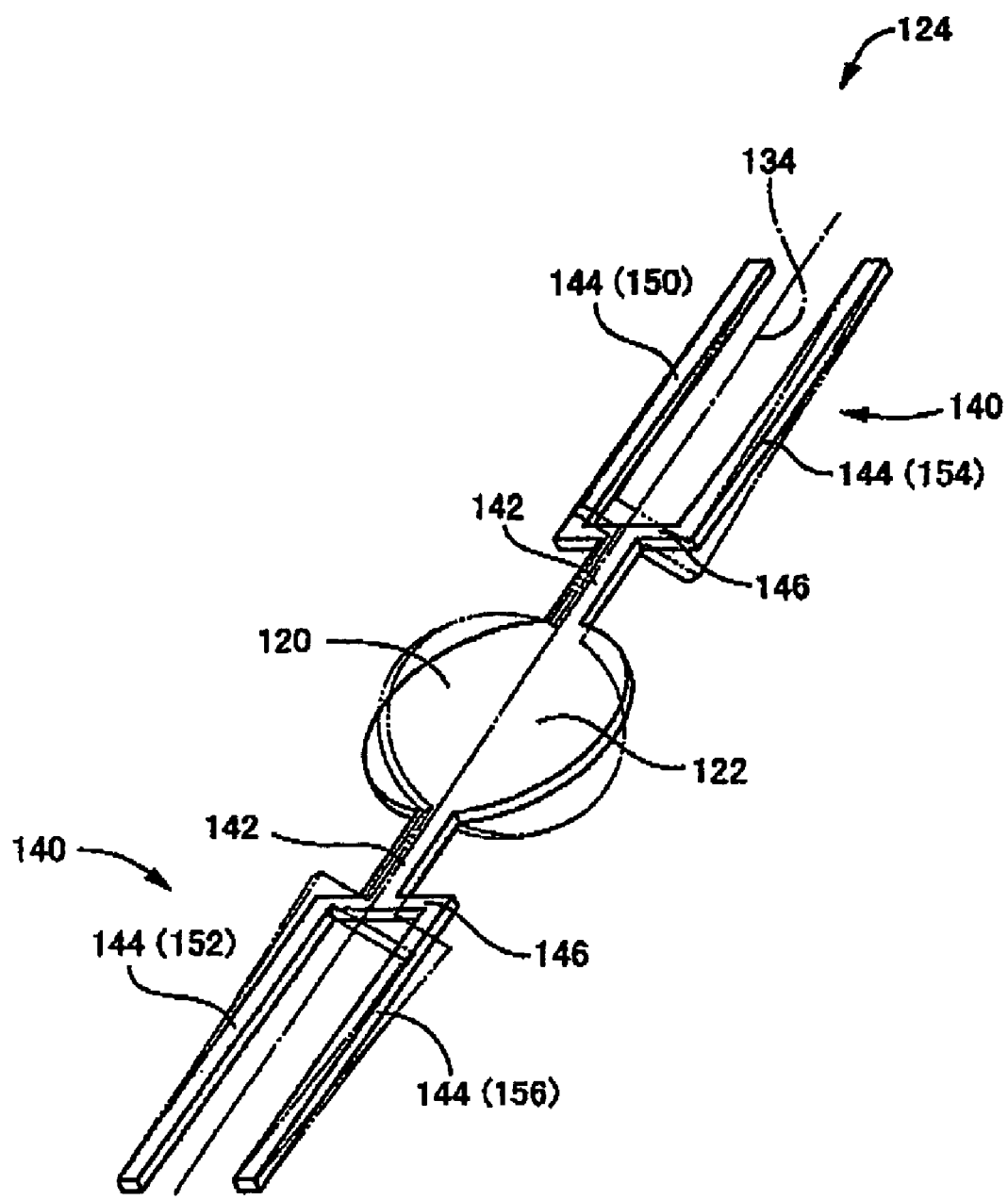
FIG. 4 is a perspective view illustrating an oscillating body 124 depicted in FIG. 2.

Application of a voltage to these upper and lower electrodes 172 and 174 causes the piezoelectric material 170 to be displaced in a direction perpendicular to a direction in which the voltage has been applied. The displacement causes the beams 140 to bend or curve, as illustrated in FIG. 4. The bending occurs in a manner that a portion of the beam 140 which is coupled to the stationary frame 116 acts as a fixed end, while a portion of the beam 140 which is coupled to the reflective mirror 122 acts as a free end.

As a result, whether the free end is displaced upwardly or downwardly depends on whether the beams 140, 140 bend upwardly or downwardly.

As will be evident from FIG. 4, among the four actuators 150, 152, 154, and 156 attached onto the respective four frame-side leaf springs 144, a pair of actuators 150 and 152 are positioned on one of sides opposite to each other with respect to the oscillation axis 134, with the reflective mirror 122 being interposed between the actuators 150 and 152.

A pair of actuators 154 and 156 which are positioned on the other side, with the reflective mirror 122 being interposed between the actuators 154 and 156, individually bend in a manner that two of the piezoelectric materials 170 which belong to each of the pair of actuators 150 and 152 and the pair of actuators 154 and 156 are displaced in the same direction at their free ends.

On the other hand, a pair of actuators 150 and 154 are positioned on one of sides opposite to each other with respect to the reflective mirror 122, with the oscillation axis 134 being interposed between the actuators 150 and 154.

A pair of actuators 152 and 156 which are positioned on the other side, with the oscillation axis 134 being interposed between the actuators 152 and 156, individually bend in a manner that two of the piezoelectric materials 170 which belong to each of the pair of actuators 150 and 154 and the pair of actuators 152 and 156 are displaced in opposite directions at their free ends.

As a result, as illustrated in FIG. 4, unidirectional rotational displacement of the reflective mirror 122 is excited by both the displacement in one direction of the pair of actuators 150 and 152 positioned on one of sides opposite to each other with respect to the oscillation axis 134, and the displacement of the pair of actuators 154 and 156 positioned on the other side in a reverse direction of the displacement of the actuators 150 and 152.

To summarize the above, each frame-side leaf spring 144 has the function of transforming the rectilinear displacement (lateral displacement) of the piezoelectric material 170 attached onto each frame-side leaf spring 144 into a bending movement (vertical displacement). Each connection 146 has the function of transforming the bending movement of the corresponding frame-side leaf springs 144 into a rotary movement of the corresponding mirror-side leaf spring 142. The rotary movement of the mirror-side leaf spring 142 causes a rotation of the reflective mirror 122.

Therefore, in the present embodiment, for the control of the four actuators 150, 152, 154, and 156, two actuators 150 and 152 which are positioned on one of sides opposite to each other with respect to the oscillation axis 134, which is to say, the actuator 150 positioned at the upper right of FIG. 2 and the actuator 152 positioned at the upper left of FIG. 2, constitute a first pair, while two actuators 154 and 156 which are positioned on the other side, which is to say, the actuator 154 positioned at the lower right of FIG. 2 and the actuator 156 positioned at the lower left of FIG. 2, constitute a second pair.

In the present embodiment, for displacing the two actuators 150 and 152 forming the first pair and the two actuators 154 and 156 forming the second pair in opposite directions to thereby excite reciprocal rotation or angular oscillation of the reflective mirror 122 about its oscillation axis 134, alternating voltages identical in phase to each other are applied to the two actuators 150 and 152 forming the first pair, while alternating voltages identical in phase to each other but opposite in phase to the alternating voltages for the first pair, are applied to the two actuators 154 and 156 forming the second pair.

As a result, where both of the two actuators 150 and 152 forming the first pair bend downwardly in FIG. 4, both of the two actuators 154 and 156 forming the second pair bend upwardly in FIG. 4.

Figure 5:
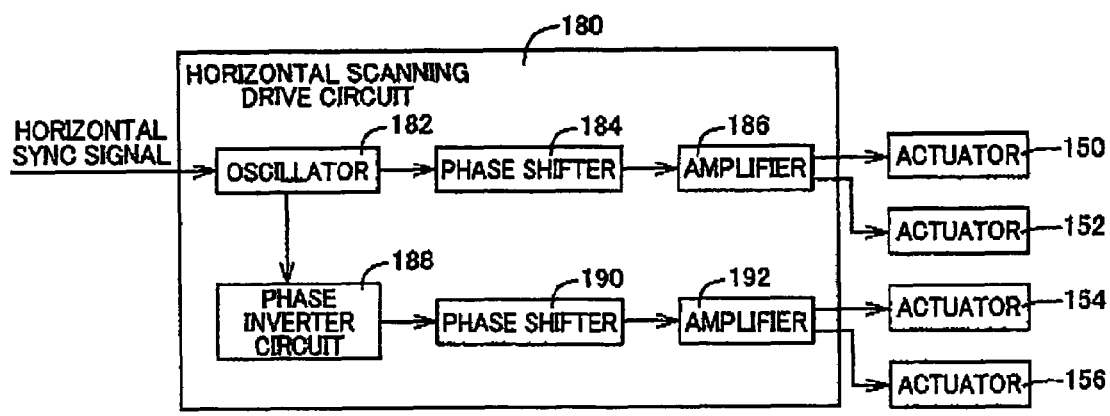
FIG. 5 is a block diagram illustrating a horizontal scanning drive circuit 180 depicted in FIG. 1.

For achieving the control described above, the horizontal scanning system 100 includes a horizontal scanning drive circuit 180 depicted in FIG. 1. As illustrated in FIG. 5, in this horizontal scanning drive circuit 180, an oscillator 182 generates an alternating voltage signal in response to a horizontal sync signal entered from the signal processing circuit 60.

The oscillator 182 is electrically coupled to the two actuators 150 and 152 forming the first pair via a first path through a phase shifter 184 and an amplifier 186, while the oscillator 182 is electrically coupled to two actuators 154 and 156 forming the second pair via a second path through a phase inverter circuit 188, a phase shifter 190, and an amplifier 192.

The phase inverter circuit 188 inverts the phase of an alternating voltage signal entered from the oscillator 182 and supplies to the phase shifter 190 the alternating voltage signal which has been inverted in phase.

This phase inverter circuit 188 is provided only to the second path. Therefore, the alternating voltage signals supplied from the corresponding respective amplifiers 186 and 192 become opposite in phase to each other between the two actuators 150 and 152 forming the first pair and the two actuators 154 and 156 forming the second pair.

With both the first and second paths, the respective phase shifters 184 and 190 are provided for alternating the phase of an alternating voltage signal to be supplied to the actuators 150, 152, 154, and 156 to establish synchronization between the aforementioned video signal and the oscillation of the reflective mirror 122.

Figure 6:
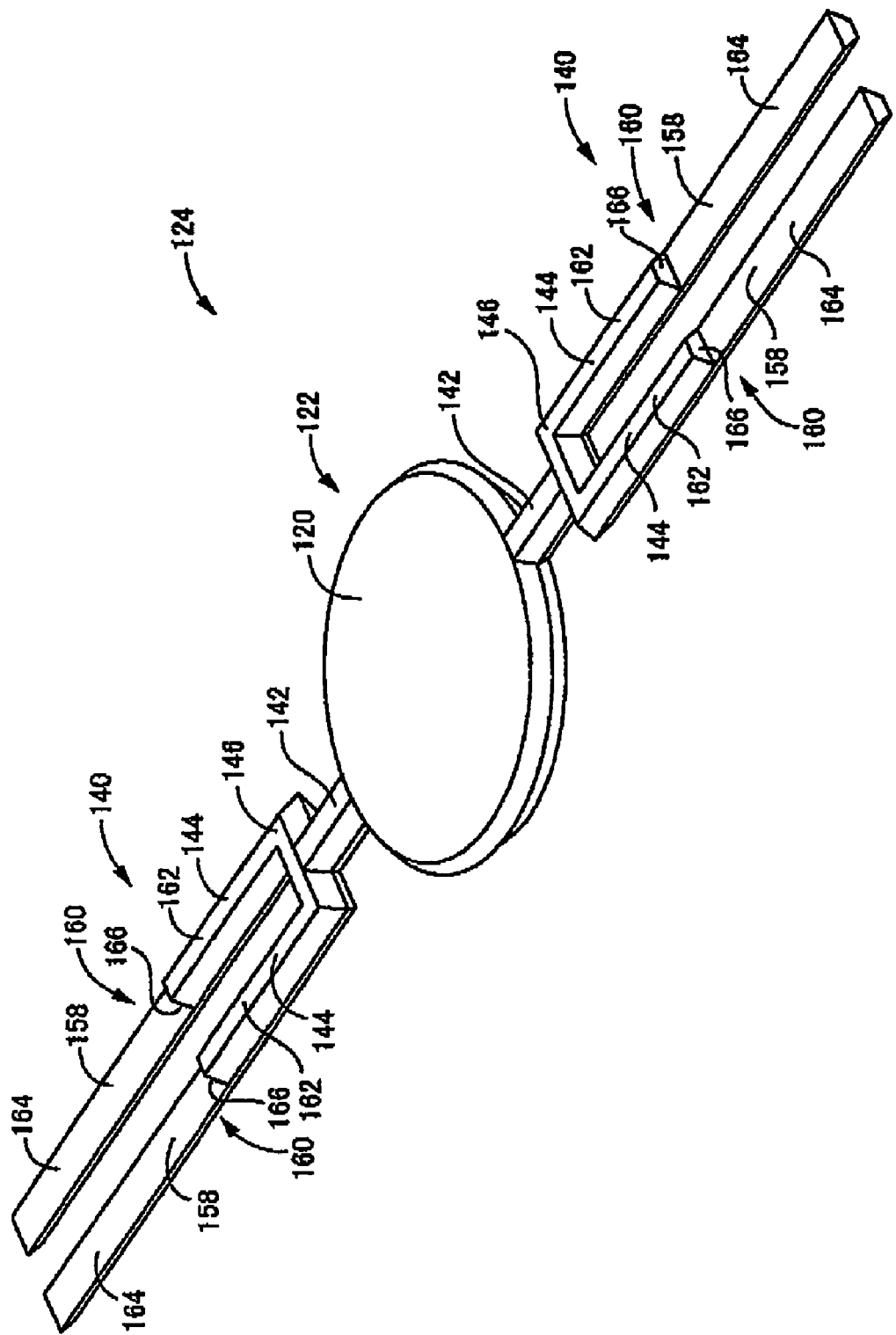
FIG. 6 is a perspective view illustrating a specific shape of the oscillating body 124 depicted in FIG. 2.

In FIG. 6, there is illustrated in perspective view a specific shape of the oscillating body 124. In this oscillating body 124, the reflective mirror 122 is fabricated so as to have a silhouette generally in the shape of a circle when viewed in a direction normal to the reflective surface 120. This reflective mirror 122 constitutes an example of the "reflective mirror" set forth in the above mode (15).

In the present embodiment, the reflective mirror 122 has a diameter of 1 mm and a thickness of 100 μm, while each beam 140 has a length of 2 mm. The method of fabricating the reflective mirror 122 will be described below in more detail.

Figure 7:
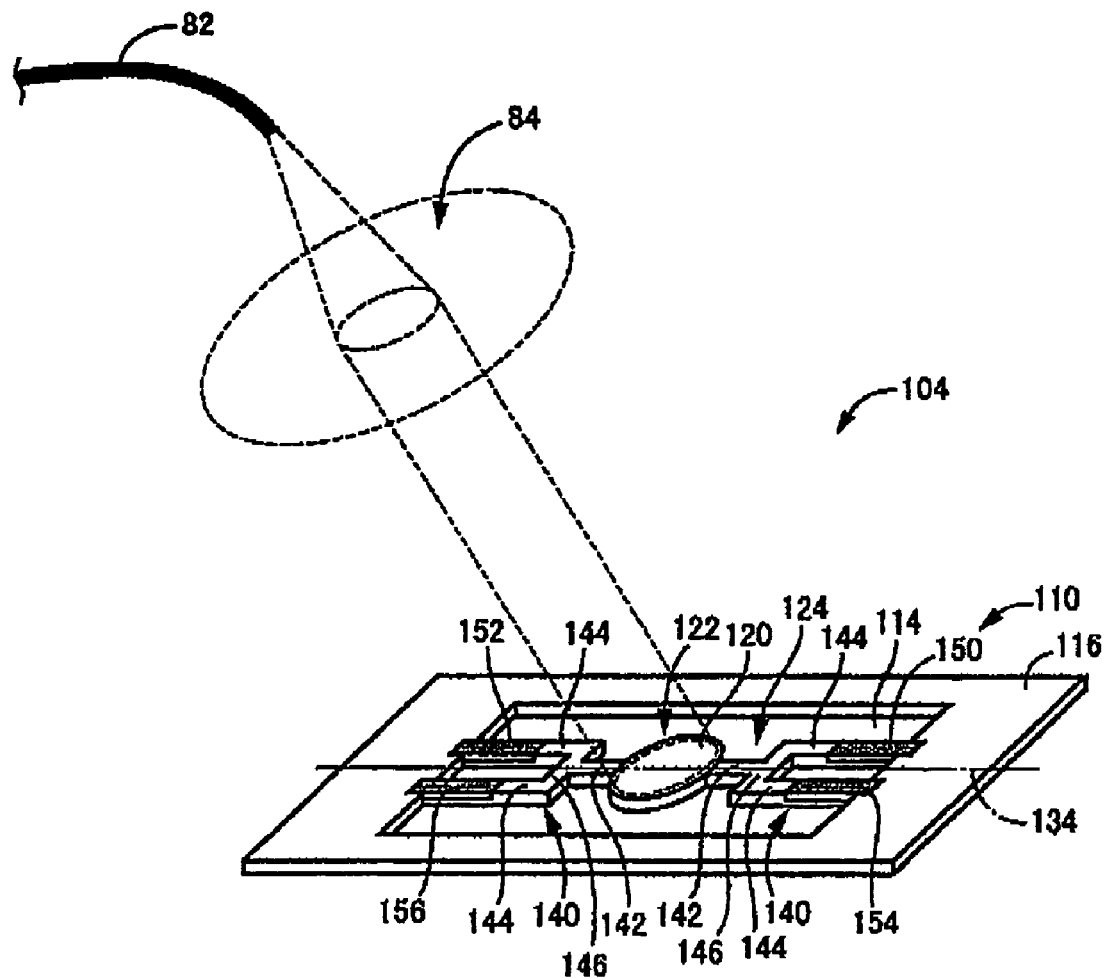
FIG. 7 is a perspective view for explaining how light enters a circle-shaped reflective mirror 122 of the oscillating body 124 depicted in FIG. 2.

In FIG. 7, there is illustrated in perspective view how light emerged from the optical fiber 82 enters this optical scanner 104 through the collimating optical system 84.

The light emerged from the collimating optical system 84 enters the reflective surface 120 of the reflective mirror 122, wherein the reflective surface 120 is generally in the shape of circle. The reflective mirror 122 is angularly oscillated about the oscillation axis 134, resulting in the reflected light from the reflective surface 120 being horizontally scanned.

Figure 8:
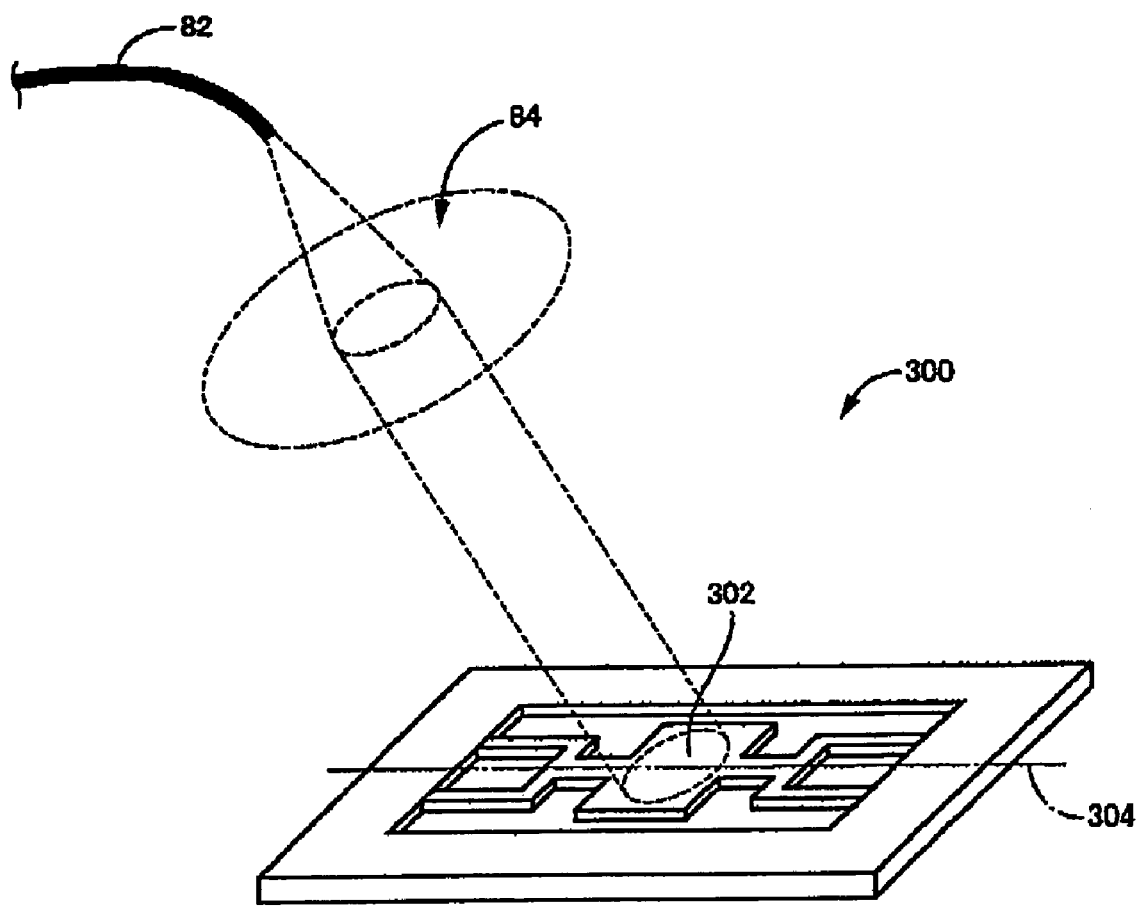
FIG. 8 is a perspective view for explaining how light enters a quadrangle-shaped reflective mirror 302 of an oscillating body which is a comparative example of the oscillating body 124 depicted in FIG. 2.

In FIG. 8, there is illustrated in perspective view how light emerged from the optical fiber 82 enters a conventional optical scanner 300 through the collimating optical system 84. In this optical scanner 300, a reflective mirror 302 is in the shape of a quadrangle.

When comparing the weight of the reflective mirror 302 and the weight of the reflective mirror 122 of the present embodiment with each other, assuming that these mirrors 302 and 122 are identical to each other in material density, thickness, and maximum width dimension, the reflective mirror 122 of the present embodiment is smaller in weight than the counterpart.

Therefore, when comparing the moment of inertia of the reflective mirror 122 of the present embodiment about the oscillation axis 134 and the moment of inertia of the reflective mirror 302 about its oscillation axis 304 with each other, the reflective mirror 122 of the present embodiment is smaller in moment of inertia than the counterpart.

As a result, where the reflective mirror 122 of the present embodiment and the conventional reflective mirror 302 are each adapted to scan light using its own resonance, the reflective mirror 122 of the present embodiment is more suitable than the conventional reflective mirror 302 in an attempt to increase a resonant frequency for increasing a scan frequency.

As illustrated in FIG. 1, a laser beam scanned horizontally by the optical scanner 104 described above is relayed to the vertical scanning system 102 through a relay optical system 194.

This RSD is provided with a beam detector 200 at a fixed position for detecting a laser beam which has been deflected by the optical scanner 104, to thereby detect the position of the scanned laser beam in a main scan direction (i.e., horizontal scan direction). An example of the beam detector 200 may be a photodiode.

The beam detector 200 outputs a BD signal indicating that a laser beam has reached a predetermined position. The outputted BD signal is delivered to the signal processing circuit 60.

In response to the delivery of the BD signal from the beam detector 200, the signal processing circuit 60 applies needed drive signals to the respective laser drivers 70, 72, and 74, upon elapse of a predetermined length of time since the beam detector 200 detected the laser beam.

This allows a start-of-image-displaying timing to be determined per each scan line, and with the determined timing, displaying of an image starts. This ensures synchronization between an image signal and a laser beam scan position.

While the horizontal scanning system 100 has been described above, the vertical scanning system 102 includes a galvanometer mirror 210 as an example of an angularly-oscillating mirror performing mechanical deflection, as illustrated in FIG. 1.

The galvanometer mirror 210 is adapted such that a laser beam emerged from the horizontal scanning system 100, upon focused by the relay optical system 194, enters the galvanometer mirror 210. The galvanometer mirror 210 is oscillated about an axis of rotation crossing the optical axis of the laser beam entering the galvanometer mirror 210. The start-up timing and the rotational speed of the galvanometer mirror 210 are controlled in response to a vertical sync signal supplied from the signal processing circuit 60.

It is added that this vertical scanning system 102, although is constructed principally using the galvanometer mirror 210, may be constructed in an alternative arrangement.

The horizontal scanning system 100 and the vertical scanning system 102 both described above cooperate to scan a laser beam two-dimensionally. An image represented by the scanned laser beam impinges on the viewer's eye 10 via a relay optical system 214.

Figure 9:
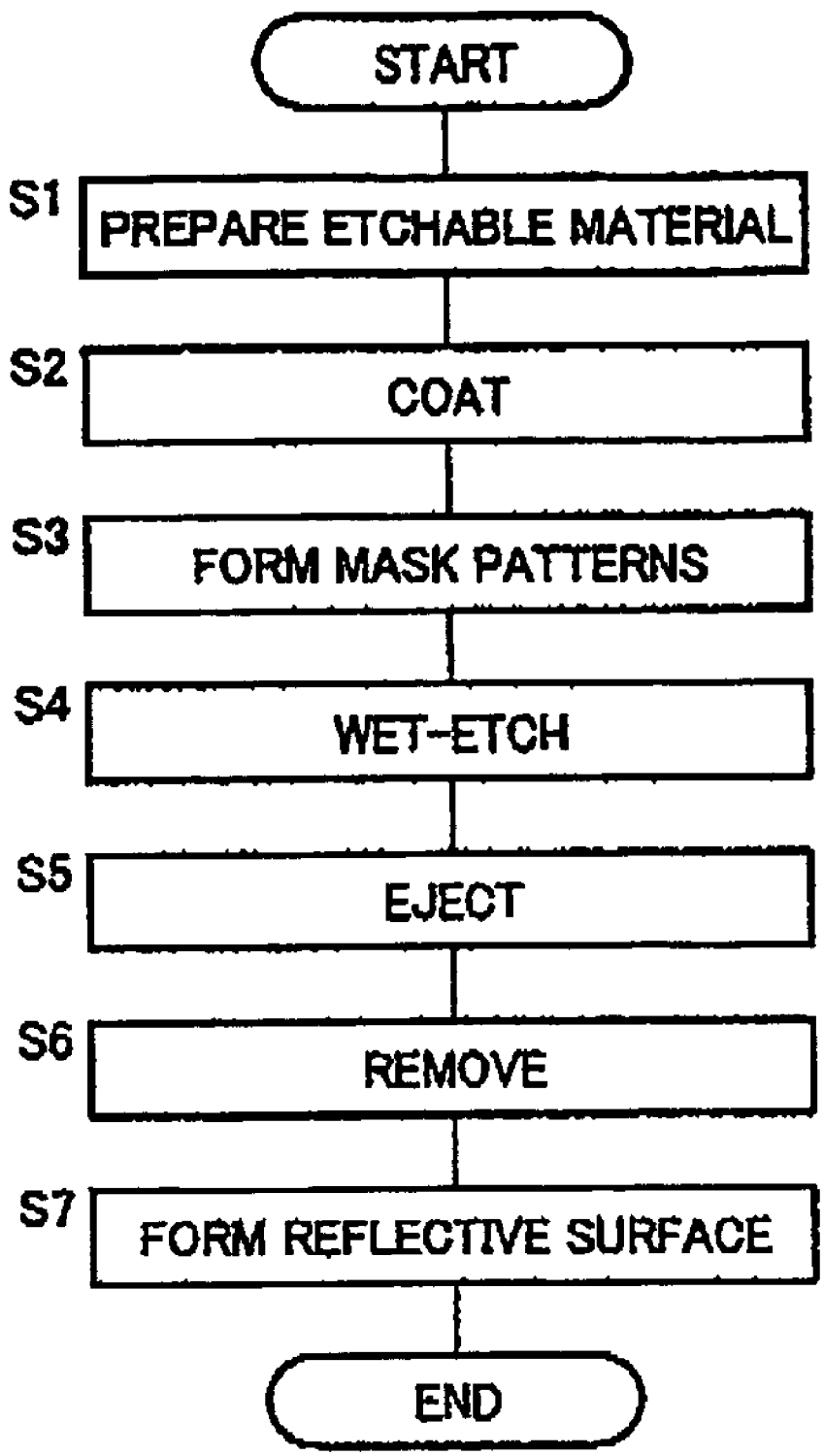
FIG. 9 is a process chart illustrating the aforementioned reflective-mirror fabricating method.

Now, there will be described the fabricating method of the reflective mirror 122 in more detail with reference to a process chart of FIG. 9.

Figure 11:
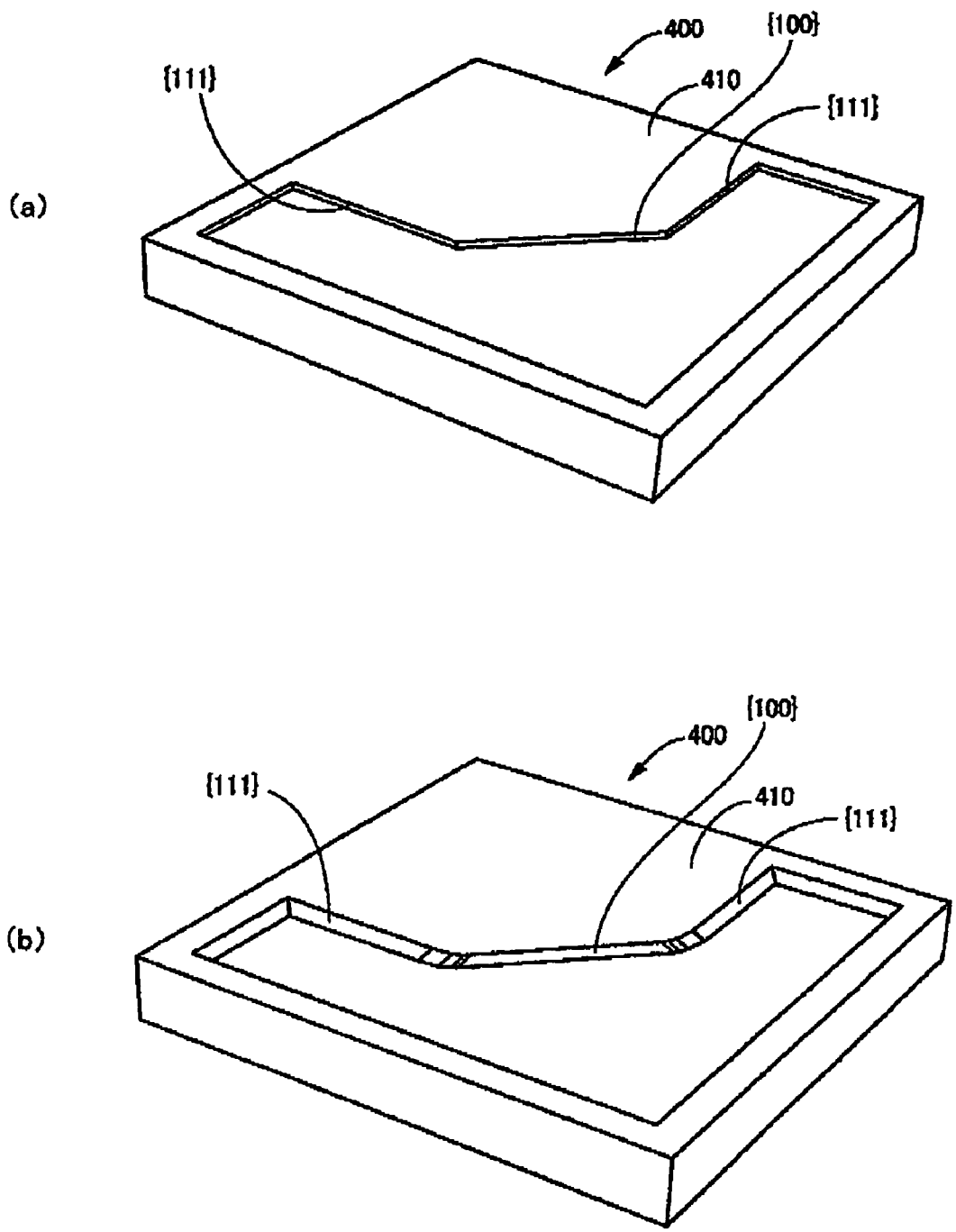
FIGS. 11(a) and 11(b) are perspective views for explaining step by step the progression of wet-etching performed in a step S4 depicted in FIG. 9.

This fabrication method begins with a step S1 to prepare a plate-shaped material (a silicon wafer) which is made of a single crystal silicon and which has a thickness of 100 μm for the material to be used as an etchable material 400 (see FIG. 11). The single crystal silicon is initially exposed at some of {100} crystallographic planes of the single crystal silicon. That is to say, the single crystal silicon has an initial exposed {100} surface.

The step S1 is followed by a step S2 to coat opposite faces of the etchable material 400 with etching masks 410 (see FIG.

11). The etching masks 410 are, for example, silicon oxide coatings formed on the opposite faces of the etchable material 400 as a result of heating the etchable material 400. That is to say, the step S2 constitutes a coating step.

The step S2 is followed by a step S3 to form predetermined mask patterns by a lithographic technique on the respective etching masks 410 which have been deposited on the opposite faces of the etchable material 400.

The shape of each mask pattern formed on each etching mask 410 determines the shape of a portion of the etchable material 400 which will start being contacted with and then being etched by an etchant held in an etching bath (not shown) when the etchable material 400 is immersed in the etching bath. That is to say, the step S3 constitutes a mask-pattern forming step.

Figure 10:
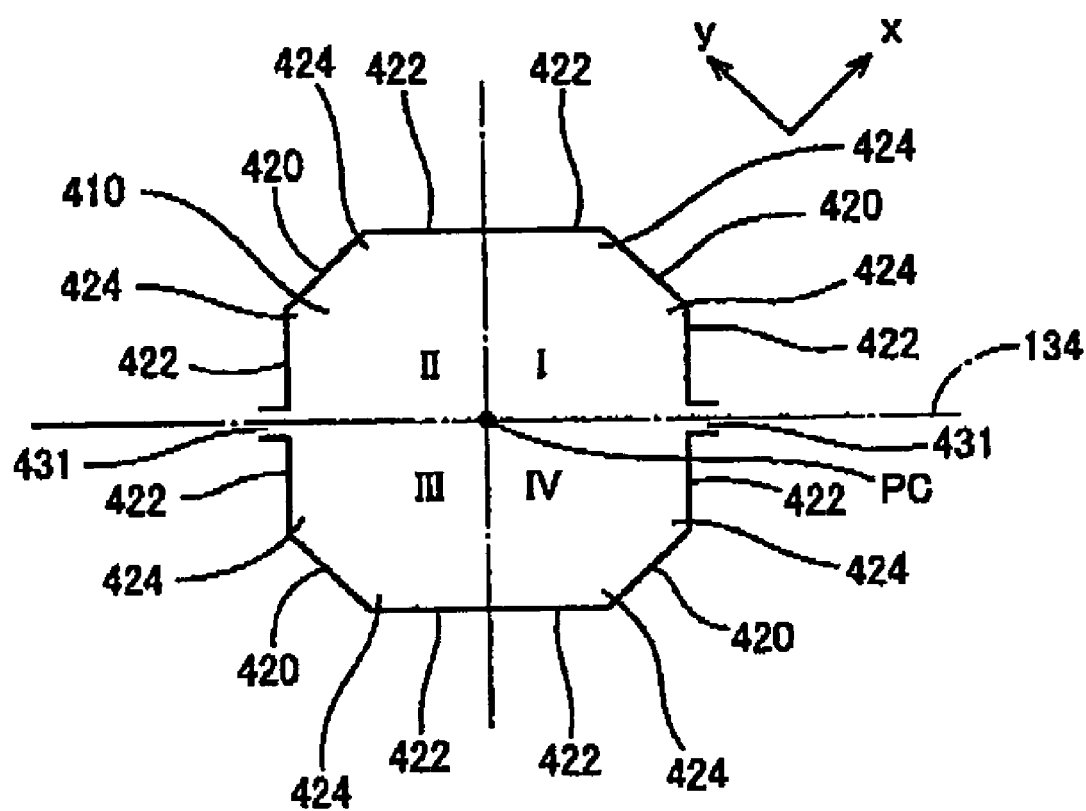
FIG. 10 is a top plan view illustrating a mask pattern formed in a step S3 depicted in FIG. 9.

In FIG. 10, an example of each mask pattern is illustrated in top plan view.

Figure 13:
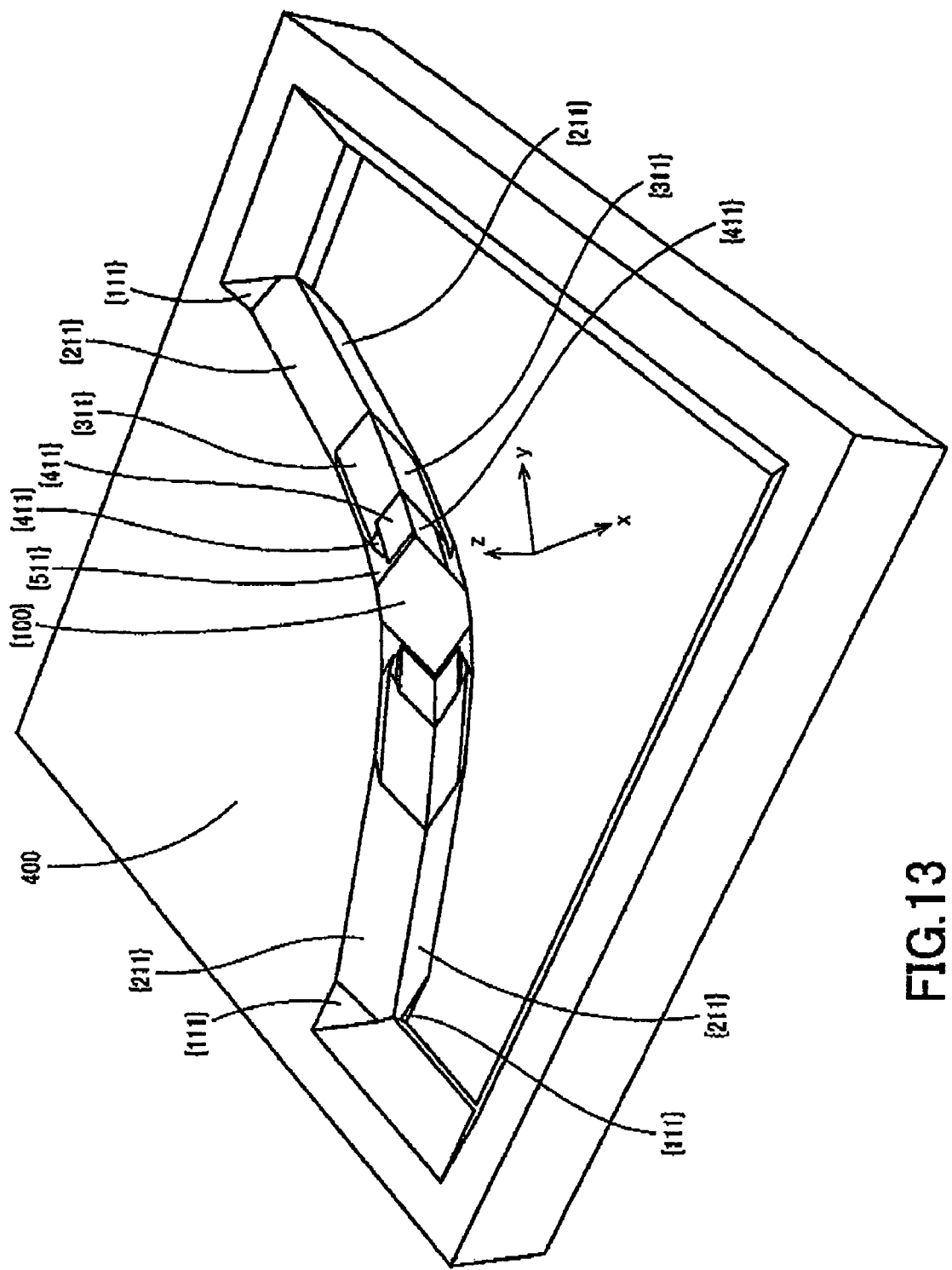
FIG. 13 is a perspective view illustrating in enlargement an etchable material 400 depicted in FIG. 12(b)

In the present embodiment, for convenience of explanation of ultimately-exposed crystallographic planes of the etchable material 400, a surface of the etchable material 400 is conceptually divided into four equal regions I, II, III, and IV around a center point PC (Point of Center) of the surface of the etchable material 400, by relying on symmetric ultimate-shape of the etchable material 400, as illustrated in FIG. 10. In FIG. 13, one of the four regions I, II, III, and IV is representatively illustrated.

In the present embodiment, as illustrated in FIG. 10, each mask pattern includes first sides each parallel to the oscillation axis 134, and second sides each perpendicular to the oscillation axis 134. The oscillation axis 134 constitutes an example of the "reference line" set forth in the aforementioned mode (6).

Each mask pattern is located relative to the etchable material 400 depicted in FIG. 11, such that each of the first and second sides is perpendicular to a selected one of <110> crystallographic directions of the etchable material 400 on a selected one of {100} crystallographic planes of the etchable material 400.

In FIG. 10, the selected {100} crystallographic plane, which is the aforementioned initial exposed {100} surface, is parallel to the sheet of FIG. 10.

In the present embodiment, as illustrated in FIG. 10, the first sides correspond to ones of a plurality of second portions 422 described below which extend parallel to the oscillation axis 134, wherein the ones extend horizontally in FIG. 10. On the other hand, the second sides correspond to ones of the plurality of second portions 422 which extend perpendicular to the oscillation axis 134, wherein the ones extend vertically in FIG. 10.

For defining the shape of this mask pattern, for convenience of explanation, the etchable material 400 is divided into the four regions I, II, III, and IV by two center lines of symmetry orthogonally intersecting each other at the center point of the mask pattern. One of the center lines is the oscillation axis 134, and the other is a straight line orthogonally intersecting the oscillation axis 134 at the center point PC.

In the present embodiment, as illustrated in FIG. 10, each mask pattern further includes, at its both ends opposite to each other in the direction of the oscillation axis 134, extensions 431 and 431 which each extend outwardly of each mask pattern along the oscillation axis 134. The extensions 431 and 431 are provided to the mask pattern for allowing the beams 140 and 140 illustrated in FIG. 4 to be fabricated together with the reflective mirror 122 by a wet-etching technique.

Referring now to FIG. 13, there will be described the relationship between the orientation of each of the four regions (i.e., quarter regions) I, II, III, and IV, and the orientation of an x-y-z coordinate system assigned to the etchable material 400 for defining a plurality of crystallographic planes of the etchable material 400 made of a single crystal material.

The orientation of each quarter region and the orientation of the x-y-z coordinate system are defined, such that a bisecting line of a central angle of the quarter region of interest coincides with an x-axis of the x-y-z coordinate system. For the example illustrated in FIG. 13, the central angle is one of four corners of a quadrangle which is located uppermost in FIG. 13, wherein the quadrangle is the shape of the quarter region of interest.

That is to say, the etchable material 400 is quartered such that a normal to a selected one of the {100} crystallographic planes of each region coincides with the bisecting line of the central angle of each quarter region. For the example illustrated in FIG. 13, the selected {100} crystallographic plane is denoted by "{100}" in FIG. 13.

In FIG. 10, the aforementioned x-y-z coordinate system is illustrated not with the etching mask 410 but with the etchable material 400. In FIG. 10, the mask pattern is divided into four equal regions I, II, III, and IV which are located on the surface of the etchable material 400 and around the center point PC of the surface of the etchable material 400. Although the x-y-z coordinate system is assigned to each region, FIG. 10 illustrates the assignment only for a representative region I.

As illustrated in FIG. 10, the mask pattern is in the shape of a convex octagon. More specifically, an outline of the mask pattern includes, per each region, a first portion 420 corresponding to one of {100} crystallographic planes of the etchable material 400 which is different from the aforementioned {100} crystallographic plane (i.e., the initial exposed {100} surface).

The outline of the mask pattern further includes second portions 422 each corresponding to one of {111} crystallographic planes of the etchable material 400. The {111} crystallographic planes includes a specific (111) crystallographic plane and its equivalent crystallographic planes. The second portions 422 are located at opposite ends of the first portion 420, respectively.

The mask patterns, each of which has the shape described above, are formed on the opposite faces of the etchable material 400 without misregistration. Thereafter, as illustrated in FIG. 9, in a step S4, a laminate of the etchable material 400 and the etching masks 410 is immersed in the etching bath containing the etchant.

In the present embodiment, the etchant is prepared to include a Potassium Hydroxide (KOH) solution with a preset concentration of 40 wt. % and a preset temperature of 70.degree. C. Under this condition, the etchable material 400 is wet-etched. That is to say, the step S4 constitutes a wet-etching step.

It is added that the etchant may be alternatively prepared to include a Tetramethyl Ammonium Hydroxide (TMAH) solution, although in this alternative the shape of a corresponding mask pattern will be modified from that illustrated in FIG. 10.

In FIGS. 11(a), 11(b), 12(a), and 12(b), how the etchable material 400 is wet-etched is illustrated step by step. In each figure, however, only one of the aforementioned four regions I, II, III, and IV is representatively illustrated by virtue of the symmetry of the etchable material 400.

In FIG. 11(a), the wet-etching of the etchable material 400 starts at portions of the etchable material 400 which have been un-coated with the etching masks 410. In this stage, the etchable material 400 is wet-etched to expose only some of the {100} crystallographic planes (which are different from the aforementioned initial exposed {100} surface) and some of {111} crystallographic planes.

As illustrated in FIG. 11(b), when the wet-etching of the etchable material 400 progresses slightly from the stage illustrated in FIG. 11(a), the etchable material 400 starts exposing additional crystallographic planes at portions between the firstly-exposed {100} and {111} planes, which is to say, the corners of an octagon exhibited by the etching mask 410 in the stage illustrated in FIG. 11(a). As a result, the corners of the etchable material 400 are rounded relative to their original corners.

Figure 12:
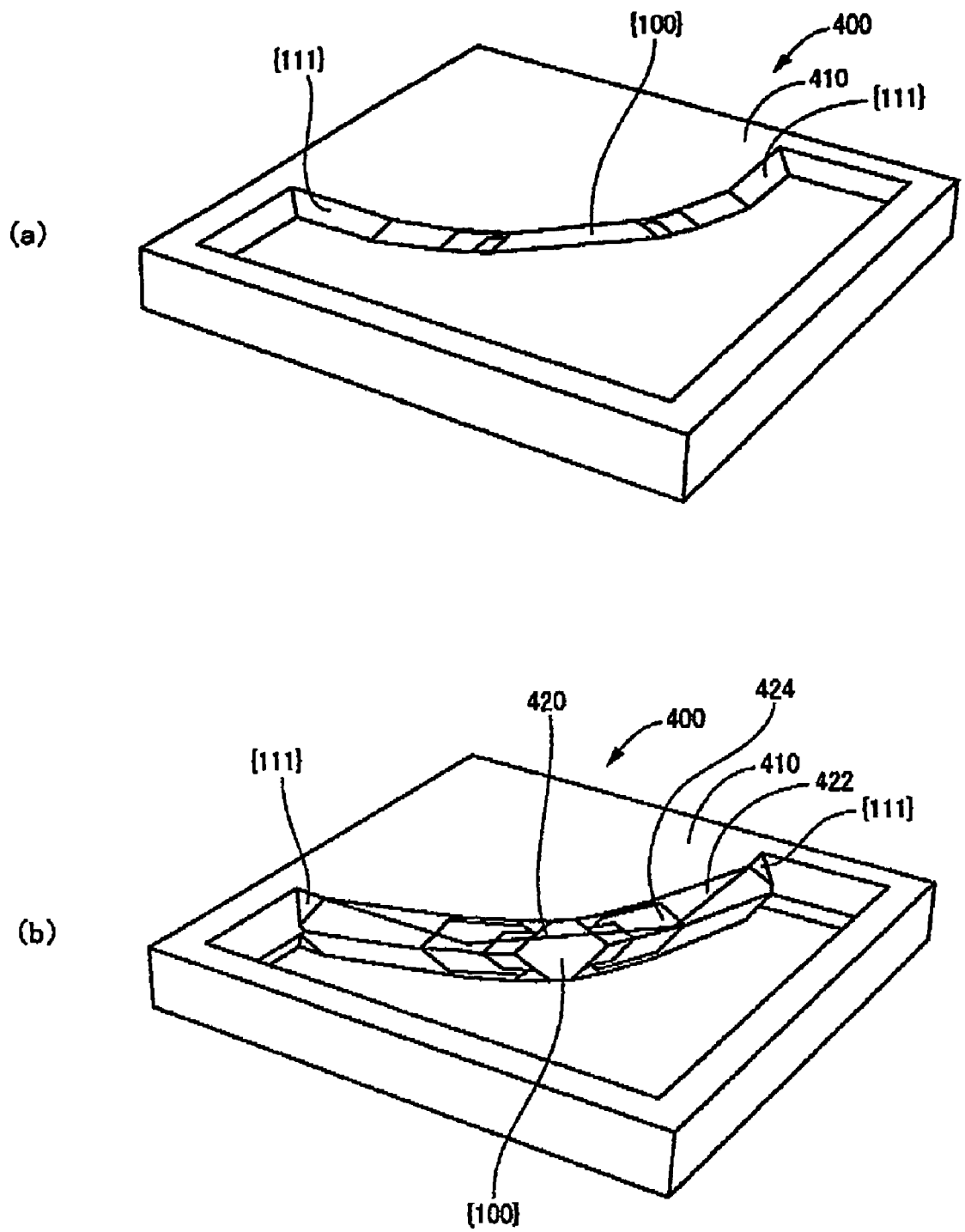
FIGS. 12(a) and 12(b) are additional perspective views for explaining step by step the progression of the wet-etching performed in the step S4 depicted in FIG. 9.

As illustrated in FIG. 12(a), when the wet-etching of the etchable material 400 progresses slightly from the stage illustrated in FIG. 11(b), the crystallographic planes previously created between the {100} and {111} planes in the stage illustrated in FIG. 11(b) grow, and the etchable material 400 starts exposing still additional crystallographic planes. As a result, the corners of the etchable material 400 are rounded relative to their original corners.

As illustrated in FIG. 12(b), when the wet-etching of the etchable material 400 progresses slightly from the stage illustrated in FIG. 12(a), the crystallographic planes previously created between the {100} and {111} planes in the stage illustrated in FIG. 12(a) grow, and the etchable material 400 starts exposing yet additional crystallographic planes. As a result, the corners of the etchable material 400 are further rounded relative to their original corners.

The stage illustrated in FIG. 12(b) is an ultimate stage of the wet-etching in which the etchable material 400 has been partially penetrated in its thickness-wise direction because of the etchant. In FIG. 12(b), the ultimate shape of the etchable material 400 is illustrated with the mask pattern.

In FIG. 13, the etchable material 400 depicted in FIG. 12(b) is illustrated in enlargement. Upon completion of the wet-etching of the etchable material 400, there are exposed between the {100} and {111} crystallographic planes a plurality of additional crystallographic planes including {211}, {311}, {411}, and {511} crystallographic planes.

These {211}, {311}, {411}, and {511} crystallographic planes are defined to include specific crystallographic planes specified by a string of figures in parenthesis and their equivalent crystallographic planes, as with the {111} crystallographic planes.

That is to say, in the present embodiment, as illustrated in FIG. 10, the etching mask 410 includes third portions 424 corresponding to {n11} (n: an integer equal to or greater than two) crystallographic planes disposed between the first portions 420 and the second portions 422.

The reflective mirror 122 fabricated by the wet-etching technique described above has a silhouette generally in the shape of a convex octagon as viewed in a direction normal to the reflective surface 120 of the reflective mirror 122. More precisely, the silhouette is in the shape of an m-sided polygon (m: an integer greater than sixteen).

In FIG. 14(a), a completed reflective mirror 122 is illustrated in a vertical sectional-view taken on a plane passing through some of the {100} crystallographic planes.

In FIG. 14(b), the completed reflective mirror 122 is illustrated in a vertical sectional-view taken on a plane passing through some of the {111} crystallographic planes.

In FIG. 14(c), a comparative example of the reflective mirror 122 is illustrated in a vertical sectional-view. The comparative example is a reflective mirror 122' which has been fabricated by wet-etching an etchable material 400' only from one of opposite faces of the etchable material 400'. The vertical sectional-view is taken on a plane passing through some of the {111} crystallographic planes of the etchable material 400'.

As illustrated in FIG. 14(b), in the present embodiment, the etchable material 400 is wet-etched from its opposite faces, to thereby form at lateral faces of the etchable material 400, discontinuous inclined surfaces which are symmetrical to each other with respect to a line extending parallel to the etchable material 400 and passing through the center of the thickness of the etchable material 400.

Therefore, the present embodiment makes it easier to fabricate the reflective mirror 122 which is reduced in weight and moment of inertia, than when the aforementioned comparative example is fabricated.

In the present embodiment, between the {100} and {111} crystallographic surfaces, additional crystallographic surfaces (hereinafter, referred to as "interposed crystallographic surfaces") are exposed in the form of selected ones of families of crystallographic planes.

Therefore, the present embodiment enables the shape of the reflective mirror 122 to be rounded relative to the shape of a sixteen-sided polygon which is exhibited by the reflective mirror 122 when alternatively fabricated so as to expose the interposed crystallographic surfaces in the form of a selected one of families of crystallographic planes.

This is because a tendency exists that the larger the number of line segments (corresponding to the crystallographic surfaces) constituting an outline of a silhouette of the reflective mirror 122 when viewed in a direction normal to the reflective mirror 122, the more exactly the outline approximates a circle.

Further, in the present embodiment, the etchable material 400 is etched at both the {100} and {111} crystallographic planes by a wet-etching technique, with the result that the {100} and {111} crystallographic surfaces of the etchable material 400 are reduced in length from their original dimensions. The length reductions are filled by replacement with newly-created additional crystallographic surfaces in an oblique orientation with respect to both the {100} and {111} crystallographic surfaces.

Therefore, the present embodiment allows a reduction in length of the exposed crystallographic surfaces of the reflective mirror 122 which together form its outer circumferential surface, resulting in the promotion of equalization in length among the exposed crystallographic surfaces of the reflective mirror 122. This enables the shape of the reflective mirror 122 to be rounded, as with the creation of the interposed crystallographic surfaces of plural types.

This is because the tendency exists that, assuming that the number of the line segments (corresponding to the crystallographic surfaces) constituting the outline of the silhouette of the reflective mirror 122 is held constant, the shorter the longest one of the line segments, the more exactly the outline approximates a circle.

Figure 15:
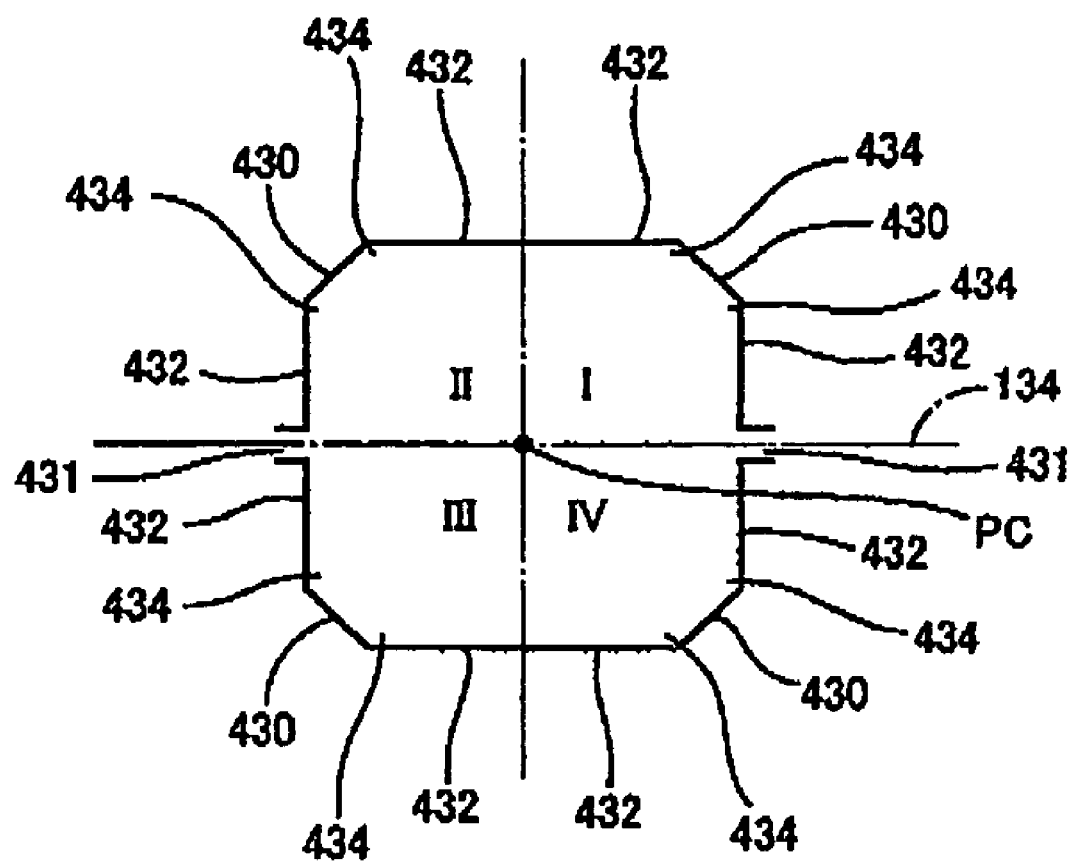
FIG. 15 is a top plan view illustrating an example of a modified version of the mask pattern depicted in FIG. 10.

It is added that, in FIG. 15, an example of a modified version of the mask pattern is illustrated. In this example, similarly with the aforementioned example, an outline of the mask pattern includes first portions 430 corresponding to {100} crystallographic planes, second portions 432 corresponding to {111} crystallographic planes, and third portions 434 corresponding to {n11} (n: an integer equal to or greater than two) crystallographic planes.

This example depicted in FIG. 15 is different from the previous example depicted in FIG. 10 in terms of the positions of the first portions 420, 430 relative to the positions of the second portions 422, 432.

Once the wet-etching step is terminated in a manner as described above, as illustrated in FIG. 9, a step S5 follows to eject the etchable material 400 from the etching bath, whose opposite faces have been coated with the etching masks 410. A step S6 follows to remove the etching masks 410 from the opposite faces of the etchable material 400. A step S7 follows to form a reflective layer made of aluminum or silver on at least one of the opposite faces of the etchable material 400.

Then, a succession of implementations in the reflective-mirror fabricating method is completed.

Second Embodiment

Next, a second embodiment of the present invention will be described.

The present embodiment is different from the first embodiment only with respect to the shape of each mask pattern and the specific shape of the reflective mirror, and is common to the first embodiment with respect to other elements.

Therefore, the common elements of the present embodiment will be omitted in detailed description by reference using the identical reference numerals or names, while only the different elements of the present embodiment will be described in greater detail below.

Figure 16:
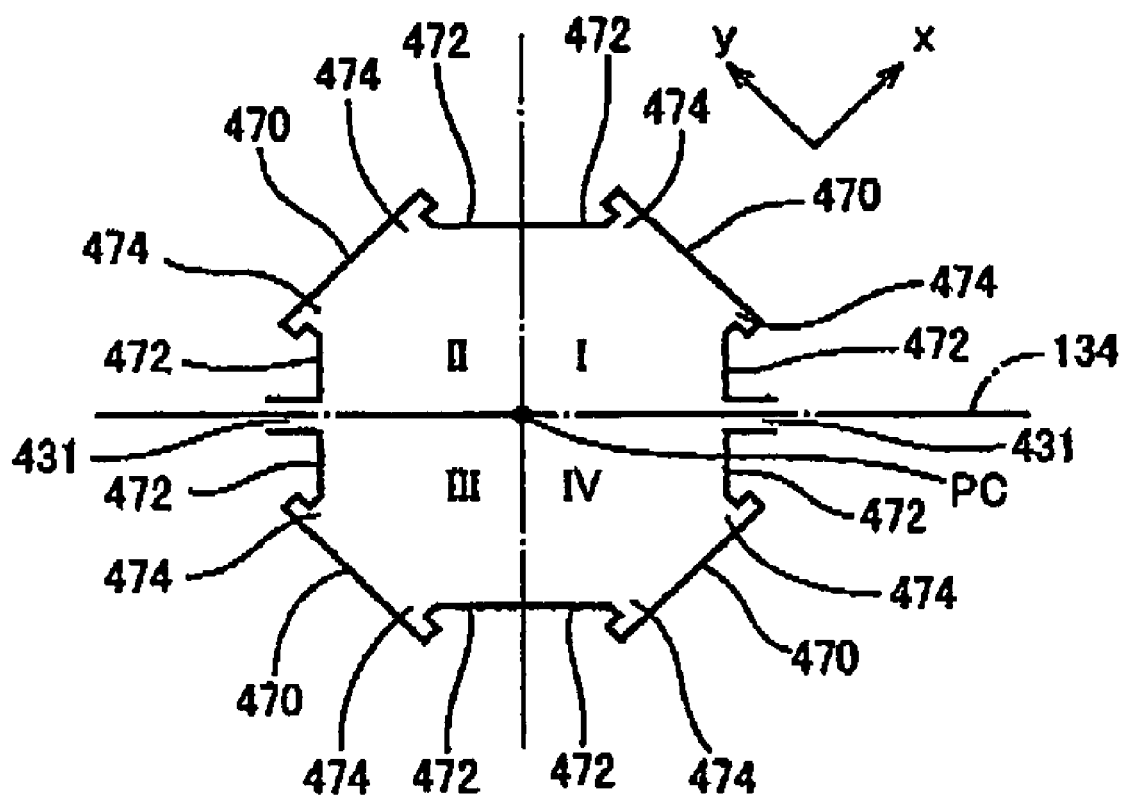
FIG. 16 is a top plan view illustrating a mask pattern formed for fabricating a reflective mirror 122 by a reflective-mirror fabricating method according to a second embodiment of the present invention.

As illustrated in FIG. 16, in the present embodiment, each mask pattern includes, similarly with the first embodiment, first sides each parallel to the oscillation axis 134, and second sides each perpendicular to the oscillation axis 134. The oscillation axis 134 constitutes an example of the "reference line" set forth in the above mode (6).

Figure 17:
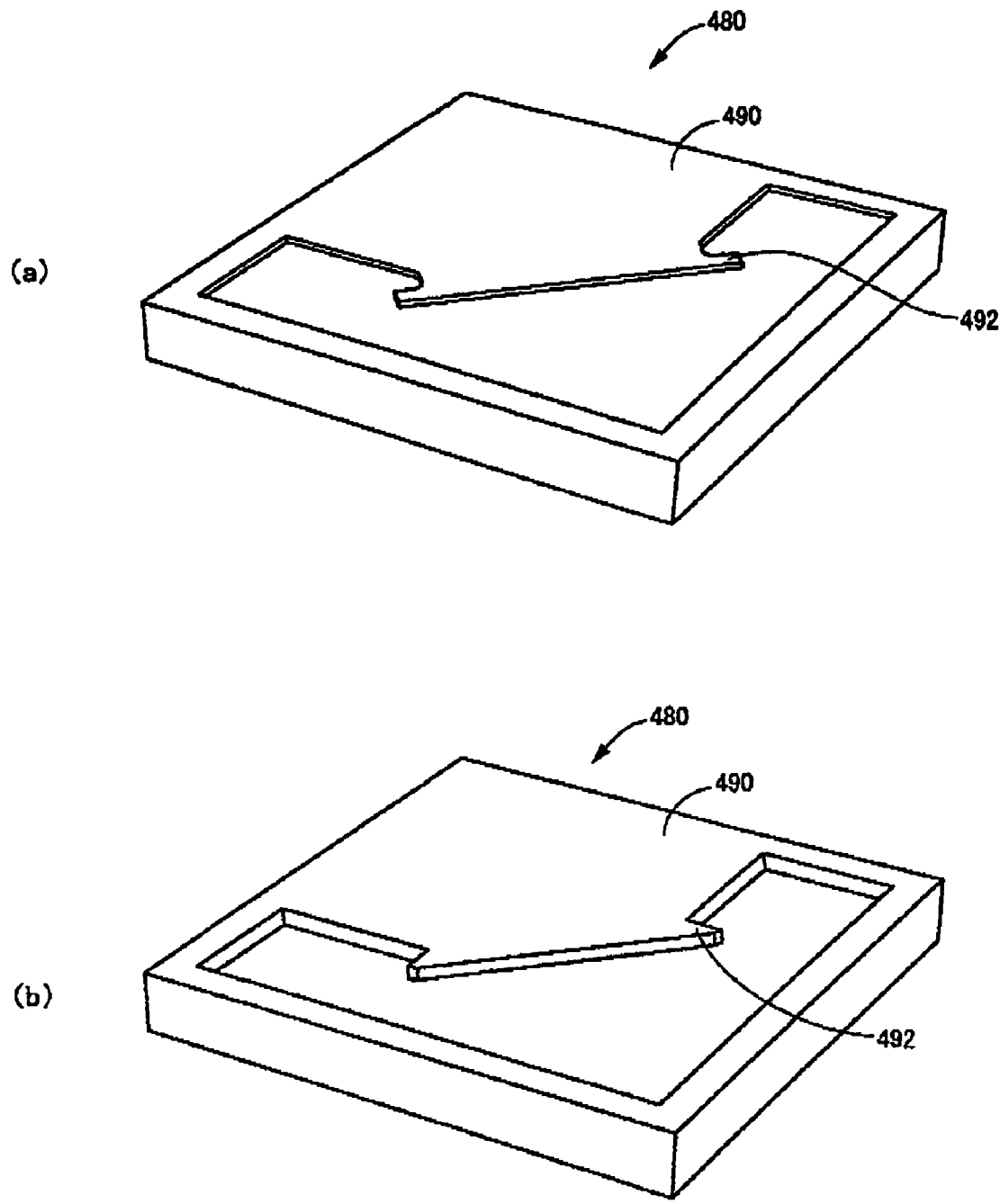
FIGS. 17(a) and 17(b) are perspective views for explaining step by step the progression of wet-etching performed in the second embodiment.

Each mask pattern is located relative to an etchable material 480 depicted in FIG. 17, such that each of the first and second sides is perpendicular to a selected one of <110> crystallographic directions of the etchable material 480 on a selected one of {100} crystallographic planes of the etchable material 480.

In the present embodiment, the first sides correspond to ones of a plurality of second portions 472 described below which extend parallel to the oscillation axis 134, wherein the ones extend horizontally in FIG. 16. On the other hand, the second sides correspond to ones of the plurality of second portions 472 which extend perpendicular to the oscillation axis 134, wherein the ones extend vertically in FIG. 16.

For defining the shape of this mask pattern, for convenience of explanation, the etchable material 480 is divided into four regions I, II, III, and IV by two center lines of symmetry orthogonally intersecting each other at a center point of the mask pattern. One of the center lines is the oscillation axis 134, and the other is a straight line orthogonally intersecting the oscillation axis 134 at the center point PC.

In the present embodiment, as illustrated in FIG. 16, each mask pattern further includes, similarly with the first embodiment, at its both ends opposite to each other in the direction of the oscillation axis 134, the extensions 431 and 431 which each extend outwardly of each mask pattern along the oscillation axis 134.

In the present embodiment, similarly with the first embodiment, each mask pattern is generally in the shape of a convex octagon and an outline of the mask pattern includes first portions 470 each corresponding to one of {100} crystallographic planes of the etchable material 480, and second portions 472 each corresponding to one of {111} crystallographic planes of the etchable material 480.

Further, in the present embodiment, fourth portions 474 are located symmetrically relative to each other at opposite ends of the first portion 470, respectively, as with the second portions 472.

As will be apparent from the above, in the present embodiment, the mask pattern has a planar shape having a basic shape of a convex octagon, and fourth portions 474 in the form of protrusions which protrude outwardly from the octagon at its eight corners. Each fourth portion 474 is shaped so as to extend from a corresponding one of the corners of a regular octagon, toward a region in which an external angle for the corresponding corner is formed.

The fourth portions 474 provide the function of delaying a timing at which wet-etch starts at corners which would be formed by the first portions 470 and the second portions 472 without interposition of the fourth portions 474. This function allows the reflective mirror 122 to be formed with its outer circumferential surfaces being simplified in composition (i.e., surface structure) than that in the case of the first embodiment.

In the present embodiment, similarly with the first embodiment, opposite faces of the etchable material 480 are coated with etching masks 490, and on the thus-coated two etching masks 490, respective mask patterns each having the shape as described above are formed. The etchable material 480 on which the mask patterns have been assigned in a manner described above is wet-etched.

In FIGS. 17(a), 17(b), 18(a), and 18(b), how the etchable material 480 is wet-etched is illustrated step by step. In FIG. 17(a), the wet-etching of the etchable material 480 starts at portions of the etchable material 480 which have been un-coated with the etching masks 490.

In this stage, the etchable material 480 exposes principally some of {100} crystallographic surfaces and some of {111} crystallographic surfaces. Further, the etchable material 480 exposes additional crystallographic surfaces between these {100} and {111} crystallographic surfaces.

Figure 18:
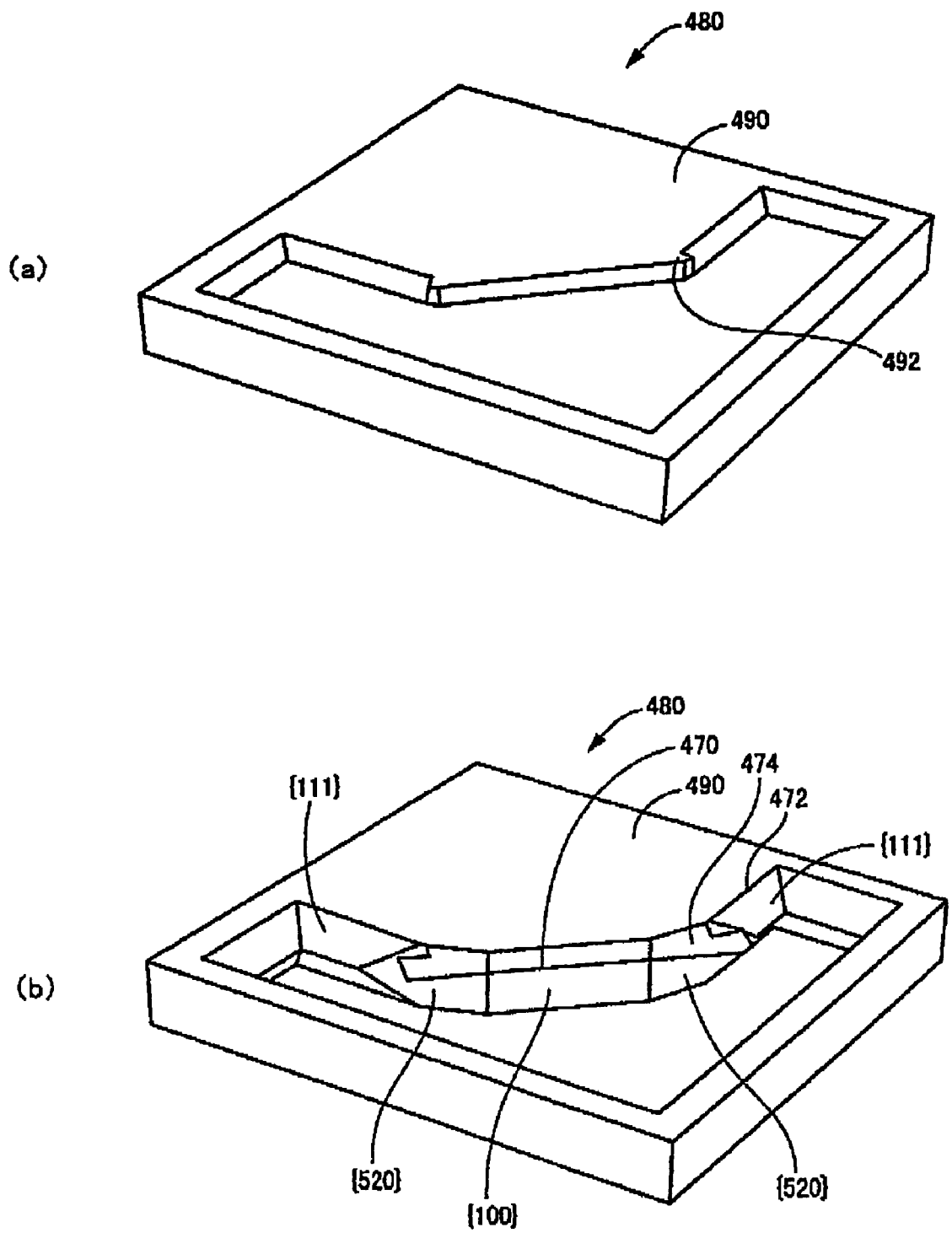
FIGS. 18(a) and 18(b) are additional perspective views for explaining step by step the progression of the wet-etching performed in the second embodiment.

Portions of the etchable material 480 which exposes the aforementioned additional crystallographic surfaces constitute protrusions 492 located between the {100} and {111} crystallographic surfaces (see FIG. 18(b)). The protrusions 492 are created as a result of the start-of-etch timing at the protrusions 492 being delayed owing to the fourth portions 474 of the mask pattern, with respect to the start-of-etch timings in the neighborhood of the fourth portions 474.

As illustrated in FIG. 17(b), when the wet-etching of the etchable material 480 progresses slightly from the stage illustrated in FIG. 17(a), the protrusions 492 located between the {100} and {111} crystallographic surfaces are wet-etched, resulting in reduction in protrusion amount of each protrusion 492. In this stage, the etchable material 480 starts exposing ones of {520} crystallographic surfaces at the tips of the protrusions 492.

As illustrated in FIG. 18(a), when the wet-etching of the etchable material 480 progresses slightly from the stage illustrated in FIG. 17(b), the protrusions 492 located between the {100} and {111} crystallographic surfaces are further wet-etched, resulting in further reduction in protrusion amount of each protrusion 492. In this stage, ones of {520} crystallographic surfaces which have been previously exposed at the tips of the protrusions 492 grow.

As illustrated in FIG. 18(b), when the wet-etching of the etchable material 480 progresses slightly from the stage illustrated in FIG. 18(a), ones of {520} crystallographic surfaces further grow between the {100} and {111} crystallographic surfaces, with the result that the ones of {520} crystallographic surfaces act as intervening inclined surfaces for joining these {100} and {111} crystallographic surfaces to each other.

The stage illustrated in FIG. 18(b) is an ultimate stage of the wet-etching in which the etchable material 480 has been partially penetrated in its thickness-wise direction because of the etchant. In FIG. 18(b), the ultimate shape of the etchable material 480 is illustrated together with a representative one of the first portions 470 of the mask pattern.

Figure 19:
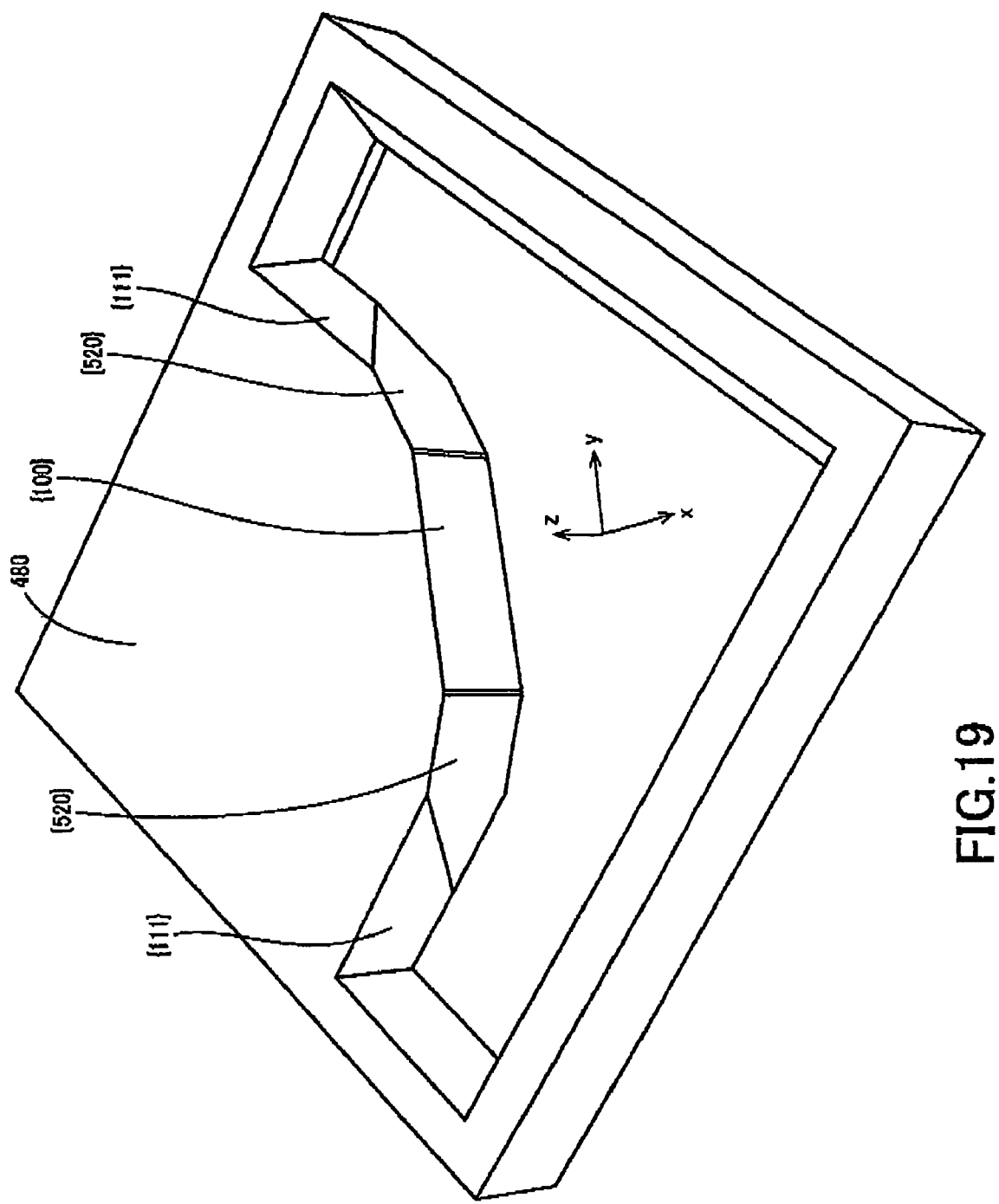
FIG. 19 is a perspective view illustrating in enlargement an etchable material 480 depicted in FIG. 18 (b)

In FIG. 19, the etchable material 480 depicted in FIG. 18(b) is illustrated in enlargement. Upon completion of the wet-etching of the etchable material 480, only ones of the {520} crystallographic planes are exposed between the {100} and {111} crystallographic surfaces. As a result, according to the present embodiment, the {100} and {111} crystallographic surfaces are joined to each other via surfaces which are simplified in composition (i.e., surface structure) than in the case of the first embodiment.

Figure 20:
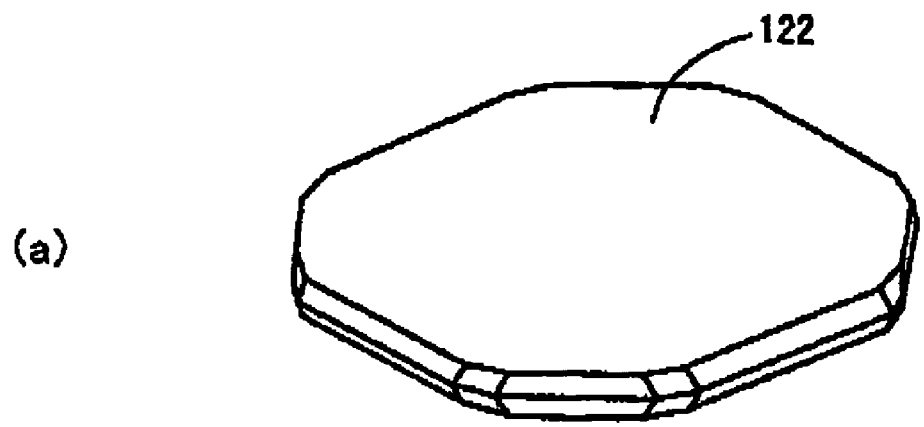
FIGS. 20(a) and 20(b) are a perspective view and a top plan view illustrating the reflective mirror 122 ultimately fabricated in the second embodiment, respectively.
Figure 20:
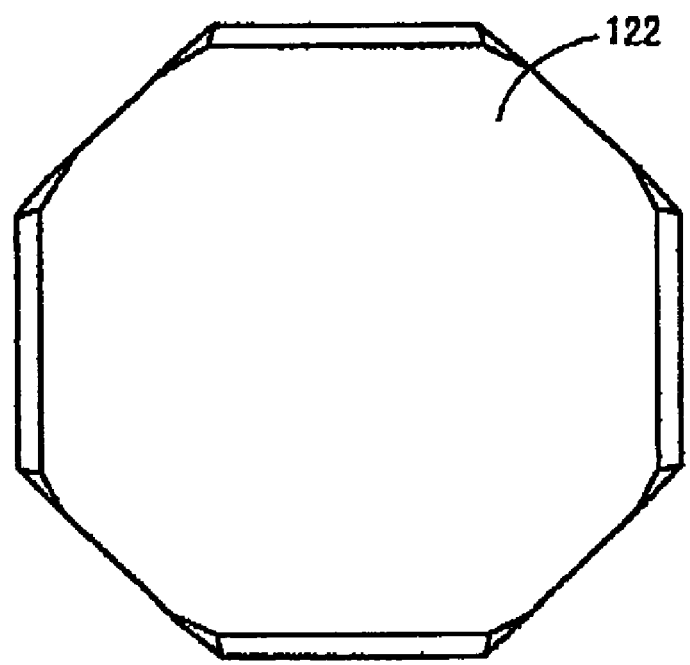

In FIG. 20(a), a completed reflective mirror 122 is illustrated in perspective view, while the same is illustrated in top plan view in FIG. 20(b). The reflective mirror 122 has a silhouette generally in the shape of a convex octagon as viewed in a direction normal to the reflective surface 120 of the reflective mirror 122. More precisely, the silhouette is in the shape of a sixteen-sided polygon, and still more precisely, the silhouette has a shape approximate to that of a sixteen-sided polygon.

According to the present embodiment, the outer circumference of the reflective mirror 122 is configured such that a {520} crystallographic surface is interposed between adjacent {100} and {111} crystallographic surfaces. The wet-etching is performed so as to create crystallographic surfaces interposed between adjacent {100} and {111} crystallographic surfaces. The interposed crystallographic surfaces are selected from principally a selected one of families of crystallographic planes (i.e., a family of {520} crystallographic planes), with the total number of selected families of crystallographic planes used for forming the interposed crystallographic surfaces being unchanged.

Therefore, according to the present embodiment, the shape of the outer circumference of the reflective mirror 122 is less variable (stabilized), with the result that the moment of inertia of the reflective mirror 122 is less variable (stabilized).

Figure 21:
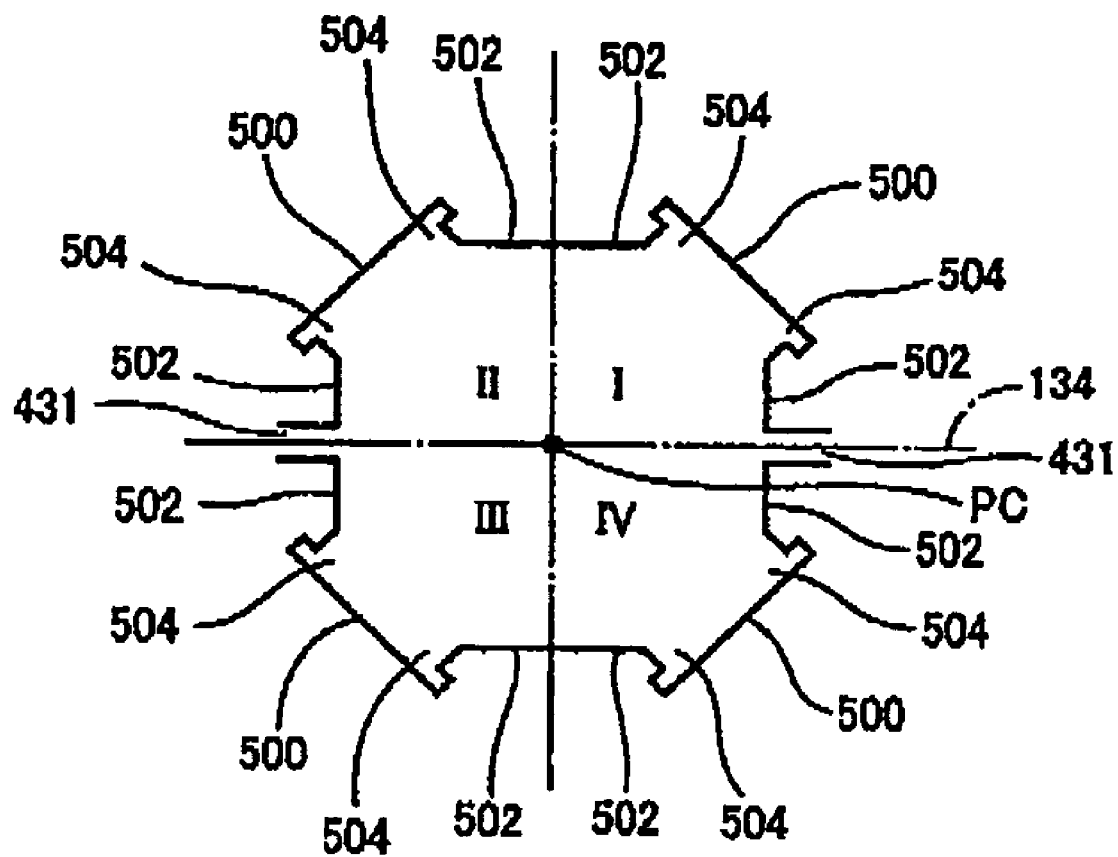
FIG. 21 is a top plan view illustrating an example of a modified version of the mask pattern depicted in FIG. 16.

It is added that, in FIG. 21, an example of a modified version of the mask pattern is illustrated. In this example, similarly with the aforementioned example depicted in FIG. 16, an outline of the mask pattern includes first portions 500 corresponding to {100} crystallographic planes, second portions 502 corresponding to {111} crystallographic planes, and fourth portions 504.

This example depicted in FIG. 21 is different from the previous example depicted in FIG. 16 in terms of the positions of the first portions 470, 500 relative to the positions of the second portions 472, 502.

Third Embodiment

Next, with reference to FIGS. 22-31, a third embodiment of the present invention will be described.

The present embodiment is different from the first and second embodiments only with respect to a part of the method of fabricating the body 110, which is for forming by wet-etch the beams 140 each having the stepped portion, and is common to the first and second embodiments with respect to other elements.

Therefore, the common elements of the present embodiment will be omitted in detailed description by reference using the identical reference numerals or names, while only the different elements of the present embodiment will be described in greater detail below.

An RSD according to the present embodiment is common in construction to the RSD according to the first embodiment which is depicted in FIG. 1. The present embodiment, however, may be modified by removing the wavefront-curvature modulating optical system 22 from the RSD according to the present embodiment. The modification can also apply to the first embodiment.

The body 110 of the RSD according to the present embodiment, in common to the body 110 of the RSD according to the first embodiment which is depicted in FIGS. 2-4, is constructed by integrally or monolithically fabricating the oscillating body 124 and the stationary frame 116.

As illustrated in FIG. 2, the oscillating body 124 is constructed by integrally or monolithically fabricating the reflective mirror 122 having the reflective surface 120, and the pair of beams 140 and 140 opposing to each other with the reflective mirror 122 being interposed between the pair of beams 140 and 140.

As illustrated in FIG. 2, each beam 140 of the oscillating body 124 is constructed, similarly with the first embodiment, to include the single mirror-side leaf spring 142, the pair of frame-side leaf springs 144, 144, and the connection 146 for coupling the mirror-side leaf spring 142 to the pair of frame-side leaf springs 144, 144.

That is to say, in the present embodiment, each beam 140 constitutes an example of the "beam structure" set forth in the above mode (18), and an example of the "beam structure" set forth in the above modes (31), (36), and (45).

Now, with reference to FIGS. 2 and 3, there will be described portions of the body 110 of the RSD according to the present embodiment, which are required to be specially described for an easy understanding of an oscillating-body fabricating process according to the present embodiment.

As illustrated in FIG. 2, for the beams 140, 140, the actuators 150, 152, 154 and 156 are secured to the pairs of frame-side leaf springs 144 and 144, respectively, with each actuator 150, 152, 154, 156 extending from a corresponding one of the frame-side leaf springs 144 and 144 to the stationary frame 116.

As illustrated in FIG. 3, each frame-side leaf spring 144 is locally thinned on its proximal side to the stationary frame 116, resulting in formation of the recess 158. The recess 159 is formed at the stationary frame 116 to achieve surface continuity between the recesses 158 and 159. Utilization of these recesses 158 and 159 allows each actuator 150, 152, 154, 156 to be disposed such that each actuator 150, 152, 154, 156 extends between the corresponding frame-side leaf spring 144 and the stationary frame 116.

As described above with reference to FIG. 3, in the present embodiment, each recess 158 is formed on one of opposite face portions, which is to say, an upper-face portion of each frame-side leaf spring 144 of the corresponding beam 140. Each frame-side leaf spring 144 is formed to include the stepped portion 160, thereby allowing formation of the recess 158 on the upper-face portion of each frame-side leaf spring 144.

As illustrated in FIG. 3, the stepped portion 160 is formed at each frame-side leaf spring 144 such that the stepped portion 160 includes;

(a) a higher sub-portion 162 having the same height as a basic surface of the beam 140, which is to say, an original upper face of the beam 140;

(b) a lower sub-portion 164 lower than the original upper face of the beam 140; and (c) a shoulder sub-portion 166 which is located at a border between the higher and lower sub-portions 162 and 164 and which traverses the beam 140.

Among these sub-portions 162, 164 and 166, the lower and shoulder sub-portions 164 and 166 contribute to the formation of the recess 158.

As illustrated in FIGS. 2 and 3, each actuator 150, 152, 154, 156 is mounted on the corresponding recess 158, which is to say, the corresponding stepped portion 160, with an upper face of each actuator 150, 152, 154, 156 being located not above a plane coplanar with a basic surface of the corresponding frame-side leaf spring 144.

As illustrated in FIG. 3, each actuator 150, 152, 154, 156 is in the form of a laminate constructed by sandwiching the thin-plate-shaped piezoelectric material 170 between the upper and lower electrodes 172 and 174.

As illustrated in FIG. 3(*a*) in side view, each actuator 150, 152, 154, 156 is attached at its lower face to the corresponding recesses 158 and 159, and each actuator 150, 152, 154, 156 has a thickness dimension allowing an upper face of each actuator 150, 152, 154, 156 not to be above an uppermost surface of the higher sub-portion 162.

That is to say, in the present embodiment, each actuator 150, 152, 154, 156 constitutes an example of the "laminate" set forth in the above mode (35).

The horizontal scanning drive circuit 180 of the RSD according to the present embodiment is in common in configuration and operation to the horizontal scanning drive circuit 180 according to the first embodiment which is depicted in FIG. 4.

Each frame-side leaf spring 144 of the oscillating body 124 is fabricated integrally with the reflective mirror 122 such that each frame-side leaf spring 144 includes the stepped portion 160 to form the recess 158.

In the present embodiment, the height of the stepped portion 160, which is to say, a distance between the higher and lower sub-portions 162 and 164 measured in a thickness-wise direction of each frame-side leaf spring 144 is 50 μm, while the recess 158 has a dimension of 1 mm when measured in a length-wise direction of each frame-side leaf spring 144.

Figure 22:
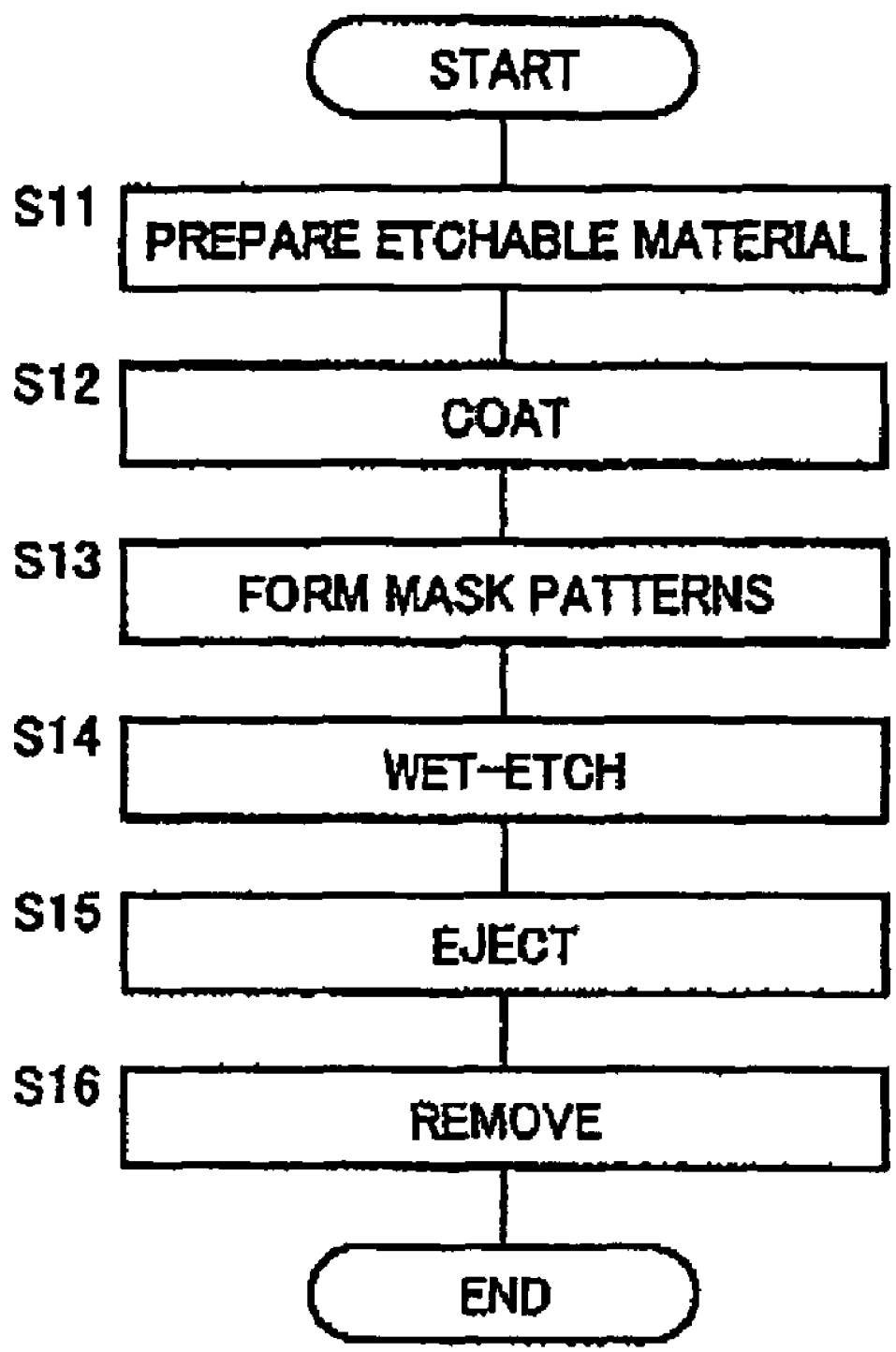
FIG. 22 is a process chart illustrating an oscillating-body fabricating process according to a third embodiment of the present invention.

In FIG. 22, there is illustrated in process chart the oscillating-body fabricating process for fabricating by a wet-etching technique the body 110 including the stationary frame 116 and the oscillating body 124, by an integral and batch fabrication.

This fabrication process begins with a step S11 to prepare an etchable material in the form of a plate-shaped material made of a single crystal silicon.

Figure 23:
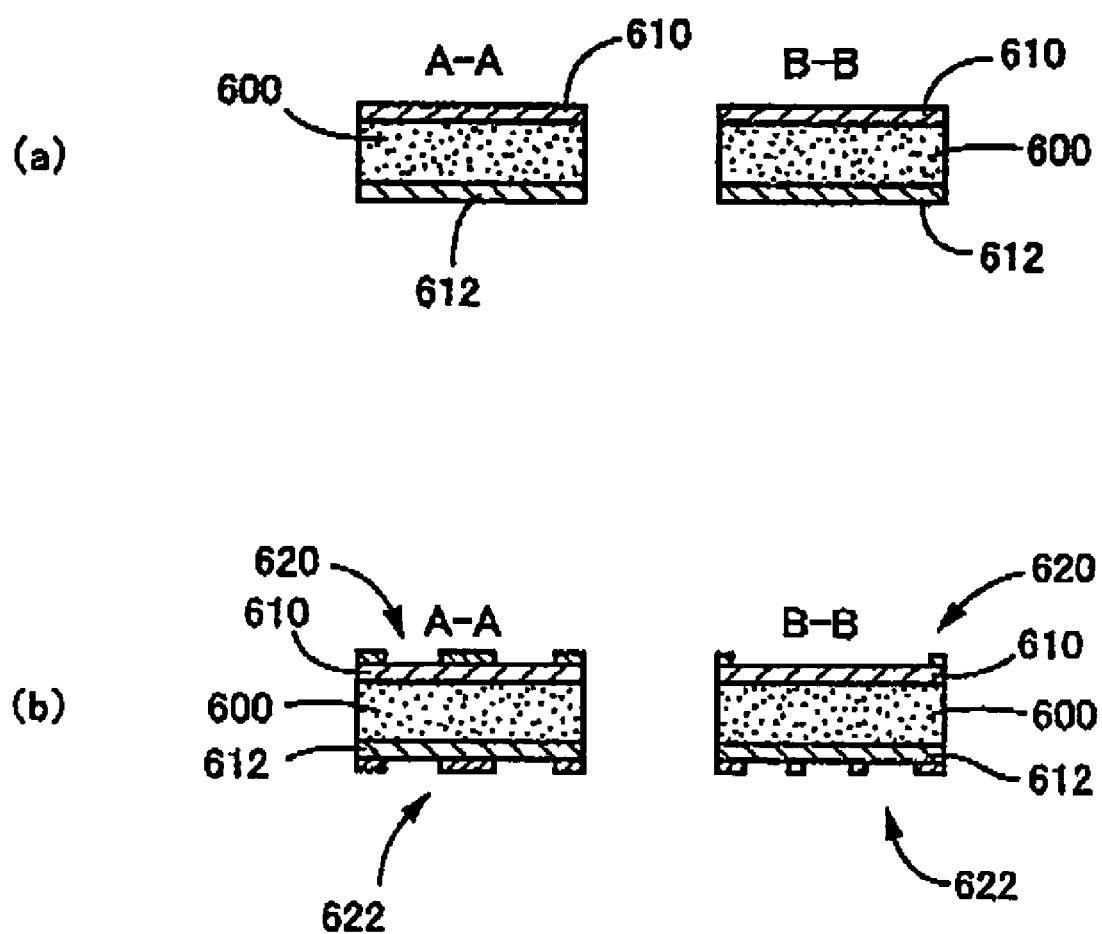
FIGS. 23(a) and 23(b) are sectional views taken on lines A-A and B-B in FIG. 2 for explaining steps S12 and S13 depicted in FIG. 22, respectively.
Figure 29:
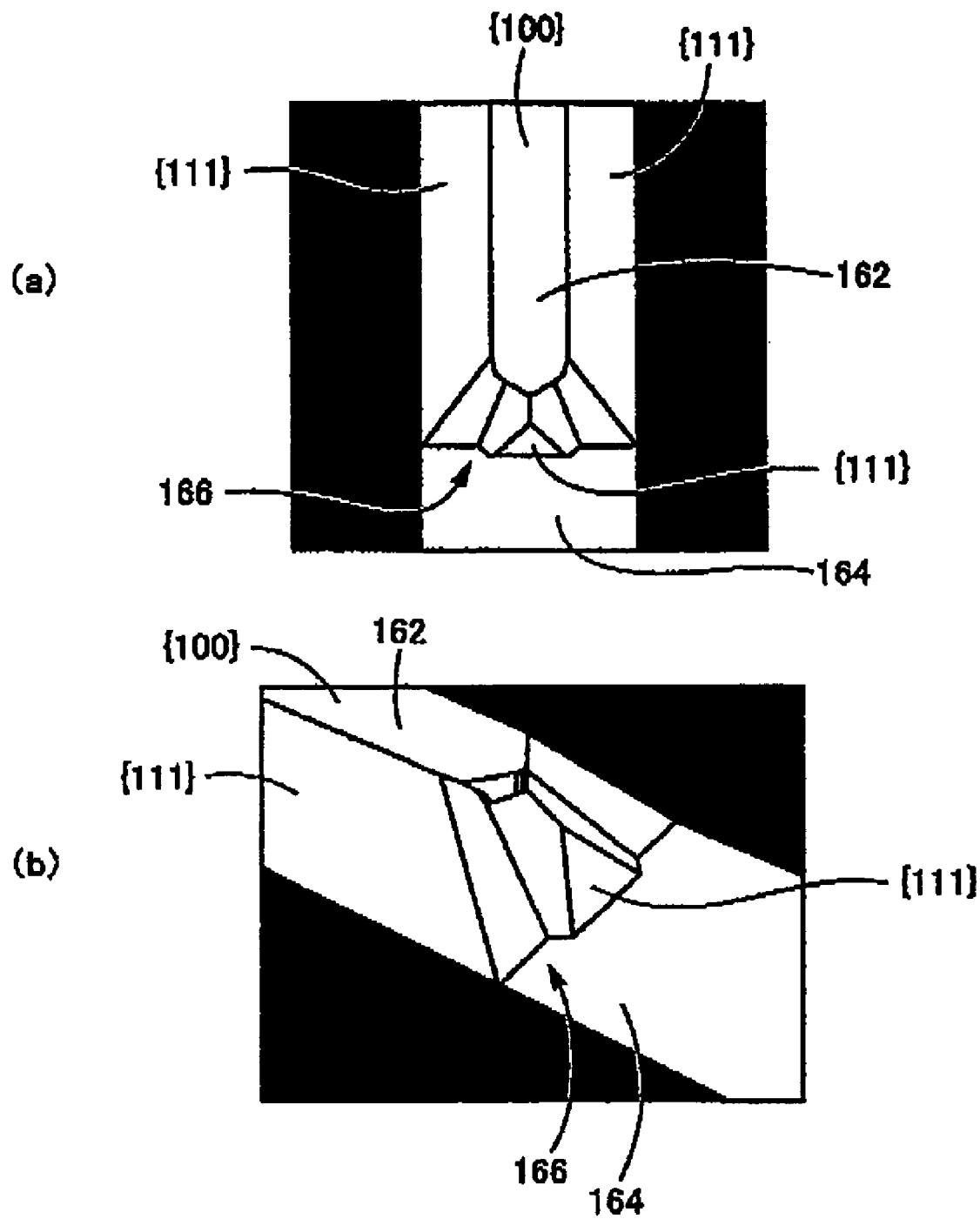
FIGS. 29(a) and 29(b) are a top plan view and a perspective view illustrating in enlargement the stepped portion 160 of the etchable material 600 depicted in FIG. 28(b), respectively.
Figure 30:
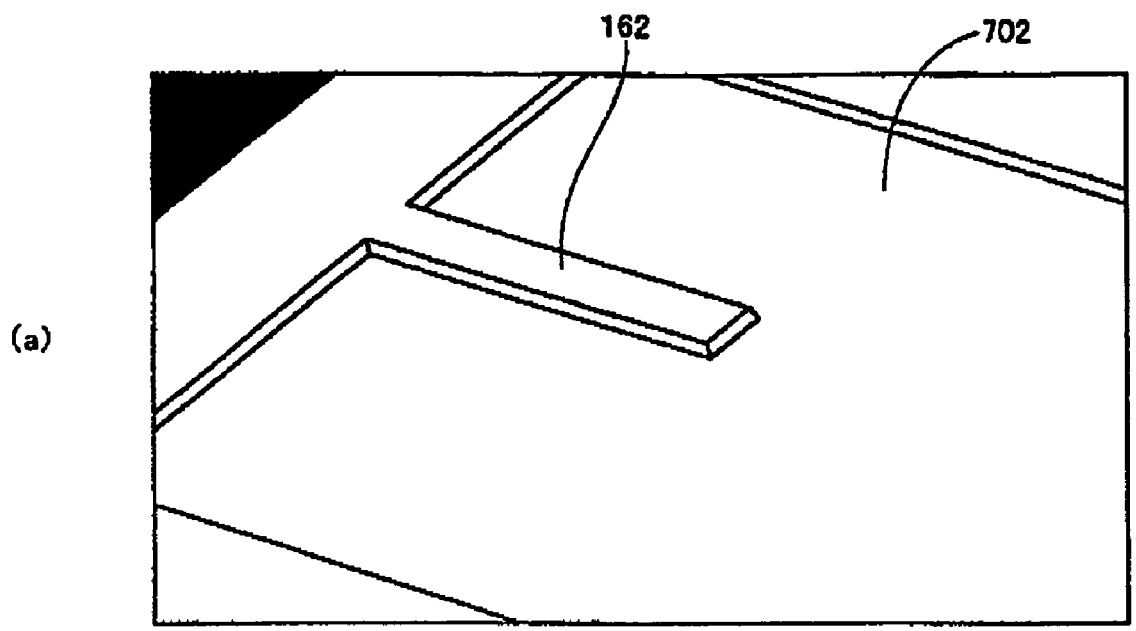
FIGS. 30(a) and 30(b) are perspective views for explaining step by step the progression of wet-etching performed in a comparative example of the third embodiment.
Figure 30:
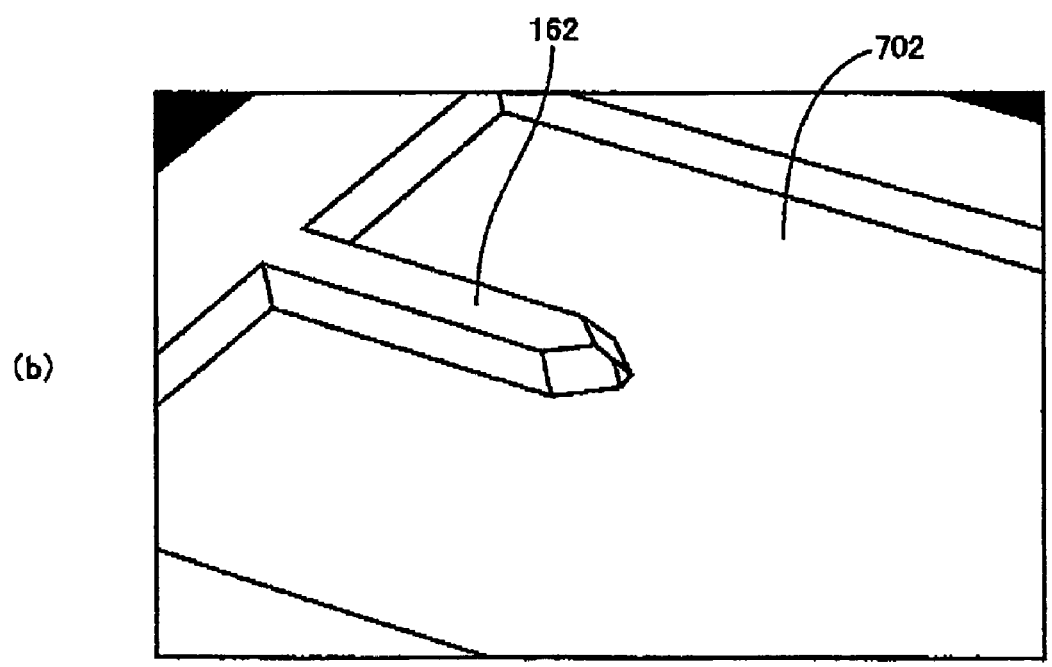
Figure 31:
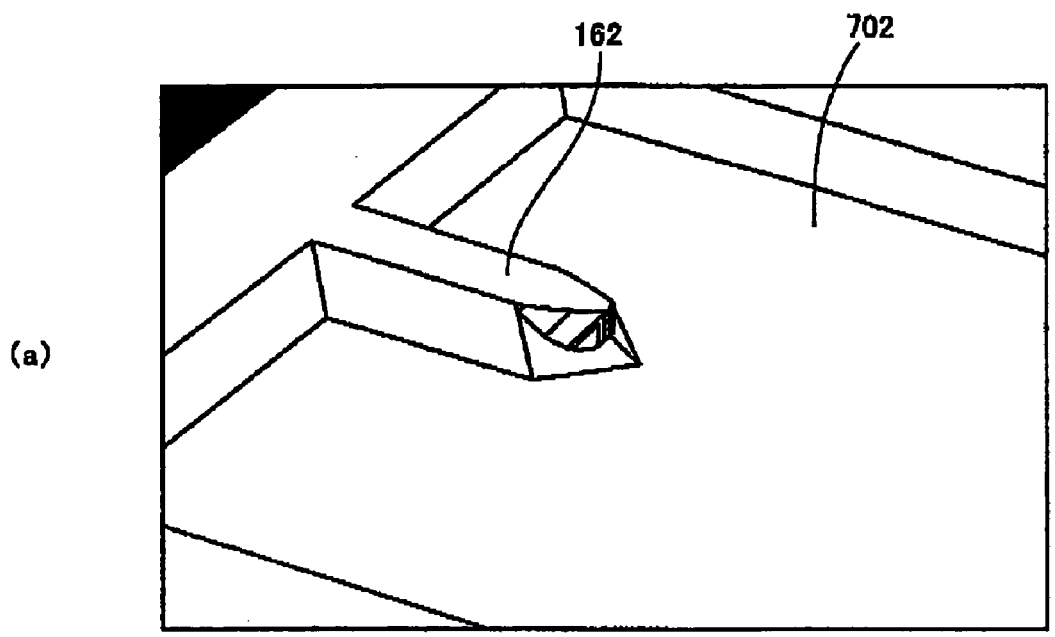
FIGS. 31(a) and 31(b) are additional perspective views for explaining step by step the progression of the wet-etching performed in the comparative example of the third embodiment.
Figure 31:
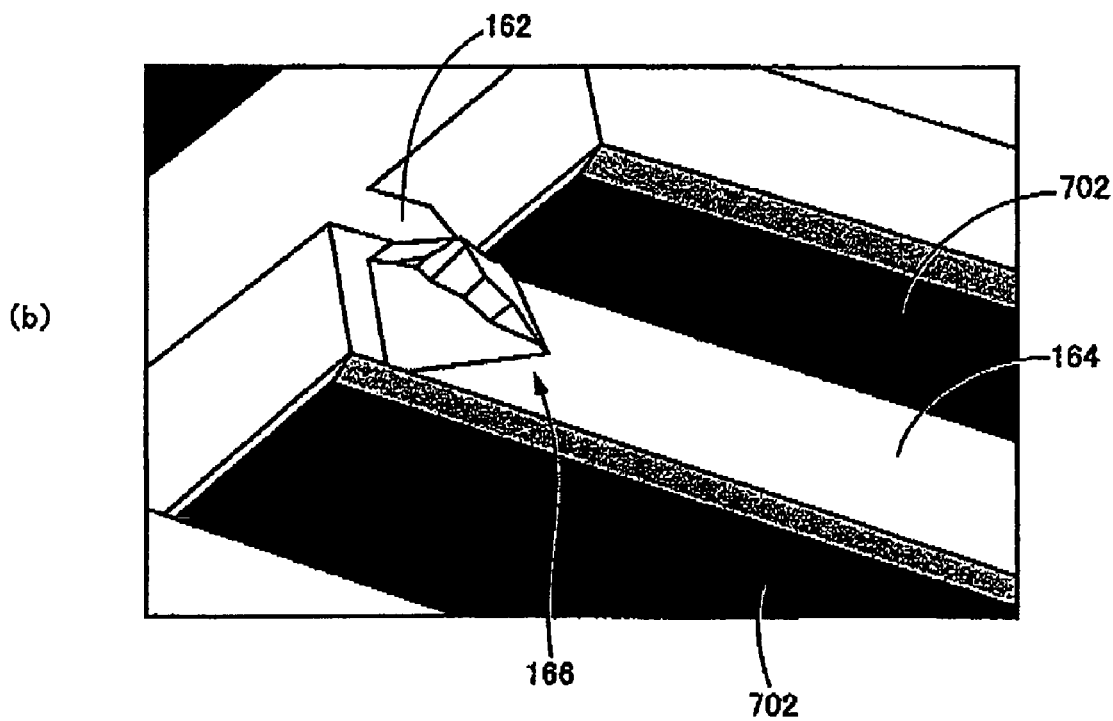

In FIGS. 23(*a*) and 23(*b*), the etchable material is denoted by reference numeral 600. The etchable material 600 with a thickness of 100 μm is made of a silicon wafer. As illustrated in FIGS. 29(*a*) and 29(*b*), the etchable material 600 is initially exposed at some of {100} crystallographic planes.

FIGS. 23(*a*) and 23(*b*) are sectional views taken on lines A-A and B-B in FIG. 2 for representatively explaining a coating step and a mask-pattern forming step, both of which, although described later, belong to a method of fabricating the body 110.

In this regard, the A-A line is a cutting-plane line traversing the body 110 through a center point of the reflective mirror 122, while the B-B line is a cutting-plane line traversing the body 110 through center points of length-wise dimensions of the recesses 158 and 158.

The step S11 is followed by a step S12 to coat opposite faces of the etchable material 600 with two etching masks 610 and 612, respectively, as illustrated in FIG. 23(*a*). These etching masks 610 and 612 are silicon oxide coatings formed on the opposite faces of the etchable material 600 by heating the opposite faces of the etchable material 600.

That is to say, the step S12 constitutes an example of the "coating step" set forth in the above mode (18).

The step S12 is followed by a step S13 to employ a lithographic technique for the two etching masks 610 and 612 (610: upper etching mask, 612: lower etching mask) which have been deposited on the opposite faces of the etchable material 600.

More specifically, the surfaces of the etching masks 610 and 612 are coated with resists, and then the resists which have been applied to the etching masks 610 and 612 are exposed to respective optical patterns.

Thereafter, according to the exposure pattern, the resists are removed in a position-selective manner using appropriate chemicals. As a result, a resist 620 having an upper mask pattern is deposited on the surface of the upper etching mask 610, while a resist 622 having a lower mask pattern is deposited on the surface of the lower etching mask 612.

The step S13 is further implemented to remove the two etching masks 610 and 612 in a position-selective manner using appropriate chemicals (e.g., hydrofluoric acid), according to the resists 620 and 622 into which the two etching masks 610 and 612 have been previously patterned. As a result, an upper mask pattern 630 illustrated in FIG. 24(*a*) in top plan view is formed on the upper etching mask 610, while a lower mask pattern 632 illustrated in FIG. 24(*b*) in top plan view is formed on the lower etching mask 612.

Figure 24:
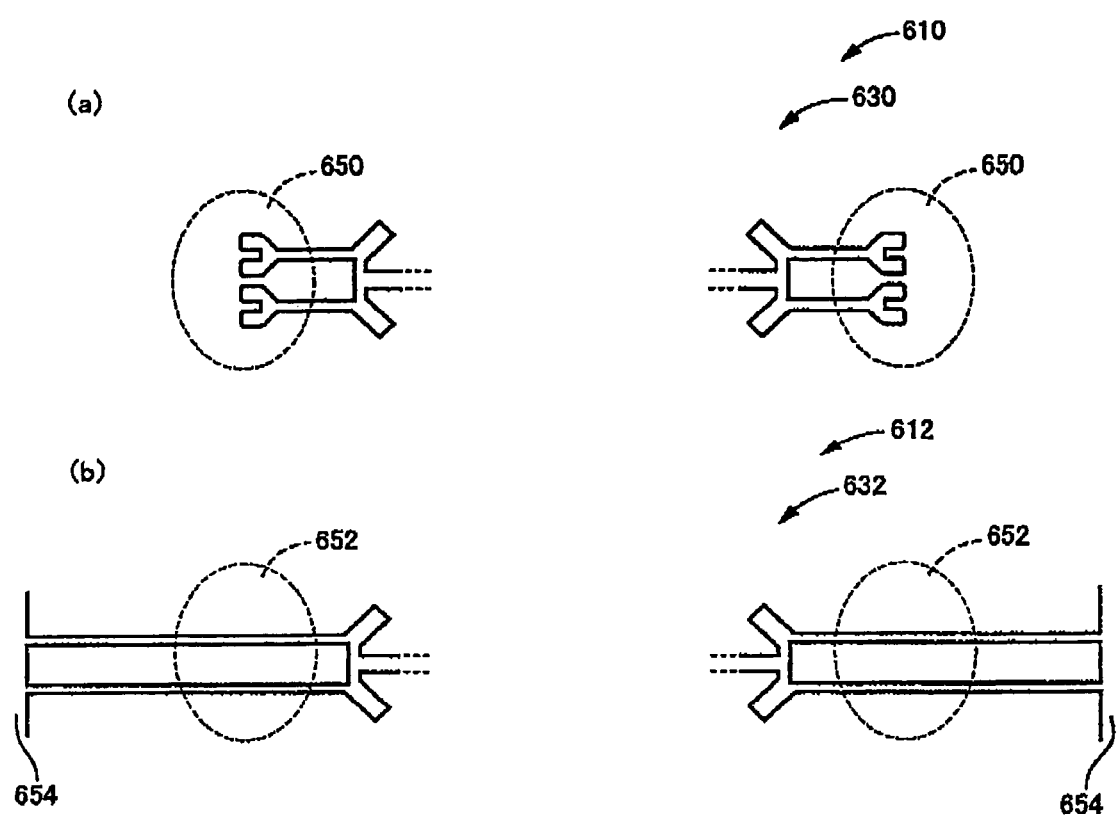
FIGS. 24(a) and 24(b) are top plan views illustrating an upper mask pattern 630 and a lower mask pattern 632 formed in the step S13 depicted in FIG. 22, respectively.

However, in FIGS. 24(*a*) and 24(*b*), the upper mask pattern 630 and the lower mask pattern 632 are illustrated only with respect to portions of the upper and lower mask patterns 630 and 632 which are related to fabrication of the oscillating body 124, and are omitted with respect to portions of the upper and lower mask patterns 630 and 632 which are related to fabrication of the stationary frame 116, because the latter portions are not necessary for understanding the present invention.

Actually each of the mask patterns 630 and 632 depicted in FIGS. 24(*a*) and 24(*b*) includes at a center point of the length-wise dimension of each mask pattern 630, 632, a portion for fabrication of the reflective mirror 122. However, the portion is omitted in FIGS. 24(*a*) and 24(*b*) because the portion is in common to that of the first or second embodiment described above.

In the upper mask pattern 630 illustrated in FIG. 24(*a*), there are surrounded by broken circles, portions 650 and 650 of the upper mask pattern 630, each of which is related to the fabrication of the corresponding stepped portion 160 of the upper-face portion of each frame-side leaf spring 144.

On the other hand, in the lower mask pattern 632 illustrated in FIG. 24(*b*), there are surrounded by broken circles, portions 652 and 652 of the lower mask pattern 632, each of which is related to the fabrication of a region of the lower-face portion of each frame-side leaf spring 144, which region is located on the side opposite to the corresponding stepped portion 160.

The shape of each mask pattern 630, 632 determines the shape of a portion of the etchable material 600 which will be brought into contact with and etched by the etchant held in the etching bath (not shown) if the etchable material 600 is immersed in the etching bath.

That is to say, the step S13 constitutes an example of the "mask-pattern forming step" set forth in the above mode (18).

As illustrated in FIGS. 24(*a*) and 24(*b*), the portions 652 and 652 are configured to extend toward portions 654 and 654 of the lower mask pattern 632 which portions correspond to the fixed frame 116, with each portion 652 having a simple strip-like shape similar with a basic desired-shape (an ultimate-shape achieved by fabrication) of the frame-side leaf spring 144, while the portions 650 and 650 each have a complex shape.

Figure 27:
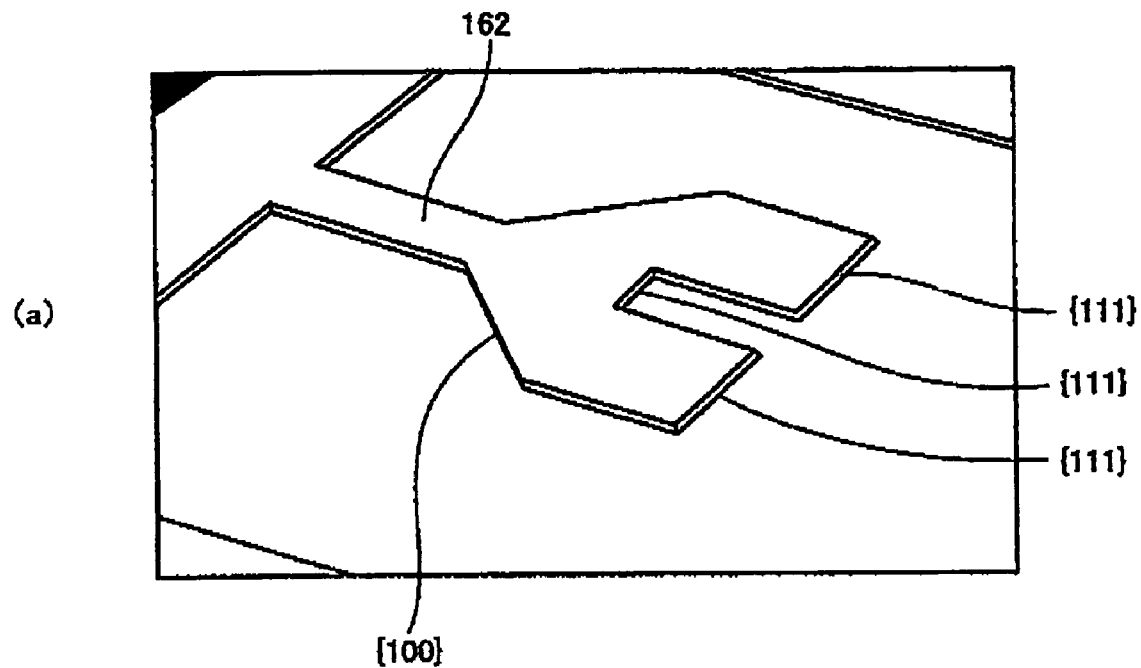
FIGS. 27(a) and 27(b) are perspective views for explaining step by step the progression of wet-etching performed in a step S14 depicted in FIG. 22.
Figure 27:
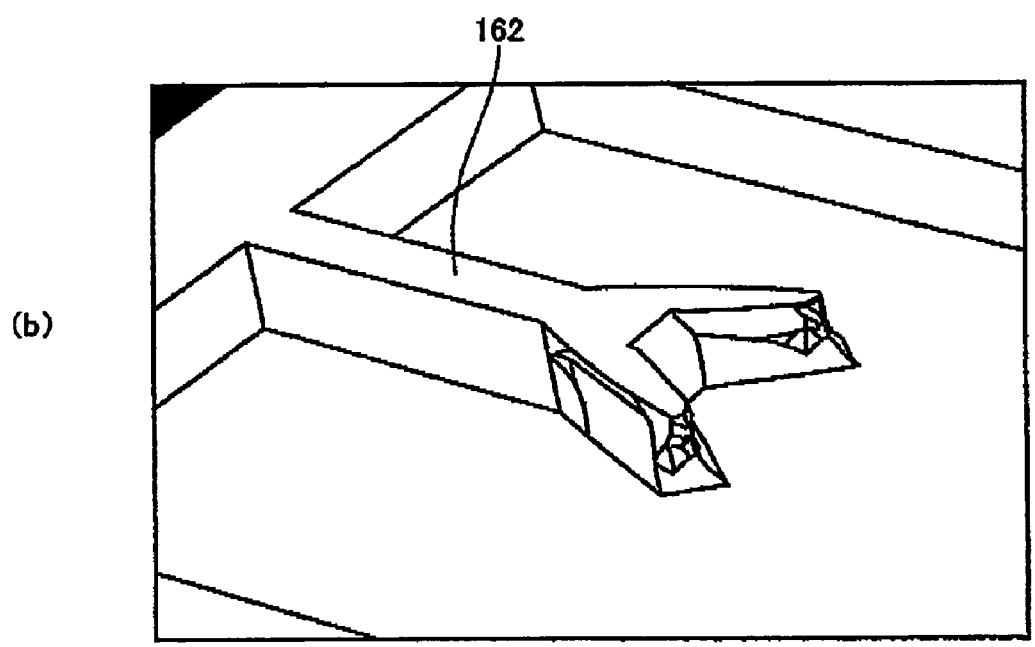
Figure 28:
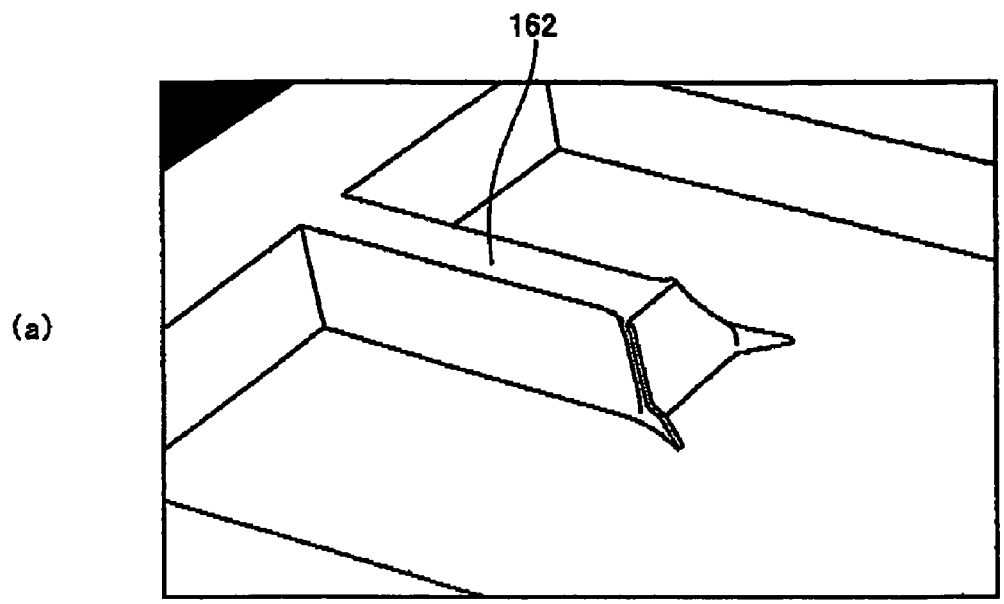
FIGS. 28(a) and 28(b) are additional perspective views for explaining step by step the progression of the wet-etching performed in the step S14 depicted in FIG. 22.
Figure 28:
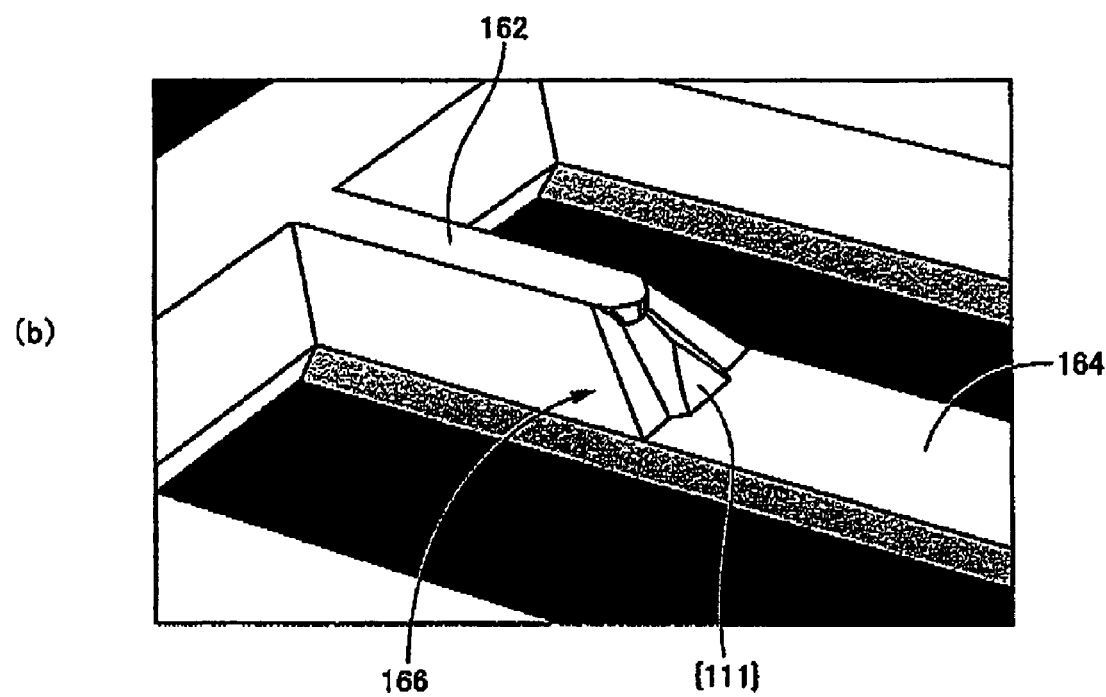

Now, with reference to FIGS. 25(a), 25(b), 25(c), and 26, there will be described the shape of each portion 650 in more detail below. However, in FIGS. 25(a), 25(b), and 25(c), the etchable material 600 and a representative one of the frame-side leaf springs 144 are simplified in illustration for convenience of explanation of the shapes of the etchable material 600 and the representative frame-side leaf spring 144. The more practical shapes of the etchable material 600 and the representative frame-side leaf spring 144 are illustrated in FIGS. 27-29.

In FIG. 25(a), there is illustrated in perspective view a portion of the upper mask pattern 630 which corresponds to a single frame-side leaf spring 144 (hereinafter, referred to as "representative frame-side leaf spring") representing the plurality of frame-side leaf springs 144 for convenience of explanation.

In FIG. 25(b), there are illustrated in perspective view a portion of the etchable material 600 at which the representative frame-side leaf spring 144 is to be formed and the neighborhood of the portion.

In FIG. 25(c), there is illustrated in perspective view the basic desired-shape (an ultimate-shape achieved by fabrication) of the representative frame-side leaf spring 144.

Describing the etchable material 600 in more detail with reference to FIG. 25(b), the etchable material 600 includes a to-be-unetched portion 700 which is to remain unetched even after the etchable material 600 is immersed in the etchant for wet-etching. The to-be-unetched portion 700 is identical in shape to the higher sub-portion 162 within the basic desired-shape of the representative frame-side leaf spring 144 depicted in FIG. 25(c). The to-be-unetched portion 700 is illustrated in FIG. 25(b) in broken lines.

As illustrated in FIG. 25(b), the etchable material 600 further includes a to-be-fully-etched portion 702 which is to be wet-etched until the etchant passes through a thickness of the etchable material 600.

The to-be-fully-etched portion 702 is a portion of the etchable material 600 left after conceptually excluding a silhouette of a part of the etchable material 600 which is identical in shape to the basic desired-shape of the representative frame-side leaf spring 144 from a silhouette of the etchable material 600. These silhouettes are conceived by viewing the entire etchable material 600 and the part of the etchable material 600.

As illustrated in FIG. 25(b), the etchable material 600 yet further includes a to-be-half-etched portion 704 which is to be etched in half-way of the thickness of the etchable material 600 when wet-etched.

The to-be-half-etched portion 704 is identical in shape to the recess 158 depicted in FIG. 3. The to-be-half-etched portion 704 is illustrated in two-dotted lines in FIG. 25(b). In the etchable material 600, there exist opposite sub-portions 706 and 706 which are opposed to each other in a width-wise direction of the to-be-half-etched portion 704 and between which the to-be-half-etched portion 704 is interposed.

As illustrated in FIG. 25(a), the portion 650 (hereinafter, referred to as "stepped-portion-oriented mask pattern 650") of the upper mask pattern 630 includes a basic pattern 710 which covers a surface (i.e., an upper face) of the to-be-unetched portion 700 before wet-etching. The stepped-portion-oriented mask pattern 650 further includes a compensating pattern 712 which covers surfaces (i.e., upper faces) of the opposite sub-portions 706, 706 before wet-etching.

More specifically, the compensating pattern 712 is configured to include a pair of wings 714 and 714 which coextend in a length-wise direction of the to-be-half-etched portion 704, and which are disposed on respective opposite sides with respect to the to-be-half-etched portion 704.

Figure 26:
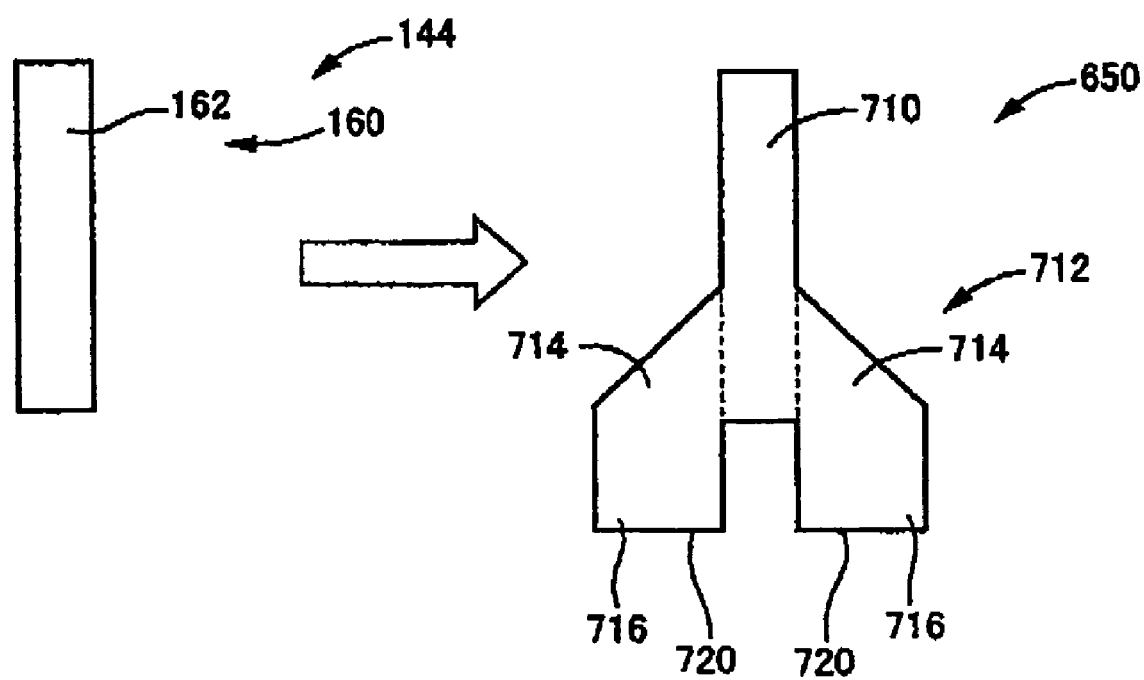
FIG. 26 illustrates in top plan view a basic desired-shape of a stepped portion 160 of the representative frame-side leaf spring 144 in FIG. 25, and a stepped-portion-oriented mask pattern 650.

In FIG. 26, both a basic desired-shape of the higher sub-portion 162 of the stepped portion 160 of the representative frame-side leaf spring 144, and the shape of the stepped-portion-orientated mask pattern 650 are illustrated in top plan view, side by side, for convenience of comparison.

As will be evident from FIG. 26, the stepped-portion-orientated mask pattern 650 includes a basic pattern 710 which is identical in shape to a surface shape of the higher sub-portion 162. The stepped-portion-oriented mask pattern 650 further includes as the compensating pattern 712, which extend laterally and outwardly of the basic pattern 710 in opposite directions.

As illustrated in FIG. 26, the pair of wings 714 and 714 are associated with the basic pattern 710, such that the wings 714 and 714 are partially coupled at one end side of the wings 714 and 714 to the basic pattern 710, and such that the wings 714 and 714 are partially open at opposite end side of the wings 714 and 714, whereby the wings 714 and 714 and a portion of the basic pattern 710 which is coupled to the wings 714 and 714 cooperate to form a substantial U-shape.

The upper and lower mask patterns 630 and 632 having the respective shapes described above are formed on the opposite faces of the etchable material 600, respectively.

Thereafter, in a step S14 illustrated in FIG. 22, a laminate of the etchable material 600 and the etching masks 610 and 612 is immersed in the etching bath containing the etchant. In the present embodiment, the etchant is prepared to include a Potassium Hydroxide (KOH) solution with a preset condition of 40 wt. % and a preset temperature of 70.degree. C. Under this condition, the etchable material 600 is wet-etched.

That is to say, the step S14 constitutes an example of the "wet-etching step" set forth in the above mode (18).

It is added that, in an alternative, the etchant may be prepared to include a Tetramethyl Ammonium Hydroxide (TMAH) solution. In this alternative, the shape of a corresponding mask pattern is obtained by partially modifying that illustrated in FIG. 24.

Further, in the step S14, upon the etchable material 600 being etched through the etchable material 600 at the to-be-fully-etched portion 702, one cycle of the wet-etching process is terminated. For one cycle of the wet-etching process, the etchable material 600 is immersed in the etchant only once.

That is to say, in the present embodiment, for one cycle of the wet-etching process, the etchable material 600 is immersed in the etchant not several times but only once, with the result that the body 110 is fabricated at a time (by a batch process) by wet-etching the etchable material 600.

In FIGS. 27(a), 27(b), 28(a), and 28(b), how the etchable material 600 is wet-etched is illustrated step by step. In each figure, however, representatively for the representative frame-side leaf spring 144, there is illustrated how the etchable material 600 is etched from the upper face toward the lower face of the etchable material 600.

In the stage illustrated in FIG. 27(a), the wet-etching of the etchable material 600 starts at portions of the etchable material 600 which have been un-coated with the etching masks 610. In this stage, because of the stepped-portion-oriented mask pattern 650, the etchable material 600 starts exposing some of {100} crystallographic surfaces and some of {111} crystallographic surfaces.

As illustrated in FIG. 27(b), when the wet-etching of the etchable material 600 progresses slightly from the stage illustrated in FIG. 27(a), with a slight increase in an etching depth of the etchable material 600, the etching at portions of the etchable material 600 which have been coated with the pair of wings 714 and 714 progresses from both corners at the tip of each wing 714 toward the inside of each wing 714. However, the some of {111} crystallographic surfaces remain.

As illustrated in FIG. 28(a), when the wet-etching of the etchable material 600 progresses slightly from the stage illustrated in FIG. 27(b), portions of the etchable material 600 which have been coated with the pair of wings 714 and 714 are almost completely removed or eliminated. Still in this stage, the some of {111} crystallographic surfaces remain.

When the wet-etching of the etchable material 600 progresses slightly from the stage illustrated in FIG. 28(a), one cycle of the wet-etching is terminated. In this stage, as illustrated in FIG. 28(b), the etchable material 600 is etched through at the to-be-fully-etched portion 702 along the thickness of the etchable material 600. Additionally, the surface of the lower sub-portion 164 is created, and the surface of the shoulder sub-portions 164 is also created.

In FIG. 29(a), the stepped portion 160 fabricated by the wet-etching technique is illustrated in top plan view, while in FIG. 29(b), the stepped portion 160 is illustrated in perspective view. The shoulder sub-portion 166 exposes some of the {111} crystallographic surfaces. {111} crystallographic surfaces are wet-etched slower than any other crystallographic surfaces.

Therefore, fabrication of the shoulder sub-portion 166 using some of the {111} crystallographic planes allows the shoulder sub-portion 166 to ultimately expose {111} crystallographic surfaces at a position on a path extending in a length-wise direction of the representative frame-side leaf spring 144, wherein the position is less sensitive to a possible somewhat variation in an actual etch time.

As a result, the shoulder sub-portion 166 is formed at a position on a path extending in the length-wise direction of the representative frame-side leaf spring 144, with enhanced position stability and position accuracy, irrespective of variations of actual wet-etching conditions.

In the present embodiment, for the shoulder sub-portion 166 to expose some of {111} crystallographic surfaces, the compensating pattern 712 is configured to include the pair of wings 714 and 714, as illustrated in FIG. 26.

Each wing 714 has a rectangular area 716 at a tip end of each wing 714. The rectangular area 716 extends perpendicular to the length-wise direction of each wing 714. The rectangular area 716 has corners each having an angle approximate to an acute angle to the maximum.

As illustrated in FIG. 26, in the present embodiment, at the tip end of each wing 714, a rectilinear portion 720 is disposed perpendicular to the length-wise direction of each wing 714. Each rectilinear portion 720 is an example of a rectilinear portion which is perpendicular to one of the <110> crystallographic directions of the etchable material 600. Each rectilinear portion 720 enables the shoulder sub-portion 166 to expose some of {111} crystallographic surfaces as a result of the wet-etching.

That is to say, in the present embodiment, the rectilinear portions 720 and 720 which are located at the tip ends of the pair of wings 714 and 714, respectively, each constitute an example of the "rectilinear portion" set forth in the above mode (27).

In other words, in the present embodiment, the compensating pattern 712 is predefined in shape to include the pair of wings 714 and 714, so that the shoulder sub-portion 166 may expose some of the {111} crystallographic surfaces upon completion of the wet-etching.

Once the wet-etching step is terminated in a manner as described above, as illustrated in FIG. 22, a step S15 follows to eject the etchable material 600 from the etching bath, whose opposite faces have been coated with the etching masks 610. A step S16 follows to remove the etching masks 610 from the opposite faces of the etchable material 600.

Then, a succession of implementations in the oscillating-body fabricating process is completed.

In FIGS. 30(a), 30(b), 31(a), and 31(b), how the stepped portion 160 is fabricated by a fabricating process according to a comparative example of the present embodiment is illustrated in perspective view step by step, similarly with FIGS. 27(a), 27(b), 28(a), and 28(b). In this comparative example, a stepped-portion-oriented mask pattern is prepared so as to have a shape identical to the basic pattern 170.

In this comparative example, as the wet-etching of the etchable material 600 progresses, the upper-face portion of the etchable material 600 changes in shape from the stage illustrated in FIG. 30(a) to the stage illustrated in FIG. 30(b).

As illustrated in FIG. 31(a), upon further progress of the wet-etching, a portion of the etchable material 600 which corresponds to the higher sub-portion 162 has a reduced length smaller than the length of its basic desired shape of the higher sub-portion 162.

As illustrated in FIG. 31(b), upon still further progress of the wet-etching, the corresponding portion of the etchable material 600 to the higher sub-portion 162 has a further reduced length far smaller than the length of its basic desired shape of the higher sub-portion 162, and in addition to this, the shoulder sub-portion 166 is formed by various crystallographic surfaces.

For the above reasons, this comparative example makes it difficult to accurately control the position of the shoulder sub-portion 166, and also to reduce individual differences between the shoulder sub-portion 166 and other shoulder sub-portions with respect to position accuracy.

In contrast, the present embodiment makes it easy to accurately control the position of the shoulder sub-portion 166, and also to reduce individual differences between the shoulder sub-portion 166 and other shoulder sub-portions with respect to position accuracy.

As will be apparent from the above, in the present embodiment, the pair of wings 714 and 714 together constitute an example of the "first etch compensator" set forth in the above modes (25)-(27).

Fourth Embodiment

Next, a fourth embodiment of the present invention will be described.

The present embodiment is different from the third embodiment only with respect to the shape of each mask pattern, and is common to the third embodiment with respect to other elements.

Therefore, the common elements of the present embodiment will be omitted in detailed description by reference using the identical reference numerals or names, while only the different elements of the present embodiment will be described in greater detail below.

Figure 32:
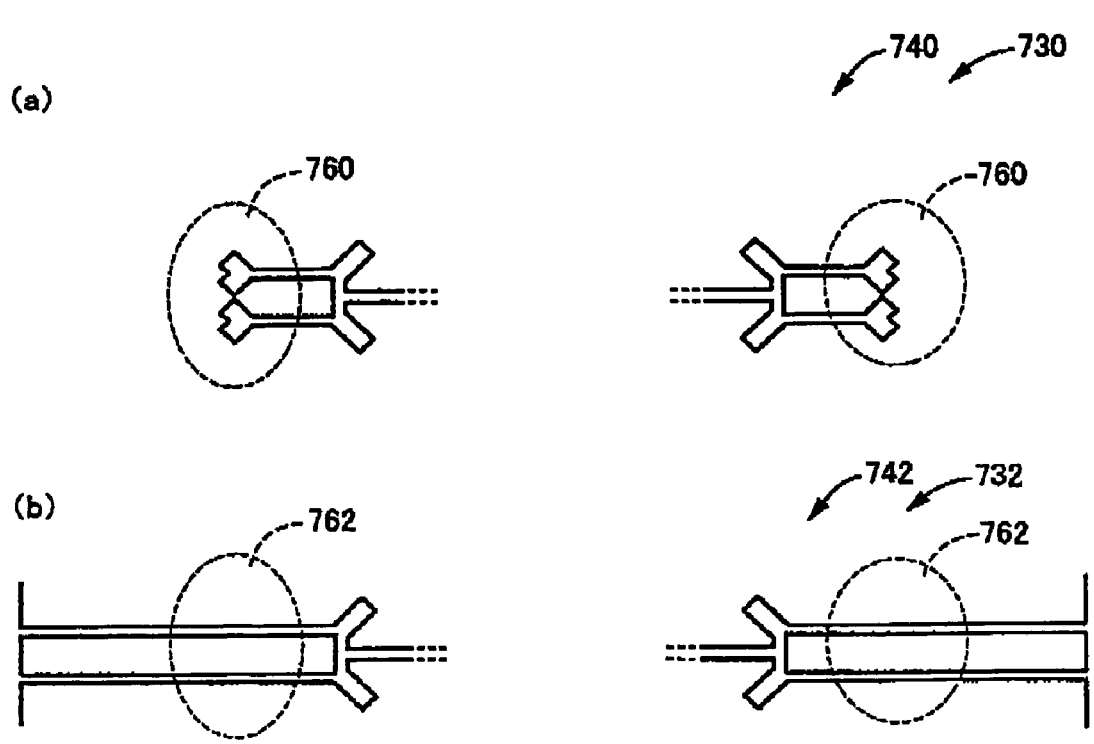
FIGS. 32(a) and 32(b) are top plan views illustrating an upper mask pattern 740 and a lower mask pattern 742 formed for fabricating a stepped portion 160 by an oscillating-body fabricating process according to a fourth embodiment of the present invention, respectively.

As illustrated in FIGS. 32(a) and 32(b), in the present embodiment, opposite faces of the etchable material 600 are coated with an upper etching mask 730 and a lower etching mask 732, respectively, similarly with the third embodiment.

In FIG. 32(a), an upper mask pattern 740 to be formed on the upper etching mask 730 is illustrated in top plan view only with respect to portions of the upper mask pattern 740 which are related to the fabrication of the oscillating body 124.

In FIG. 32(b), a lower mask pattern 742 to be formed on the lower etching mask 732 is illustrated in top plan view only with respect to portions of the lower mask pattern 742 which are related to the fabrication of the oscillating body 124; and portions of the lower mask pattern 742 which are related to the fabrication of regions of the stationary frame 116 which are coupled to the oscillating body 124.

In the upper mask pattern 740 illustrated in FIG. 32(a), there are surrounded by broken circles, portions 760 and 760 of the upper mask pattern 740, each of which is related to the fabrication of the corresponding stepped portion 160 of the upper-face portion of each frame-side leaf spring 144.

On the other hand, in the lower mask pattern 742 illustrated in FIG. 32(b), there are surrounded by broken circles, portions 762 and 762 of the lower mask pattern 742, each of which is related to the fabrication of a region of the lower-face portion of each frame-side leaf spring 144, which region is located on the side opposite to the corresponding stepped portion 160.

As illustrated in FIGS. 32(a) and 32(b), the lower mask pattern 742 is common in shape to the lower mask pattern 632 in the third embodiment, while the upper mask pattern 740 is different in shape from the upper mask pattern 630 in the third embodiment.

Therefore, only the shape of the upper mask pattern 740 will be described in greater detail below, while the shape of the lower mask pattern 742 will be omitted in detailed description.

Figure 33:
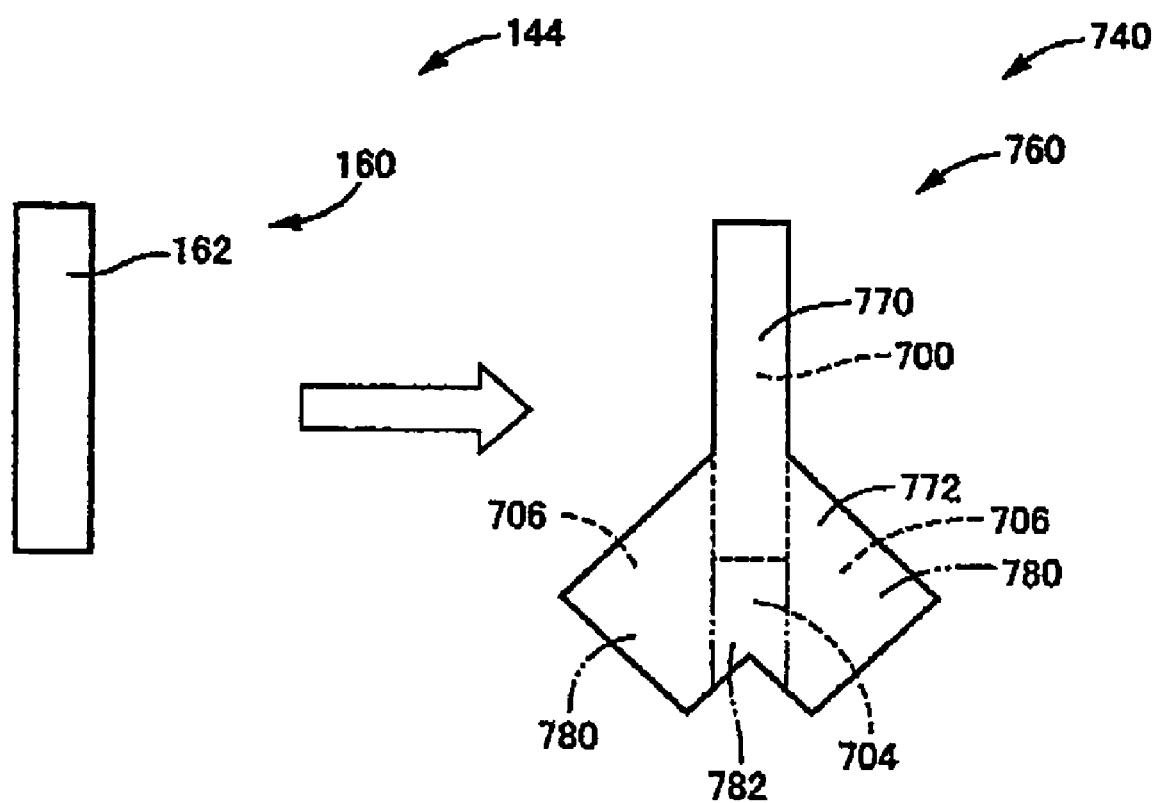
FIG. 33 illustrates in top plan view a stepped-portion-oriented mask pattern 760 in FIG. 32, and a basic desired-shape of a stepped portion 160 to be formed using the stepped-portion-oriented mask pattern 760, respectively.

In FIG. 33, both a basic desired-shape of the higher sub-portion 162 of the stepped portion 160 of the representative frame-side leaf spring 144 which represents the plurality of frame-side leaf springs 144, and the shape of one of the portions 760 and 760 (hereinafter, referred to as "stepped-portion-oriented mask pattern 760) corresponding to the stepped portion 160 of the upper mask pattern 740 are illustrated in top plan view, side by side, for convenience of comparison.

As will be evident from FIG. 33, the shape of the stepped-portion-oriented mask pattern 760 includes a basic pattern 770 which is identical to a surface shape of the higher sub-portion 162. The stepped-portion-oriented mask pattern 760 further includes a compensating pattern 772 which covers the surface of the to-be-half-etched portion 704 (see FIG. 25) and the surfaces of the opposite sub-portions 706 and 706 (see FIG. 25) to thereby reduce a rate of the wet-etching performed especially at the to-be-half-etched portion 704.

More specifically, the compensating pattern 772 forms a rhombus-shape having four corners and four sides, in cooperation with a portion of the basic pattern 770 which is coupled to the compensating pattern 772. Each side of the compensating pattern 772 is perpendicular to one of <100> crystallographic directions. The compensating pattern 772 is formed such that it is coupled at one of two opposite corners of the four corners to the basic pattern 770, and such that it is cut-away at the other of the opposite corners.

Figure 25:
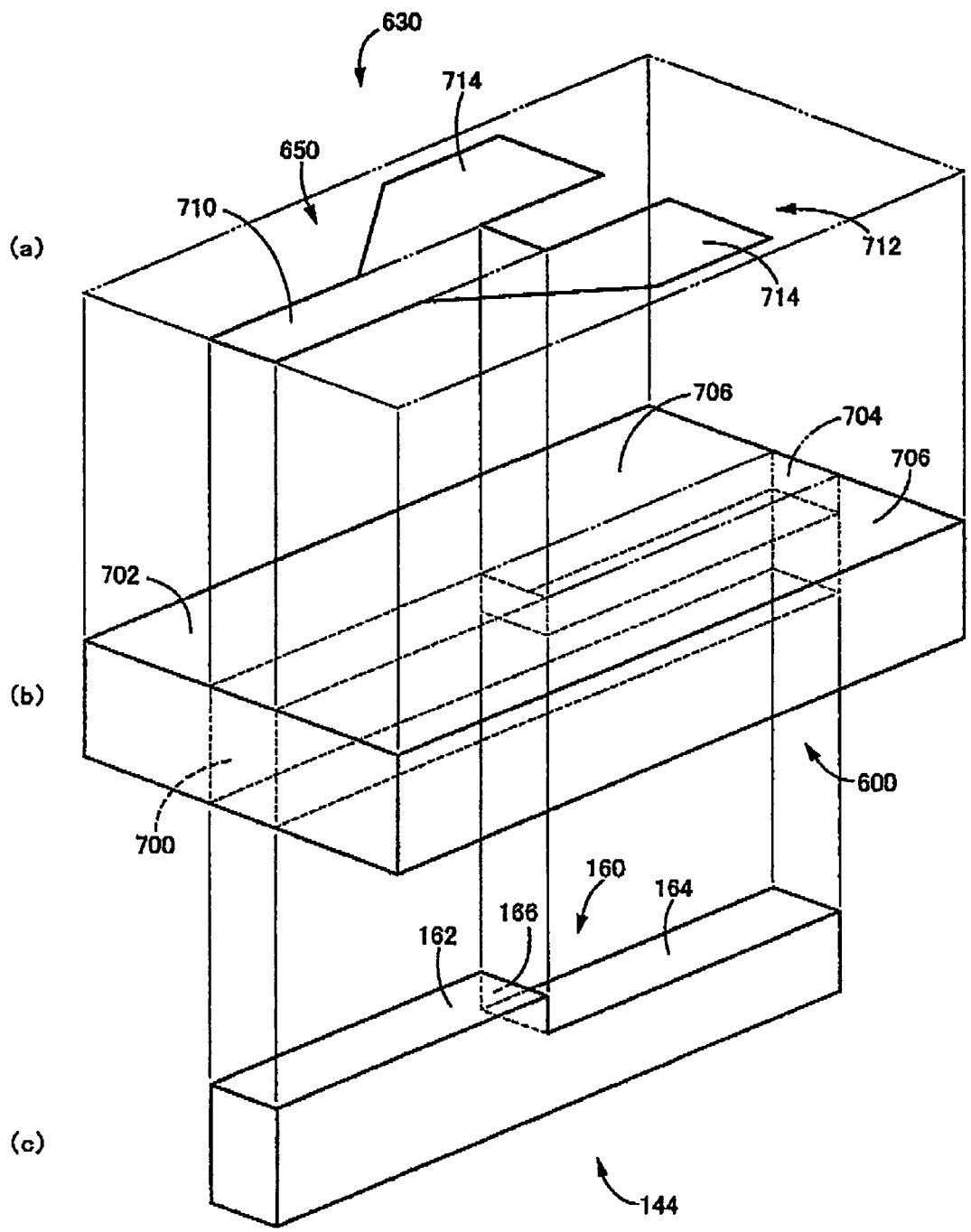
FIGS. 25(a), 25(b), and 25(c) are perspective views illustrating the upper mask pattern 630, an etchable material 600, and a basic desired-shape of a representative frame-side leaf spring 144 which represents a plurality of frame-side leaf springs 144 depicted in FIG. 2, respectively.

Still more specifically, the compensating pattern 772 includes first etch compensators 780 and 780 which cover the surfaces of the opposite sub-portions 706 and 706 (see FIG. 25), respectively, and a second etch compensator 782 which covers the surface of the to-be-half-etched portion 704 (see FIG. 25), which compensator is located at the front of the to-be-unetched portion 700 (see FIG. 25). Because of both the first etch compensators 780 and 780 and the second etch compensator 782, a rate of the wet-etching performed for the to-be-half-etched portion 704 is reduced, resulting in preventing the etchant from reaching the to-be-unetched portion 700.

In FIGS. 34(a), 34(b), 35(a), and 35(b), there is illustrated step by step how the etchable material 600 is wet-etched is illustrated step by step. In each figure, however, representatively for the representative frame-side leaf spring 144, how the etchable material 600 is etched from the upper face toward the lower face of the etchable material 600.

Figure 34:
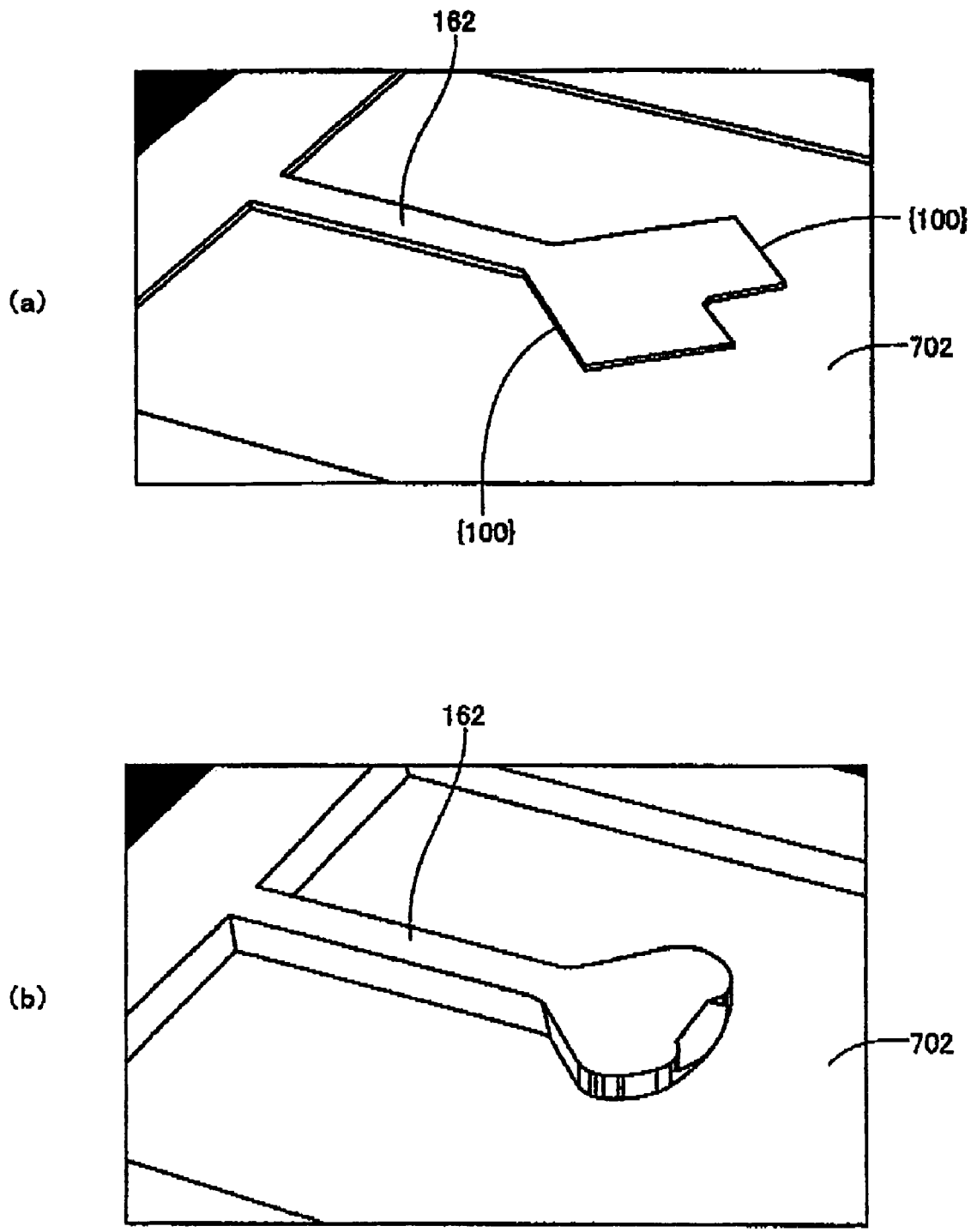
FIGS. 34(a) and 34(b) are perspective views for explaining step by step the progression of wet-etching performed in the oscillating-body fabricating process according to the fourth embodiment.

In the stage illustrated in FIG. 34(a), the wet-etching of the etchable material 600 starts at portions of the etchable material 600 which have been un-coated with the etching masks 610. In this stage, because of the stepped-portion-oriented mask pattern 760, the etchable material 600 starts exposing some of {100} crystallographic surfaces.

As illustrated in FIG. 34(b), when the wet-etching of the etchable material 600 progresses slightly from the stage illustrated in FIG. 34(a), with a slight increase in an etching depth of the etchable material 600, the etching at portions of the etchable material 600 which have been coated with the compensating pattern 772 progresses from both two corners at a front end of the compensating pattern 772, and two corners opposed to each other in a width-direction of the compensating pattern 772, toward the inside of the compensating pattern 772. The former two corners and the latter two corners belong to a plurality of corners of the compensating pattern 772. However, some of {100} crystallographic surfaces remain.

Figure 35:
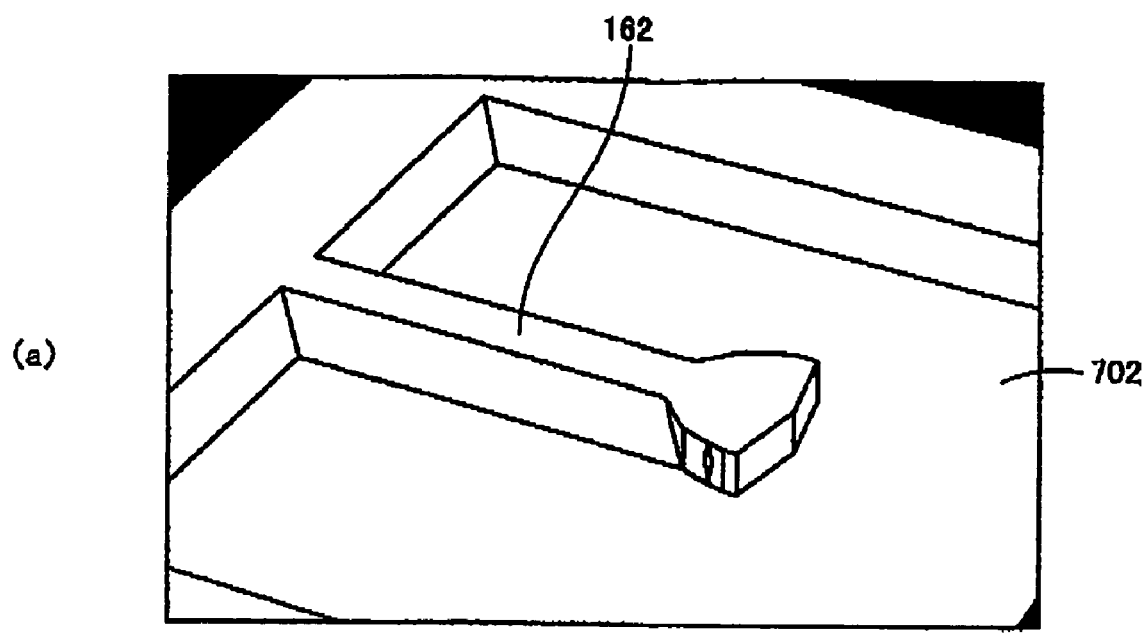
FIGS. 35(a) and 35(b) are additional perspective views for explaining step by step the progression of the wet-etching performed in the oscillating-body fabricating process according to the fourth embodiment.
Figure 35:
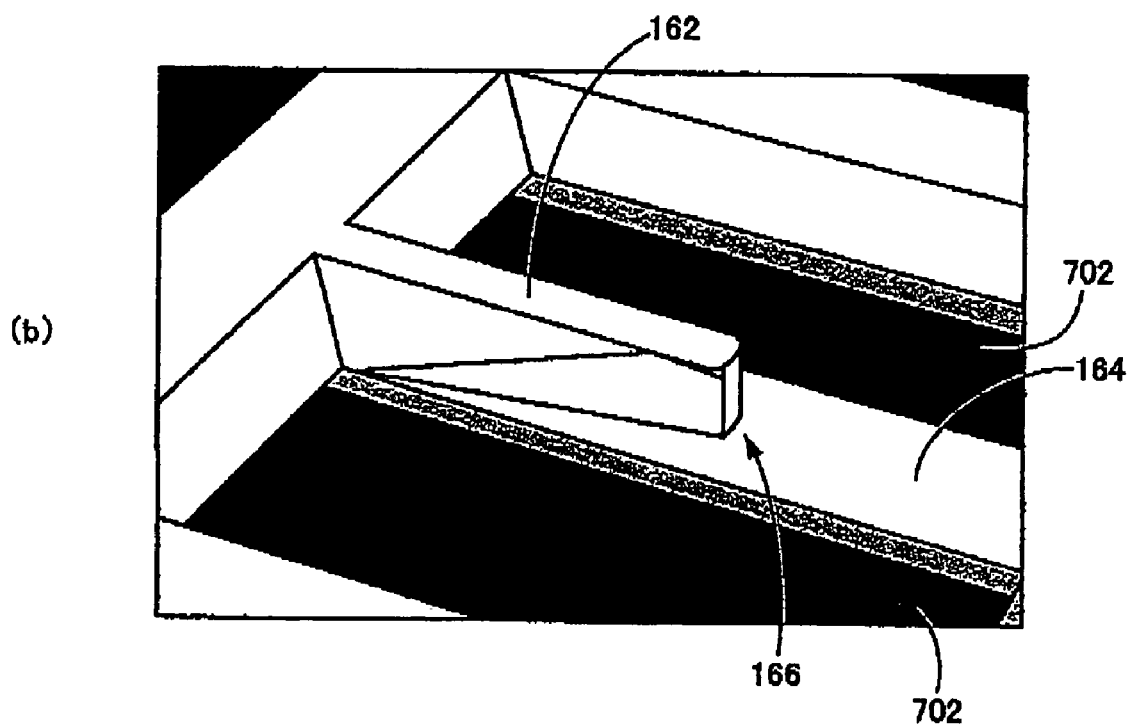

As illustrated in FIG. 35(a), when the wet-etching of the etchable material 600 progresses slightly from the stage illustrated in FIG. 34(b), portions of the etchable material 600 which have been coated with the compensating pattern 772 are removed excepting a rear end of the compensating pattern 772. Still in this stage, some of {100} crystallographic surfaces remain.

When the wet-etching of the etchable material 600 progresses slightly from the stage illustrated in FIG. 35(a), one cycle of the wet-etching is terminated. In this stage, as illustrated in FIG. 35(b), the etchable material 600 is etched at the to-be-fully-etched portion 702 so as to pass through the thickness of the etchable material 600. Additionally, the surface of the lower sub-portion 164 is created, and the surface of the shoulder sub-portion 166 is also created.

Therefore, the present embodiment allows the shoulder sub-portion 166 to be formed at a position on a path extending in a length-wise direction of the representative frame-side leaf spring 144, wherein the position is less sensitive to a possible somewhat variation in an actual etch time.

As a result, the shoulder sub-portion 166 is formed at a position on the path extending in the length-wise direction of the representative frame-side leaf spring 144, with enhanced position stability and position accuracy, irrespective of variations of actual wet-etching conditions.

As will be apparent from the above, in the present embodiment, the compensating pattern 772 constitutes an example of the "compensating pattern" set forth in the above mode (29), the first etch compensators 780 and 780 of the compensating pattern 772 constitute an example of the "first etch compensator" set forth in the above modes (25), (26), (27), and (29), and the second etch compensator 782 of the compensating pattern 772 constitutes an example of the "second etch compensator" set forth in the above modes (28) and (29).

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method of fabricating by an etching technique a plate-shaped reflective mirror having a reflective surface on which light is incident, the method comprising:
   a coating step of coating at least one of opposite faces of a plate-shaped etchable material made of a single crystal material, with an etching mask;
   a mask-pattern forming step of forming a mask pattern on at least one of opposite faces of the etching mask which has been deposited on the etchable material, the mask pattern having a planar shape which is more similar to a circle than to a quadrangle; and
   a wet-etching step of wet-etching the etchable material on which the etching mask has been deposited, by immersing the etchable material in an etchant having a predetermined temperature and a predetermined concentration,
   whereby the reflective mirror is fabricated so as to have a silhouette of a planar shape which is more similar to a circle than to a quadrangle, when viewed in a direction normal to the reflective surface,
   the method further comprising a determining step of determining the planar shape of the mask pattern, based on a desired planar shape of the reflective mirror, by allowing for differences in wet etch rate between crystallographic planes in the etchable material, wherein
   an ultimate planar shape of the reflective mirror is more rounded than the planar shape of the mask pattern.

2. The method according to claim 1, wherein the mask-pattern forming step includes a step of forming the mask pattern on each of two etching masks which have been deposited on the opposite faces of the etchable material, respectively.

3. The method according to claim 1, wherein the reflective mirror is used for optical scan, in a manner that the reflective mirror is angularly oscillated about an oscillation axis parallel to the reflective surface, to thereby vary a direction in which light is reflected from the reflective surface upon entry thereinto.

4. The method according to claim 3, wherein the reflective mirror constitutes an oscillating body in cooperation with a plate-shaped spring which extends from the reflective mirror along the oscillation axis and which is excited to cause at least a torsional vibration about the oscillation axis, and
   wherein the reflective mirror is used for optical scan, in a manner that at least a portion of the oscillating body is excited to vibrate, to thereby vary a direction in which light is reflected from the reflective surface upon entry thereinto.

5. The method according to claim 1, further comprising a removing step of, upon completion of the wet-etching, removing the etching mask from the etchable material.

6. The method according to claim 5, further comprising a reflective-layer forming step of, after removal of the etching mask from the etchable material, forming a reflective layer on at least one of the opposite faces of the etchable material.

7. The method according to claim 1, wherein the etchant includes KOH or TMAH.

8. The method according to claim 7, wherein the predetermined concentration is in the range from about 35 wt. % to about 45 wt. %.

9. The method according to claim 7, wherein the predetermined temperature is in the range from about 60 degrees Celsius (° C.) to about 80° C.

10. The method according to claim 1, wherein the planar shape of the mask pattern is generally in the shape of a convex octagon.

11. The method according to claim 10, wherein the planar shape of the mask pattern has a basic shape of a convex octagon with protrusions at eight corners of the octagon, and wherein the protrusions protrude outwardly from the octagon at the eight corners, as viewed in a direction perpendicular to a surface of the mask pattern.

12. The method according to claim 10, wherein the mask pattern is shaped to have first sides parallel to a reference line, and second sides perpendicular to the reference line,
   wherein the mask pattern is located relative to the etchable material, such that the first and second sides are each perpendicular to at least one of <110> crystallographic directions of the etchable material on at least one of (100) crystallographic planes of the etchable material, and
   wherein the mask pattern has an outline including a first portion corresponding to at least a separate one of the (100) crystallographic planes, and a second portion corresponding to at least one of (111) crystallographic planes of the etchable material, per each one of four regions into which a surface of the etchable material is separated by two center lines of symmetry orthogonally intersecting at a center point of the mask pattern.

13. The method according to claim 12, wherein the outline of the mask pattern further includes a third portion corresponding to at least one of (n11) crystallographic planes of the etchable material, disposed between the first and second portions, per each region of the etchable material,
   wherein the n is an integer equal to or greater than two.

14. The method according to claim 12, wherein the outline of the mask pattern further includes a fourth portion corresponding to at least one of (520) crystallographic planes of the etchable material, disposed between the first and second portions, per each region of the etchable material.

15. A process of integrally fabricating by an etching technique an oscillating body having a unitary configuration including both a reflective mirror having a reflective surface, and a plate-shaped spring,
   wherein the reflective mirror is used for optical scan, in a manner that the reflective mirror is angularly oscillated about an oscillation axis parallel to the reflective surface, to thereby vary a direction in which light is reflected from the reflective surface upon entry thereinto,
   wherein the plate-shaped spring is shaped to have a beam structure which extends from the reflective mirror along the oscillation axis and which has a stepped portion,
   wherein the plate-shaped spring is excited by a vibration occurring in at least a portion of the oscillating body, to cause at least a torsional vibration about the oscillation axis, to thereby angularly oscillate the reflective mirror about the oscillation axis by at least the caused torsional vibration, and
   wherein the process comprises:
   a coating step of coating opposite faces of a to-be-processed portion of a plate-shaped etchable material made of a single crystal material, with two etching masks, respectively, wherein the to-be-processed portion is to be processed into the beam structure;
   a mask-pattern forming step of forming a pair of mask patterns on the two etching masks which have been deposited on the opposite faces of the to-be-processed portion, respectively, wherein the pair of mask patterns have respective shapes for forming the beam structure; and
   a wet-etching step of, after formation of the pair of mask patterns, wet-etching the etchable material by immersing the etchable material in an etchant.

16. The process according to claim 15, wherein the to-be-processed portion includes a portion of the etchable material which is to be processed into the reflective mirror, and wherein each of the pair of mask patterns has a planar shape for forming the reflective mirror, which is more similar to a circle than to a quadrangle, whereby the reflective mirror is fabricated so as to have a silhouette of a planar shape which is more similar to a circle than to a quadrangle, when viewed in a direction normal to the reflective surface.

17. The process according to claim 15, wherein each of the pair of mask patterns has a uniform thickness throughout each mask pattern.

18. The process according to claim 15, wherein the etchable material is made of a single crystal silicon, and at least one of a plurality of (100) crystallographic planes of the single crystal silicon is assigned an initial exposed surface.

19. The process according to claim 15, wherein the wet-etching step is implemented such that the etchable material is immersed in the etchant once, to thereby fabricate the oscillating body at a time.

20. The process according to claim 15, wherein the stepped portion is ultimately shaped to include:

(a) a higher sub-portion having the same height as a basic surface of the beam structure;

(b) a lower sub-portion lower than the basic surface, and lower than the higher sub-portion in a thickness-wise direction of the beam structure; and (c) a shoulder sub-portion which is located at a border between the higher and lower sub-portions and which traverses the beam structure.

21. The process according to claim 20, wherein the etchable material is originally shaped to include:

(d) a to-be-fully-etched portion of the etchable material which is to be etched through a thickness of the etchable material when wet-etched, to thereby produce the beam structure from the plate-shaped etchable material;

(e) a to-be-unetched portion of the etchable material which is to remain unetched when wet-etched, to thereby form the higher sub-portion, and (f) a to-be-half-etched portion of the etchable material which is to be etched in half-way of the thickness of the etchable material when wet-etched, to thereby form the lower sub-portion.

22. The process according to claim 21, wherein the to-be-fully-etched portion includes opposite sub-portions which are opposed to each other in a width-wise direction of the beam structure and between which the to-be-half-etched portion is interposed, and wherein the pair of mask patterns are originally shaped to include:

(g) a basic pattern shaped to cover a surface of the to-be-unetched portion; and (h) a compensating pattern shaped to cover a surface of at least opposite sub-portions of the opposite sub-portions and the to-be-half-etched portion.

23. The process according to claim 22, wherein the compensating pattern includes a second etch compensator disposed to cover a surface of the to-be-half-etched portion, to thereby reduce a rate of the wet-etching performed for the to-be-half-etched portion, for preventing the etchant from reaching the to-be-unetched portion.

24. The process according to claim 23, wherein the compensating pattern includes a first etch compensator disposed to cover surfaces of the opposite sub-portions, to thereby reduce a rate of the wet-etching performed for the to-be-half-etched portion, for preventing the etchant from reaching the to-be-unetched portion, wherein the first etch compensator includes a rectilinear portion which is parallel to a width-wise direction of the beam structure and which is perpendicular to at least one of a plurality of <110> crystallographic directions of the etchable material, wherein the compensating pattern and a portion of the basic pattern which is coupled to the compensating pattern cooperate to form a substantial rhombus-shape having four corners and four sides, wherein each side of the compensating pattern is perpendicular to at least one of a plurality of <100> crystallographic directions of the etchable material, and wherein the compensating pattern is shaped such that the compensating pattern is coupled at one of two opposite corners of the four corners to the basic pattern, and such that the compensating pattern is cut-away at the other of the opposite corners.

25. The process according to claim 22, wherein the compensating pattern includes a first etch compensator disposed to cover surfaces of the opposite sub-portions, to thereby reduce a rate of the wet-etching performed for the to-be-half-etched portion, for preventing the etchant from reaching the to-be-unetched portion.

26. The process according to claim 25, wherein the first etch compensator includes a pair of wings which coextend in a length-wise direction of the beam structure, and which are disposed on respective opposite sides with respect to the to-be-half-etched portion, and wherein the wings are associated with the basic pattern, such that the wings are partially coupled at one end side of the wings to the basic pattern, and such that the wings are partially open at opposite end side of the wings, whereby the wings and a portion of the basic pattern which is coupled to the wings cooperate to form a substantial U-shape.

27. The process according to claim 26, wherein the first etch compensator includes a rectilinear portion which is parallel to a width-wise direction of the beam structure and which is perpendicular to at least one of a plurality of <110> crystallographic directions of the etchable material.

28. A method of fabricating by an etching technique a plate-shaped reflective mirror having a reflective surface on which light is incident, the method comprising:

a coating step of coating at least one of opposite faces of a plate-shaped etchable material made of a single crystal material, with an etching mask;

a mask-pattern forming step of forming a mask pattern on at least one of opposite faces of the etching mask which has been deposited on the etchable material; and a wet-etching step of wet-etching the etchable material on which the etching mask has been deposited, by immersing the etchable material in an etchant having a predetermined temperature and a predetermined concentration, wherein the mask pattern is generally in the shape of a convex octagon, and the mask pattern is shaped to have first sides parallel to a reference line, and second sides perpendicular to the reference line, wherein the mask pattern is located relative to the etchable material, such that the first and second sides are each perpendicular to at least one of <110> crystallographic directions of the etchable material on at least one of (100) crystallographic planes of the etchable material, and wherein the mask pattern has an outline including a first portion corresponding to at least a separate one of the (100) crystallographic planes, and a second portion corresponding to at least one of (111) crystallographic planes of the etchable material, per each one of four regions into which a surface of the etchable material is separated by two center lines of symmetry orthogonally intersecting at a center point of the mask pattern.

29. The method according to claim 28, wherein the outline of the mask pattern further includes a third portion corresponding to at least one of (n11) crystallographic planes of the etchable material, disposed between the first and second portions, per each region of the etchable material, and wherein the n is an integer equal to or greater than two.

30. The method according to claim 28, wherein the outline of the mask pattern further includes a fourth portion corresponding to at least one of (520) crystallographic planes of the etchable material, disposed between the first and second portions, per each region of the etchable material.

* * * * *